(12) United States Patent
Farnworth et al.

(10) Patent No.: US 7,776,647 B2
(45) Date of Patent: Aug. 17, 2010

(54) SEMICONDUCTOR COMPONENTS AND METHODS OF FABRICATION WITH CIRCUIT SIDE CONTACTS, CONDUCTIVE VIAS AND BACKSIDE CONDUCTORS

(75) Inventors: Warren M. Farnworth, Nampa, ID (US); Alan G. Wood, Boise, ID (US); Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 528 days.

(21) Appl. No.: 11/496,180

(22) Filed: Jul. 31, 2006

(65) Prior Publication Data

US 2006/0275949 A1 Dec. 7, 2006

Related U.S. Application Data

(60) Continuation of application No. 11/390,321, filed on Mar. 27, 2006, now Pat. No. 7,482,702, which is a division of application No. 10/646,897, filed on Aug. 22, 2003, now abandoned, which is a division of application No. 10/094,161, filed on Mar. 6, 2002, now Pat. No. 6,908,784.

(51) Int. Cl.
  *H01L 21/00* (2006.01)
(52) U.S. Cl. .................. 438/106; 438/460; 438/462; 257/787; 257/E23.011
(58) Field of Classification Search ............ 174/257, 174/260; 228/180.22, 199; 257/737, 778, 257/779, 780, 783, 787, E23.011; 438/106, 438/118, 613, 629, 460, 462
See application file for complete search history.

(56) References Cited

U.S. PATENT DOCUMENTS

| 5,138,434 A | 8/1992 | Wood et al. |
| 5,270,261 A | 12/1993 | Bertin et al. |
| 5,436,203 A | 7/1995 | Lin |
| 5,496,775 A | 3/1996 | Brooks |
| 5,607,875 A | 3/1997 | Nishizawa et al. |
| 5,618,752 A | 4/1997 | Gaul |

(Continued)

FOREIGN PATENT DOCUMENTS

DE 19758569 A1 10/1999

(Continued)

OTHER PUBLICATIONS

Advanced Coating Parylene Conformal Coating Specialists, advertising material, pp. 1-7, 1998.

(Continued)

*Primary Examiner*—Thanh V Pham
*Assistant Examiner*—Marvin Payen
(74) *Attorney, Agent, or Firm*—Stephen A. Gratton

(57) ABSTRACT

A semiconductor component includes a thinned semiconductor substrate having protective polymer layers on up to six surfaces. The component also includes contacts on a circuit side of the substrate, conductive vias in electrical contact with the contacts, and conductors on a backside of the substrate. A method for fabricating the component includes the steps of providing the semiconductor substrate with the contacts on the circuit side, forming conductive vias from the back side in electrical contact with the contacts, and forming conductors on the backside.

14 Claims, 29 Drawing Sheets

U.S. PATENT DOCUMENTS

| | | | |
|---|---|---|---|
| 5,686,317 A | 11/1997 | Akram et al. |
| 5,789,307 A | 8/1998 | Igel et al. |
| 5,851,911 A | 12/1998 | Farnworth |
| 5,863,813 A | 1/1999 | Dando |
| 5,888,883 A | 3/1999 | Sasaki et al. |
| 5,897,337 A | 4/1999 | Kata et al. |
| 5,904,546 A | 5/1999 | Wood et al. |
| 5,925,936 A | 7/1999 | Yamaji |
| 5,933,713 A | 8/1999 | Farnworth |
| 5,952,716 A | 9/1999 | Dibble et al. |
| 6,013,534 A | 1/2000 | Mountain |
| 6,013,948 A | 1/2000 | Akram et al. |
| 6,020,217 A * | 2/2000 | Kuisl et al. | 438/106 |
| 6,029,949 A | 2/2000 | Brown et al. |
| 6,051,875 A | 4/2000 | Dando |
| 6,054,772 A | 4/2000 | Mostafazadeh et al. |
| 6,060,373 A | 5/2000 | Saitoh |
| 6,074,896 A | 6/2000 | Dando |
| 6,080,602 A | 6/2000 | Tani et al. |
| 6,087,845 A | 7/2000 | Wood et al. |
| 6,097,087 A | 8/2000 | Farnworth et al. |
| 6,107,109 A * | 8/2000 | Akram et al. | 438/15 |
| 6,107,164 A | 8/2000 | Ohuchi |
| 6,114,240 A | 9/2000 | Akram et al. |
| 6,130,111 A | 10/2000 | Ikuina et al. |
| 6,136,137 A | 10/2000 | Farnworth et al. |
| 6,150,717 A | 11/2000 | Wood et al. |
| 6,153,448 A | 11/2000 | Takahashi et al. |
| 6,169,329 B1 | 1/2001 | Farnworth et al. |
| 6,177,295 B1 | 1/2001 | De Samber et al. |
| 6,180,504 B1 | 1/2001 | Farnworth et al. |
| 6,221,751 B1 | 4/2001 | Chen et al. |
| 6,228,678 B1 | 5/2001 | Gilleo et al. |
| 6,233,185 B1 | 5/2001 | Beffa et al. |
| 6,281,131 B1 | 8/2001 | Gilton et al. |
| 6,294,837 B1 | 9/2001 | Akram et al. |
| 6,313,531 B1 | 11/2001 | Geusic et al. |
| 6,313,651 B1 | 11/2001 | Hembree et al. |
| 6,326,698 B1 | 12/2001 | Akram |
| 6,338,980 B1 | 1/2002 | Satoh |
| 6,350,664 B1 | 2/2002 | Haji et al. |
| 6,350,952 B1 * | 2/2002 | Gaku et al. | 174/522 |
| 6,353,267 B1 | 3/2002 | Ohuchi et al. |
| 6,359,235 B1 * | 3/2002 | Hayashi | 174/260 |
| 6,365,269 B1 | 4/2002 | Atzesdorfer et al. |
| 6,451,624 B1 | 9/2002 | Farnworth et al. |
| 6,506,681 B2 | 1/2003 | Grigg et al. |
| 6,515,371 B2 | 2/2003 | Akiyama et al. |
| 6,524,890 B2 | 2/2003 | Ueda et al. |
| 6,534,387 B1 | 3/2003 | Shinogi et al. |
| 6,534,854 B1 | 3/2003 | Fazelpour et al. |
| 6,544,821 B2 | 4/2003 | Akram |
| 6,544,902 B1 | 4/2003 | Farnworth |
| 6,549,821 B1 | 4/2003 | Farnworth et al. |
| 6,573,156 B1 | 6/2003 | Wang et al. |
| 6,579,748 B1 | 6/2003 | Okuno et al. |
| 6,607,970 B1 | 8/2003 | Wakabayashi |
| 6,608,371 B2 * | 8/2003 | Kurashima et al. | 257/686 |
| 6,620,731 B1 | 9/2003 | Farnworth et al. |
| 6,649,445 B1 | 11/2003 | Qi et al. |
| 6,717,245 B1 | 4/2004 | Kinsman et al. |
| 6,774,659 B1 | 8/2004 | Chiang |
| 6,809,421 B1 | 10/2004 | Hayasaka et al. |
| 6,841,413 B2 | 1/2005 | Liu |
| 6,908,784 B1 | 6/2005 | Farnworth |
| 6,964,915 B2 | 11/2005 | Farnworth et al. |
| 7,029,949 B2 | 4/2006 | Farnworth et al. |
| 7,157,353 B2 | 1/2007 | Farnworth et al. |
| 7,221,059 B2 | 5/2007 | Farnworth et al. |
| 7,230,188 B1 * | 6/2007 | En et al. | 174/257 |
| 7,382,060 B2 | 6/2008 | Farnworth et al. |
| 7,417,325 B2 | 8/2008 | Farnworth et al. |
| 7,432,604 B2 | 10/2008 | Farnworth et al. |
| 7,482,702 B2 | 1/2009 | Farnworth et al. |
| 2001/0040117 A1 | 11/2001 | Easton |
| 2002/0009826 A1 | 1/2002 | Chien |
| 2002/0017710 A1 | 2/2002 | Kurashima et al. |
| 2002/0097302 A1 | 7/2002 | Nikkel |
| 2003/0109082 A1 | 6/2003 | Koduri et al. |
| 2005/0168908 A1 | 8/2005 | Maeda et al. |

FOREIGN PATENT DOCUMENTS

| | | |
|---|---|---|
| JP | 10-79362 | 3/1998 |
| JP | 2000-31185 | 1/2000 |
| WO | WO 0016597 A1 * | 3/2000 |

OTHER PUBLICATIONS

Dexter Electronic Materials, Hysol FP4451 Material Properties, spec sheet, pp. 1-2, Aug. 20, 1999.

Dexter Electronic Materials, Hysol FP4450 Material Properties, spec sheet, pp. 1-2, Aug. 20, 1999.

Parylene Coating, advertising for Speciality Coating Systems, pp. 1-2, date unknown.

"Wafer size CSP Packaging by VPES", Japan Rec Co., Ltd., advertising material, pp. 1-4, 1998.

Jeffrey C. Demmin, "More Wafer Thinning at ICAPS", media news analysis, Mar. 13, 2002.

Zhong L. Wang, "Functional and Smart Materials", 1999, Wiley Encyclopedia of Electrical and Electronics Engineering, www.mrw.interscience,wiley.com, pp. 1-5.

Peter Van Zant, Microchip Fabrication, 2000, McGraw-Hill, pp. 193, 200, 588 and 599.

Charles A. Harper, Electronic Packaging and Interconnection Handbook, 2000, Third Edition, pp. 1.7 and 1.8.

Ferguson et al., Moisture Absorption in No-Flow Underfill Materials and its Effect on Interfacial Adhesion to Solder Mask Coated FR4 Printed Wiring Board, 2001, 2001 International Symposium on Advanced Packaging Materials.

* cited by examiner

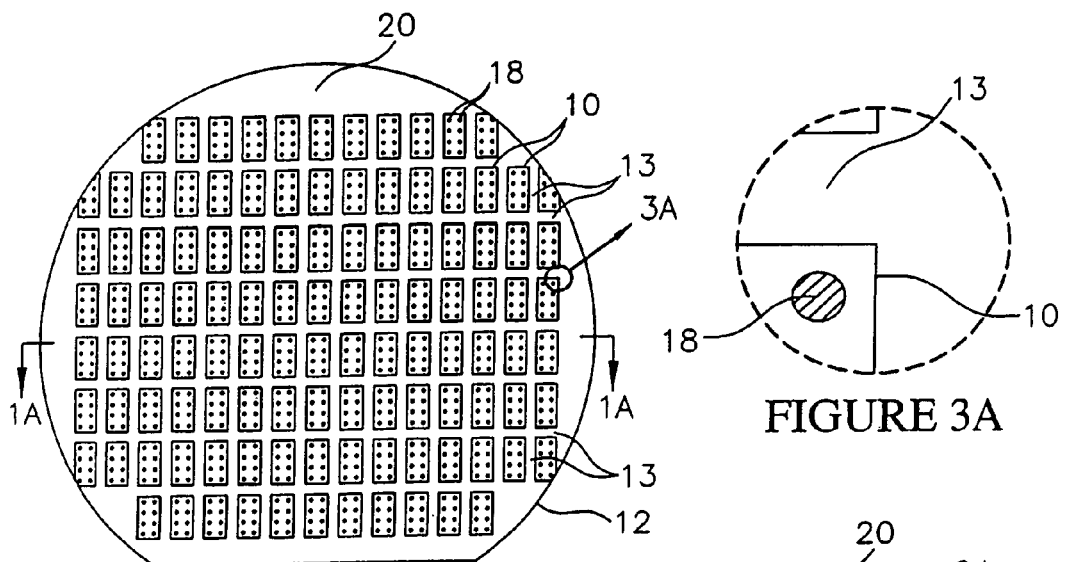
FIGURE 2A
FIGURE 3A
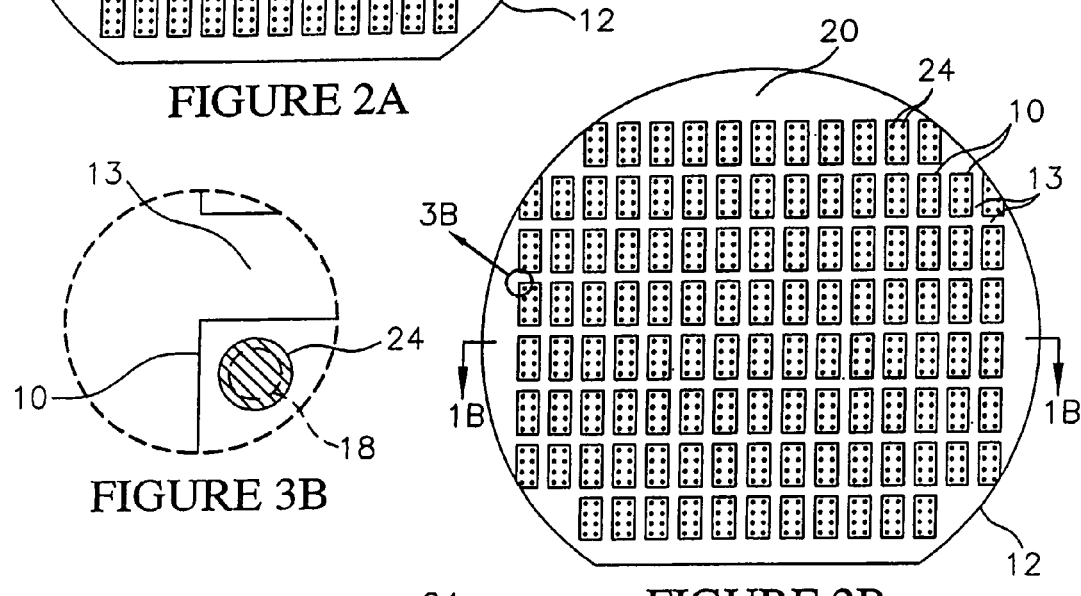
FIGURE 3B
FIGURE 2B
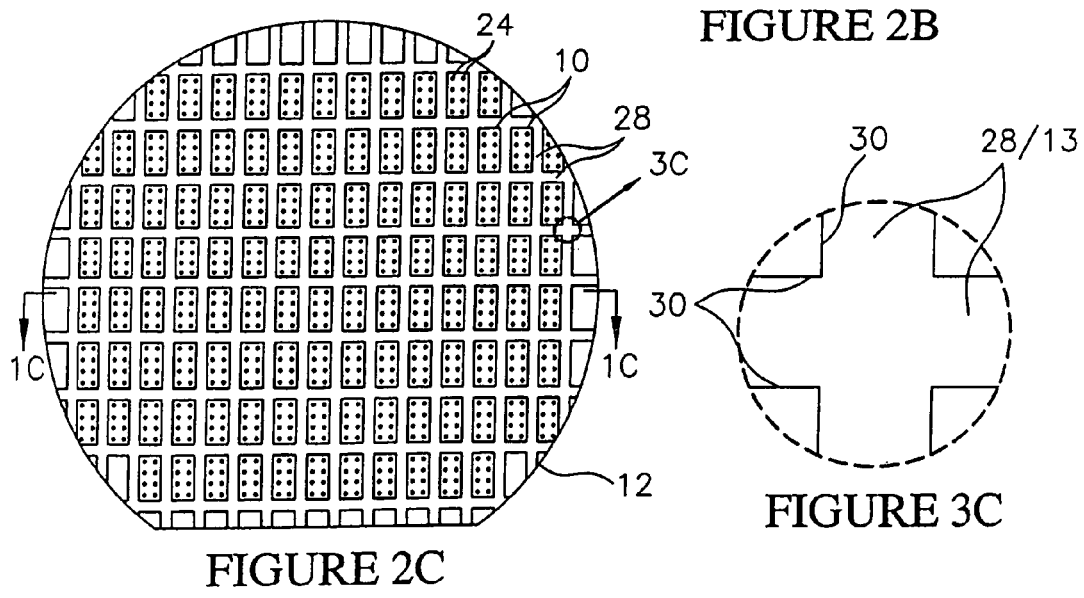
FIGURE 2C
FIGURE 3C

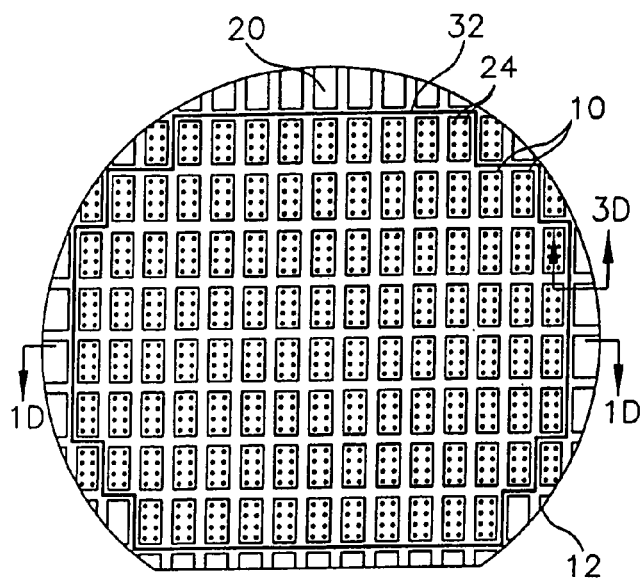
FIGURE 2D
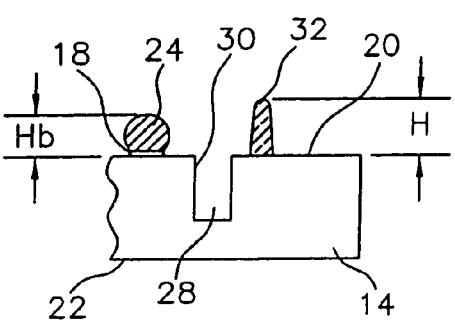
FIGURE 3D
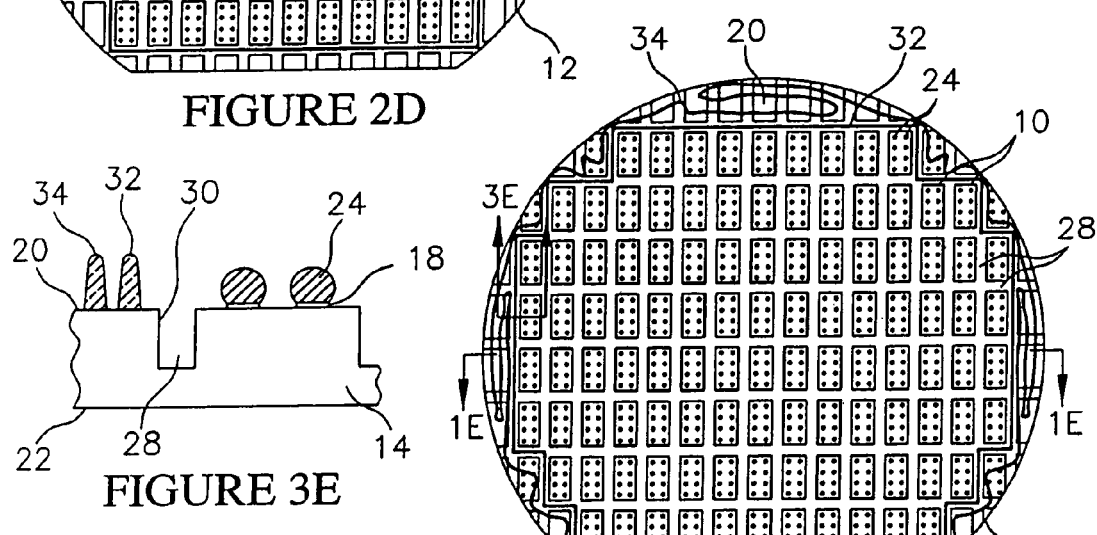
FIGURE 3E
FIGURE 2E
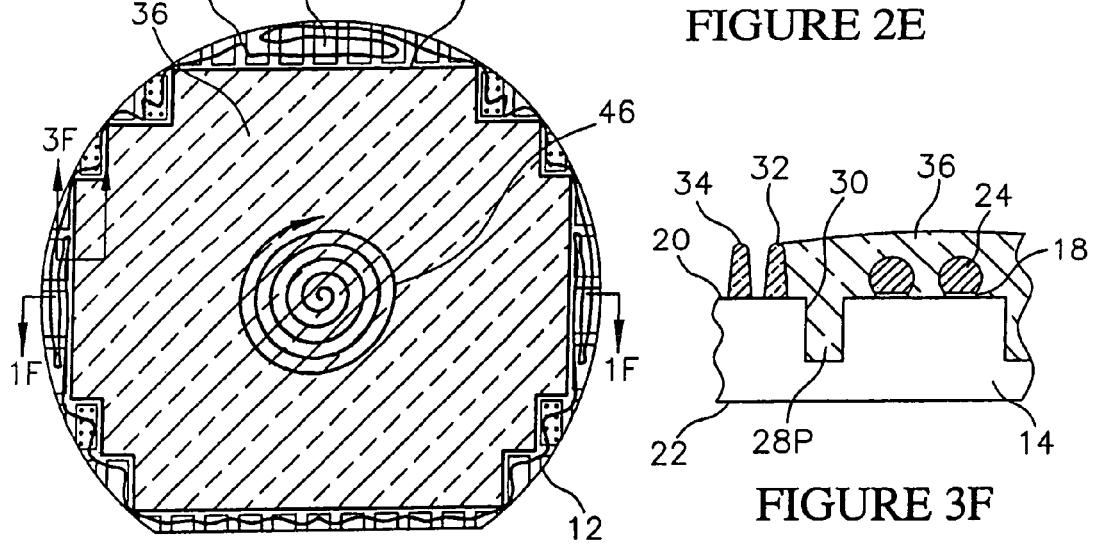
FIGURE 2F
FIGURE 3F

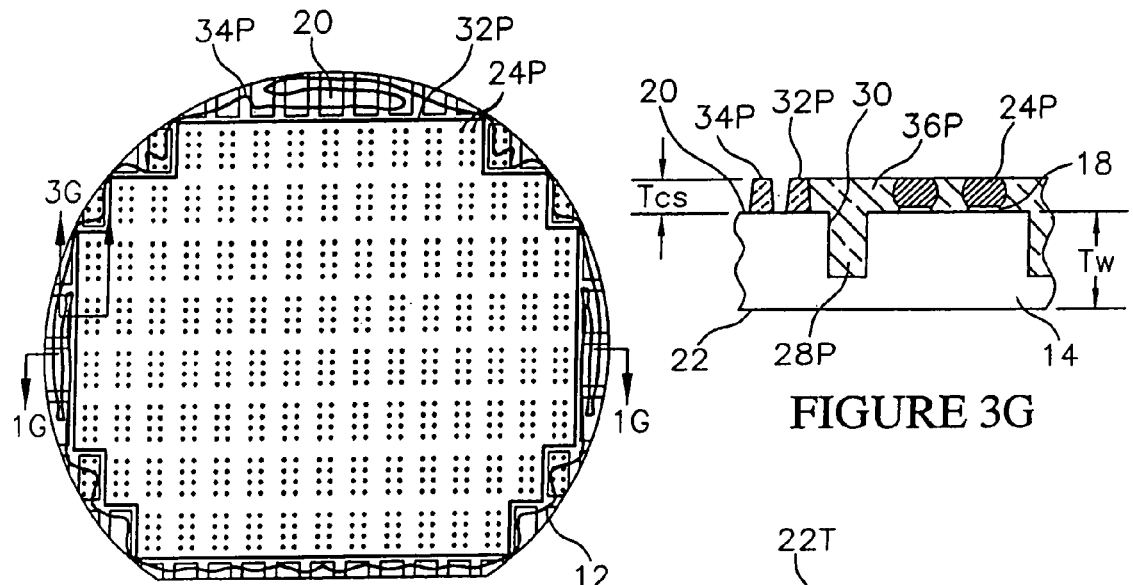
FIGURE 2G
FIGURE 3G
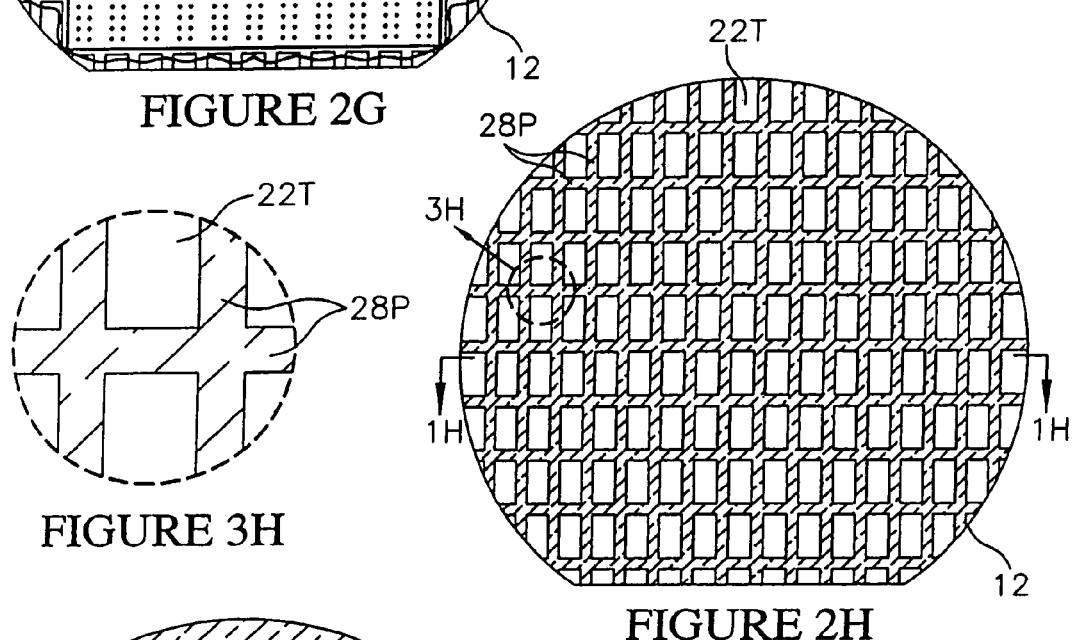
FIGURE 3H
FIGURE 2H
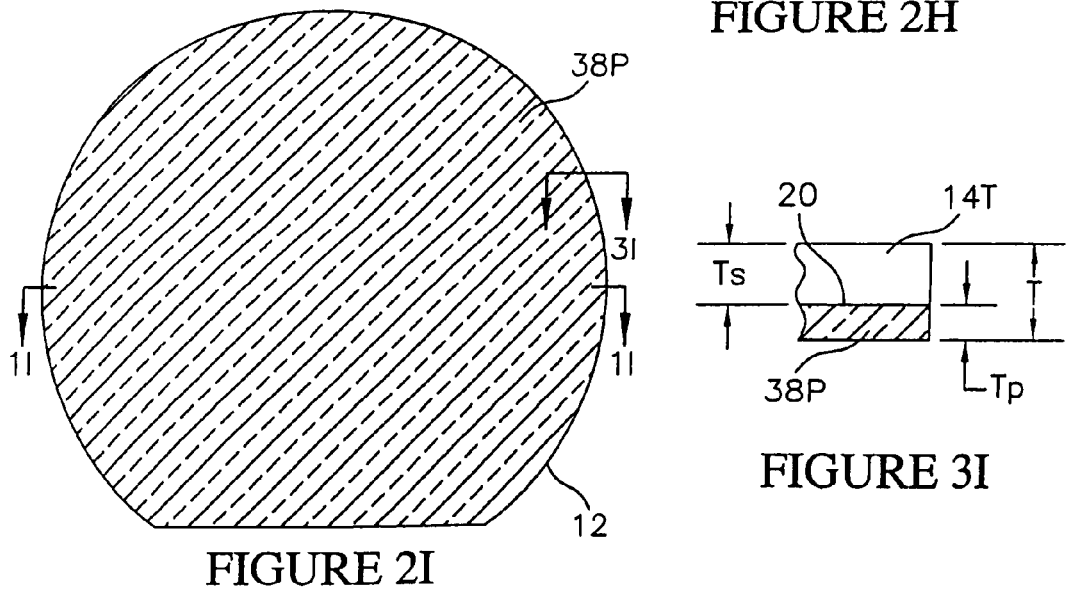
FIGURE 2I
FIGURE 3I

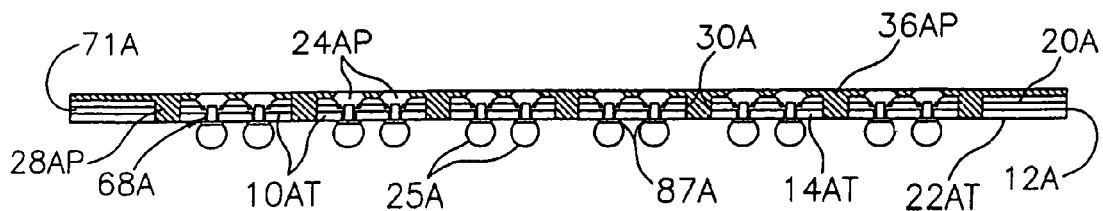
FIGURE 8G
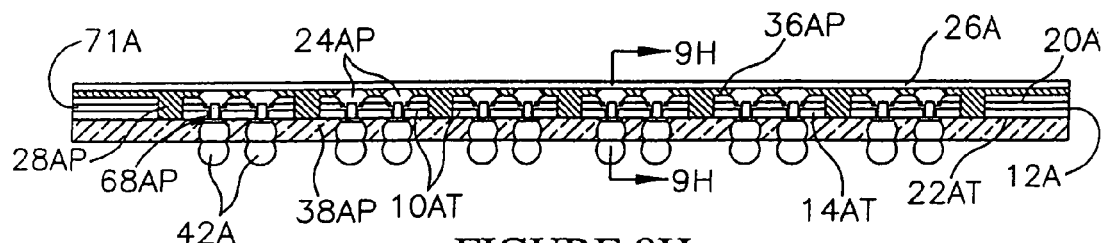
FIGURE 8H
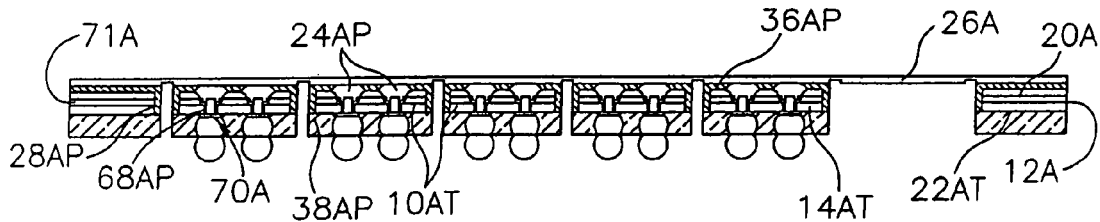
FIGURE 8I
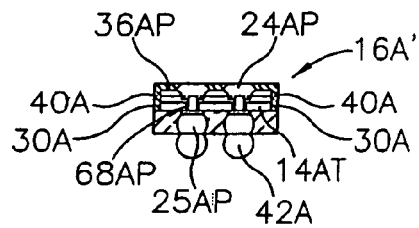
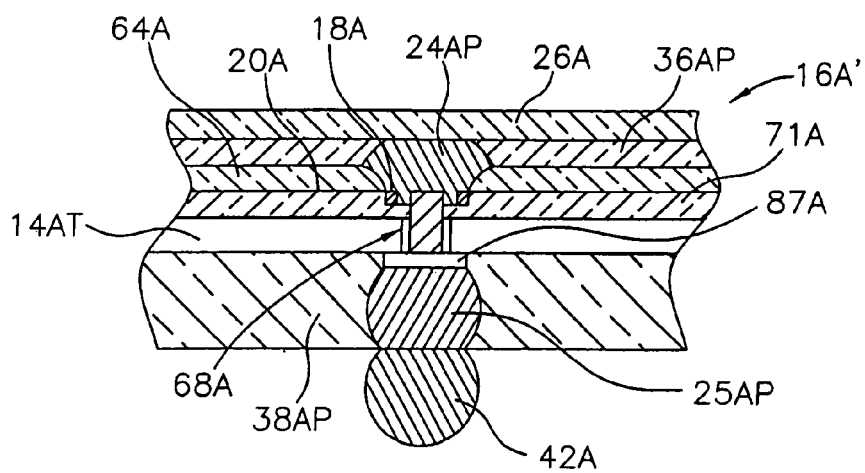
FIGURE 9H

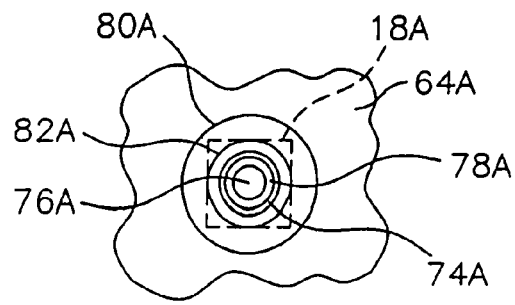
FIGURE 9A
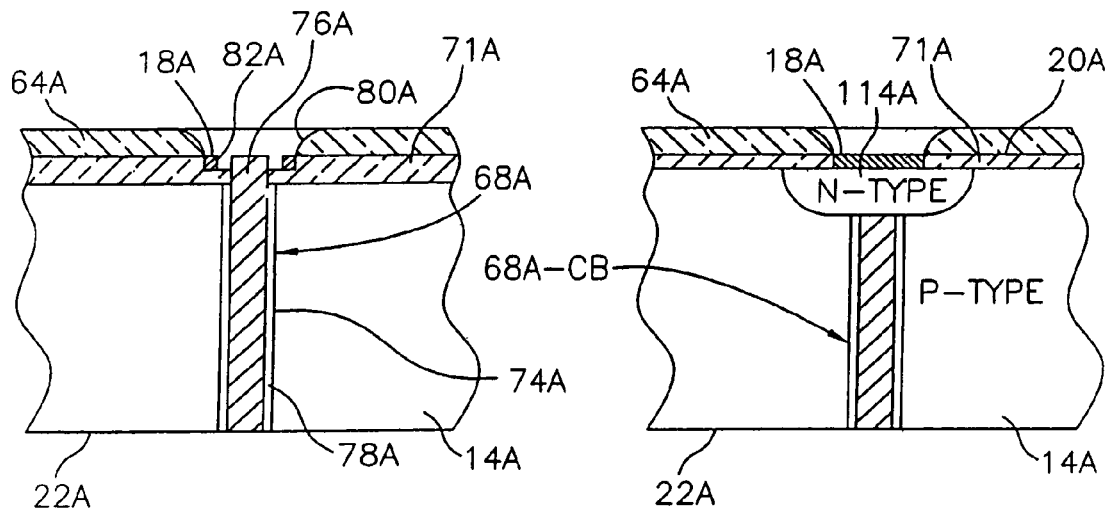
FIGURE 9B
FIGURE 9C
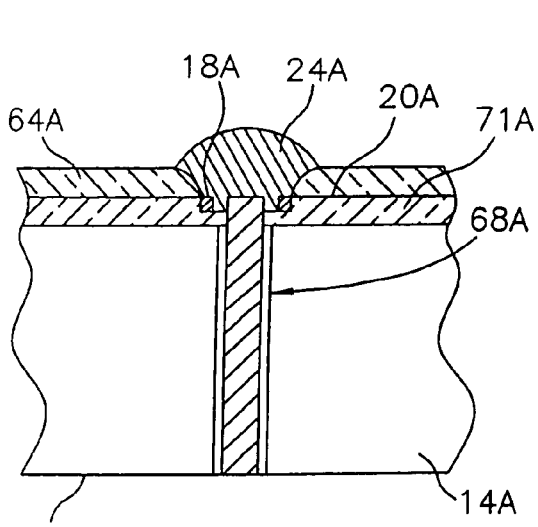
FIGURE 9D
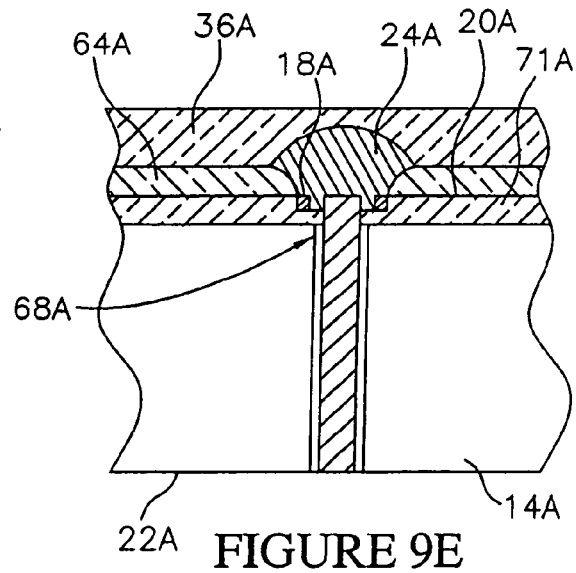
FIGURE 9E

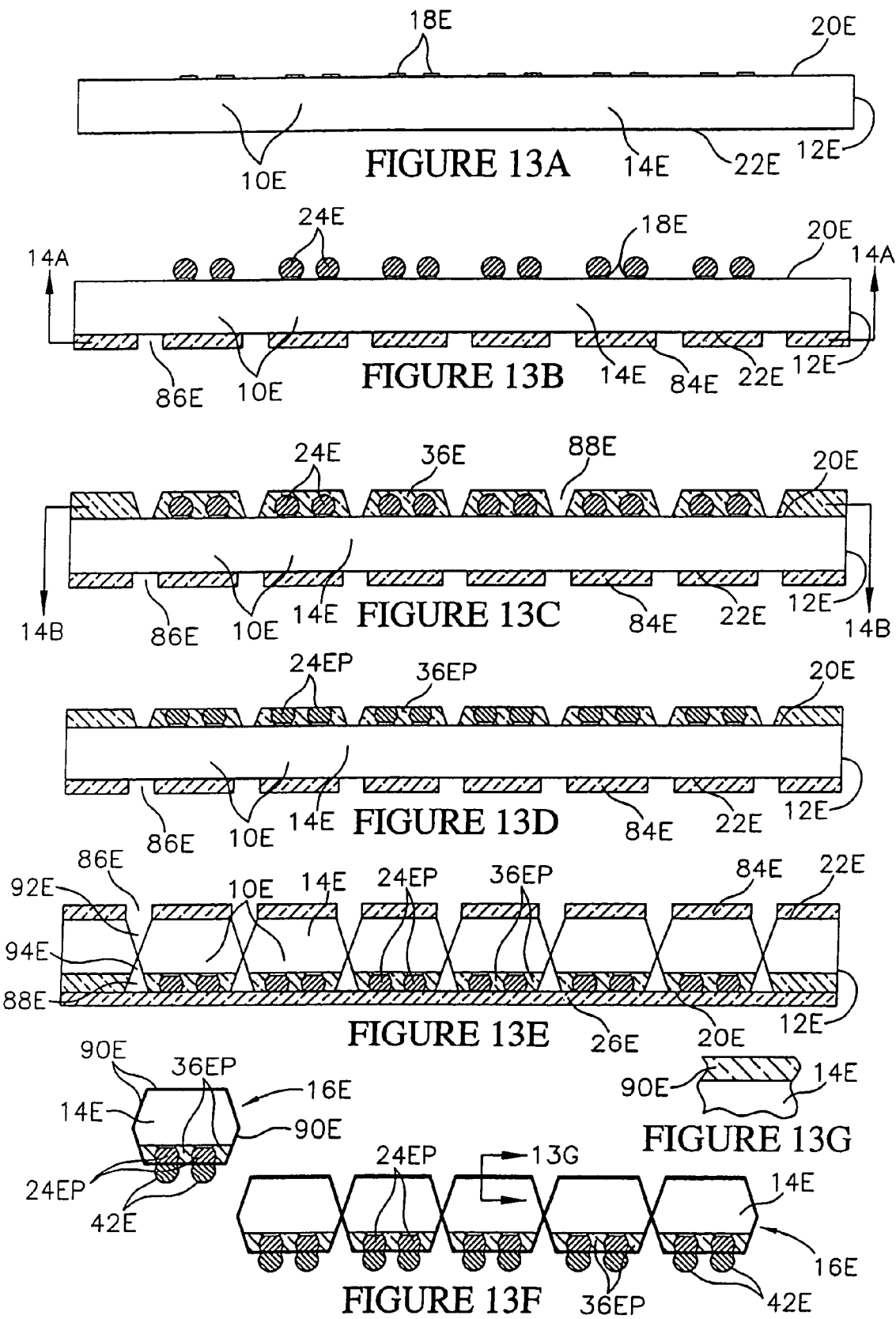

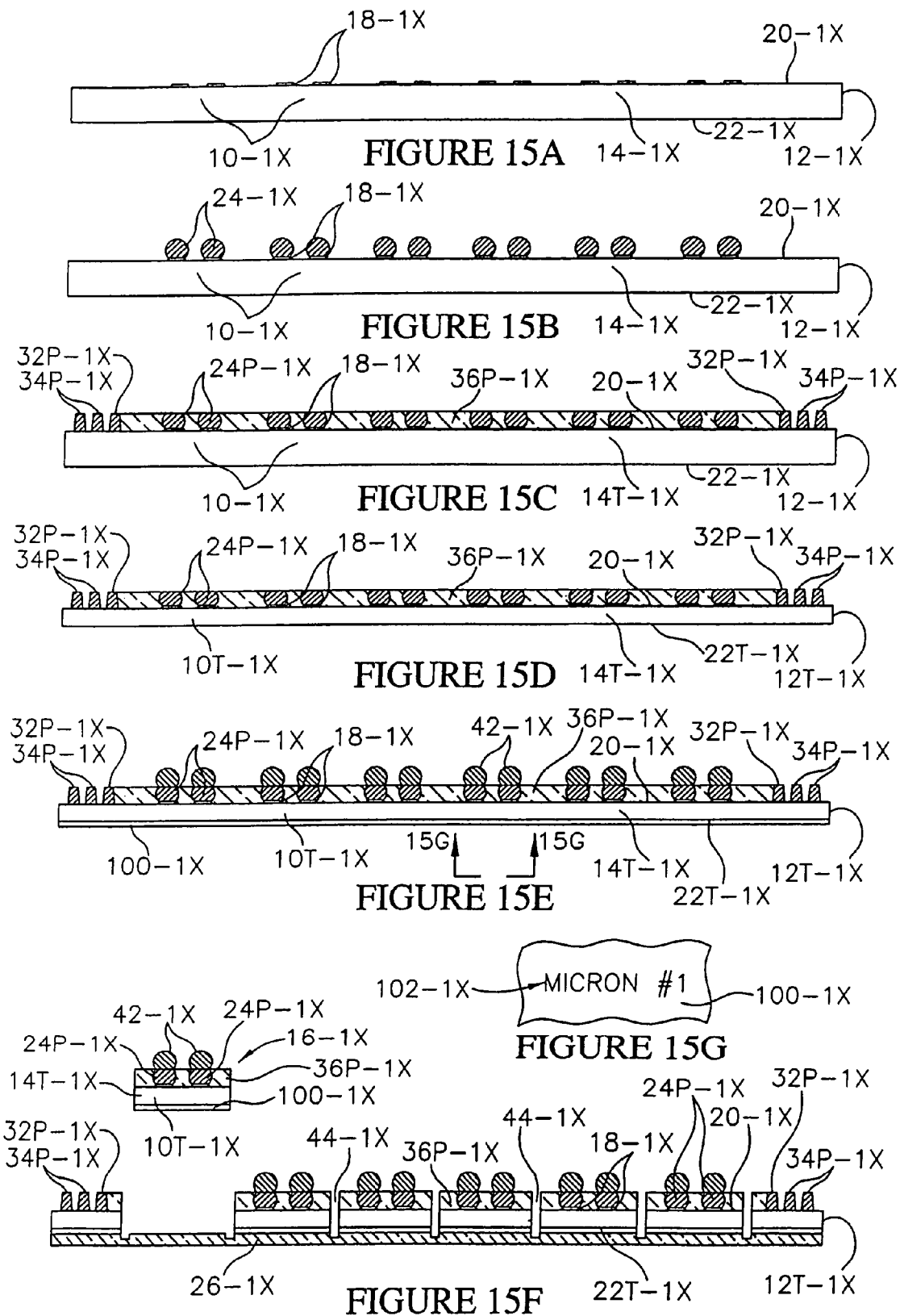

SEMICONDUCTOR COMPONENTS AND METHODS OF FABRICATION WITH CIRCUIT SIDE CONTACTS, CONDUCTIVE VIAS AND BACKSIDE CONDUCTORS

CROSS REFERENCE TO RELATED APPLICATIONS

This application is a continuation of Ser. No. 11/390,321, filed Mar. 27, 2006, U.S. Pat. No. 7,482,702, which is a division of Ser. No. 10/646,897, filed Aug. 22, 2003, abandoned, which is a division of Ser. No. 10/094,161, filed Mar. 6, 2002, U.S. Pat. No. 6,908,784.

This application is related to Ser. No. 10/719,876, filed Nov. 21, 2003, U.S. Pat. No. 6,964,915, to Ser. No. 10/719,907, filed Nov. 21, 2003, U.S. Pat. No. 7,029,949, to Ser. No. 11/052,279, filed Feb. 07, 2005, U.S. Pat. No. 7,382,060, to Ser. No. 11/052,378, filed Feb. 7, 2005, U.S. Pat. No. 7,221,059, to Ser. No. 11/146,397, filed Jun. 7, 2005, U.S. Pat. No. 7,157,353, to Ser. No. 11/339,177, filed Jan. 20, 2006, U.S. Pat. No. 7,417,325, and to Ser. No. 11/204,264, filed Aug. 15, 2005, U.S. Pat. No 7,432,604.

FIELD OF THE INVENTION

This invention relates generally to semiconductor manufacture and packaging. More particularly, this invention relates to encapsulated semiconductor components, to methods for fabricating the components, and to systems incorporating the components.

BACKGROUND OF THE INVENTION

In semiconductor manufacture, different types of components have been developed recently, that are smaller and have a higher input/output capability than conventional plastic or ceramic packages. For example, one type of semiconductor component is referred to as a chip scale package (CSP) because it has an outline, or "footprint", that is about the same as the outline of the die contained in the package.

Typically, a chip scale package includes a dense area array of solder bumps, such as a standardized grid array as disclosed in U.S. Pat. No. 6,169,329 to Farnworth et al. The solder bumps permit the package to be flip chip mounted to a substrate, such as a package substrate, a module substrate or a circuit board. Another type of component, referred to as a bumped die, can also include solder bumps in a dense area array. Bumped dice are sometimes considered as the simplest form of a chip scale package. Another type of component, referred to as a BGA device, is also sometimes considered a chip scale package. Yet another type of component as disclosed in U.S. Pat. No. 6,150,717 to Wood et al. is referred to as a direct die contact (DDC) package.

The quality, reliability and cost of these types of components is often dependent on the fabrication method. Preferably a fabrication method is performed on a substrate, such as a semiconductor wafer, containing multiple components, in a manner similar to the wafer level fabrication of semiconductor dice. A wafer level fabrication method permits volume manufacture with low costs, such that the components are commercially viable.

In addition to providing volume manufacture, the fabrication method preferably produces components that are as free of defects as possible. In this regard, semiconductor dice include relatively fragile semiconductor substrates that are susceptible to cracking and chipping. It is preferable for a fabrication method to protect the dice, and prevent damage to the fragile semiconductor substrates of the dice. Similarly, it is preferable for the completed components to have structures which provide as much protection as possible for the dice.

The present invention is directed to a novel wafer level fabrication method for fabricating semiconductor components, such as chip scale packages, BGA devices and DDC devices, in large volumes, at low costs, and with minimal defects. In addition, the fabrication method produces components with increased reliability, and with a chip scale outline, but with the dice protected on six surfaces by polymer layers.

SUMMARY OF THE INVENTION

In accordance with the present invention, encapsulated semiconductor components, methods for fabricating the components, and systems incorporating the components are provided.

In a first embodiment, the component comprises a semiconductor package in a chip scale configuration, and containing a single die having a circuit side, a back side and four edges. The die includes a semiconductor substrate thinned from the back side, and integrated circuits in a required configuration on the circuit side. In addition, the die includes die contacts on the circuit side in electrical communication with the integrated circuits.

In addition to the die, the component includes planarized contact bumps on the die contacts, and terminal contacts on the planarized contact bumps. The terminal contacts can comprise conductive bumps or balls, in a dense area array, such as a grid array, or alternately planar pads configured as an edge connector. The component also includes a circuit side polymer layer on the circuit side of the die encapsulating the planarized contact bumps, a back side polymer layer on the thinned back side of the die, and edge polymer layers on the edges of the die.

For fabricating the component, a substrate is provided which contains a plurality of semiconductor dice having the die contacts formed thereon. For example, the substrate can comprise a semiconductor wafer, or portion thereof, which contains dice separated by streets. Initially, conductive bumps are formed on the die contacts using a suitable process, such as bonding pre-formed balls, electroless deposition, electrolytic deposition, or stenciling and reflowing of conductive bumps. Trenches are then formed in the substrate between the dice to a depth that is less than a thickness of the substrate. The trenches can be formed by scribing, etching or lasering the substrate.

The circuit side polymer layer is then formed on the bumps and in the trenches, and both the circuit side polymer layer and the bumps can be planarized. The circuit side polymer layer can be formed using a nozzle deposition process, a transfer molding process, an injection molding process, a screen printing process, a stenciling process, a spin resist process, a dry film process, a stereo lithographic process, or any other suitable deposition process. The circuit side polymer layer protects the dice during the fabrication process, and also protects the dice in the completed components. Following formation of the circuit side polymer layer, the substrate is thinned from the back side, such that the polymer filled trenches are exposed. The thinning step can be performed by mechanically planarizing the substrate or by etching the substrate.

Next, the back side polymer layer is formed on the thinned back side of the substrate and can also be planarized. The back side polymer layer can be formed as described above for the circuit side polymer layer. The back side polymer layer protects the dice during the fabrication process, and also protects the dice in the completed components.

Next, the terminal contacts are formed on the contact bumps using a suitable deposition or bonding process. Finally, grooves are formed through the polymer filled trenches to singulate the completed components from one another. The grooves have a width that is less than the width of the polymer filled trenches, such that the edge polymer layers which comprise portions of the polymer filled trenches, remain on the four edges of the dice. The singulated component is encapsulated on six sides (i.e., circuit side, back side, four edges) by the circuit side polymer layer, the back side polymer layer and by edge polymer layers on the four edges. Prior to the singulation step, the components can be tested and burned-in while they remain on the substrate. In addition, the components are electrically isolated on the substrate, which is a particular advantage for burn-in testing.

A second embodiment component includes conductive vias in the thinned substrate, which electrically connect the die contacts to terminal contacts formed on the back side polymer layer. The terminal contacts can comprise conductive bumps or balls, or alternately planar pads configured as an edge connector. In addition, the conductive vias can be used to electrically connect terminal contacts on both sides of the component for stacking multiple components, and for facilitating testing of the components.

A third embodiment component is singulated by etching the substrate. The component includes a circuit side polymer layer, contact bumps embedded in the polymer layer, and terminal contacts on the contact bumps. In addition, the component includes a thin sealing coat, such as vapor deposited parylene, on five surfaces.

A fourth embodiment component includes a circuit side polymer layer, contact bumps embedded in the polymer layer, and terminal contacts on the contact bumps. In addition, the component includes a thinned semiconductor substrate having a back side coat tape for protecting and laser marking the substrate. Alternately, a heat sink can be attached directly to the back side of the thinned semiconductor substrate.

A fifth embodiment component includes a circuit side polymer layer, which comprises two separate polymer materials, including an imageable polymer material (e.g., a photopolymer), and a second polymer material having tailored electrical characteristics. The imageable polymer material also covers the edges of the component, and is formed into dams having a criss-cross pattern configured to retain the tailored polymer material. Depending on the material, the imageable polymer material can be blanket deposited, exposed, and then developed, using a conventional UV photolithography system, or alternately a laser stereo lithography system.

A sixth embodiment pin grid array component includes conductive vias in a thinned die having conductive members in electrical communication with die contacts. In addition, a semiconductor substrate of the thinned die has been planarized and etched to expose portions of the conductive members which form terminal contact pins for the component.

A seventh embodiment component includes a thinned die having conductive vias formed by laser machining and etching openings in a thinned semiconductor substrate. In addition, the thinned substrate can include doped contacts, having a different conductivity type than the bulk of the substrate. The thinned substrate can be etched very thin, such that a very thin component is provided.

An eighth embodiment ball grid array component includes conductive vias in a thinned die having conductive members in electrical communication with die contacts. In addition, a semiconductor substrate of the thinned die has been planarized and etched to expose portions of the conductive members which are used to form a pattern of redistribution conductors. Further, balls are bonded to the redistribution conductors to form terminal contacts in a ball grid array.

In each embodiment, the components can be used to construct systems such as MCM packages, multi chip modules and circuit boards. In addition, prior to assembling the systems, the components can be tested at the wafer level, such that each of the components can be certified as a known good component (KGC) prior to incorporation into the system.

BRIEF DESCRIPTION OF THE DRAWINGS

FIG. 2A is a cross sectional view taken along section line 2A-2A of FIG. 1A illustrating die contacts on a wafer containing a plurality of semiconductor dice;

FIG. 2B is a cross sectional view taken along section line 2B-2B of FIG. 1B illustrating bumps on the die contacts;

FIG. 2C is a cross sectional view taken along section line 2C-2C of FIG. 1C illustrating trenches formed in the streets between the dice on the wafer;

FIG. 2D is a cross sectional view taken along section line 2D-2D of FIG. 1D illustrating a good die dam on the wafer;

FIG. 2E is a cross sectional view taken along section line 2E-2E of FIG. 1E illustrating a support dam on the wafer;

FIG. 2F is a cross sectional view taken along section lien 2F-2F of FIG. 1F illustrating deposition of the circuit side polymer layer on the wafer;

FIG. 2G is a cross sectional view taken along section line 2G-2G of FIG. 1G illustrating the circuit side polymer layer and the bumps following planarization;

FIG. 2H is a cross sectional view taken along section line 2H-2H of FIG. 1H illustrating the polymer filled trenches on the back side of the wafer following back side thinning of the wafer;

FIG. 2I is a cross sectional view taken along section line 2I-2I of FIG. 1I illustrating the back side polymer layer on the wafer following planarization;

FIG. 3A is an enlarged portion of FIG. 2A, taken along section line 3A, illustrating a die contact;

FIG. 3B an enlarged portion of FIG. 2B, taken along section line 3B, illustrating a metal bump;

FIG. 3C is an enlarged portion of FIG. 2C, taken along section line 3C, illustrating the trenches in the streets of the wafer;

FIG. 3D is an enlarged cross sectional view taken along section line 3D-3D of FIG. 2D illustrating a metal bump, a trench and the good die dam;

FIG. 3E is an enlarged cross sectional view taken along section line 3E-3E of FIG. 2E illustrating the support dam, the good die dam, a trench and two metal bumps;

FIG. 3F is an enlarged cross sectional view taken along section line 3F-3F of FIG. 2F illustrating the circuit side polymer layer in the trenches and on the bumps;

FIG. 3G is an enlarged cross sectional view taken along section line 3G-3G of FIG. 2G illustrating the circuit side polymer layer and the bumps following a planarization step;

FIG. 3H is an enlarged portion of FIG. 2H illustrating the polymer filled trenches following a back side thinning step;

FIG. 3I is a cross sectional view taken along section line 3I-3I of FIG. 2I illustrating the back side polymer layer on the wafer following a planarization step;

FIGS. 8G-8I are schematic cross sectional views illustrating steps in an alternate embodiment of the second embodiment fabrication method;

FIG. 9A is an enlarged view taken along line 9A-9A of FIG. 8A illustrating a conductive via;

FIG. 9B is an enlarged cross sectional view taken along section line 9B-9B of FIG. 8A illustrating the conductive via;

FIG. 9C is an enlarged cross sectional view equivalent to FIG. 9B but illustrating an alternate embodiment conductive via;

FIG. 9D is an enlarged cross sectional view taken along section line 9D-9D of FIG. 8B illustrating a contact bump on the conductive via;

FIG. 9E is an enlarged cross sectional view taken along section line 9E-9E of FIG. 8C illustrating the conductive via, the contact bump, and a circuit side polymer layer prior to planarization;

FIG. 9H is an enlarged cross sectional view taken along section line 9H-9H of FIG. 8H illustrating the conductive via, planarized contact bump and terminal contact formed using the fabrication method of FIGS. 8G-8I;

FIGS. 13A-13F are schematic cross sectional views illustrating steps in a method for fabricating a third embodiment semiconductor component using an etching step for singulating the component;

FIG. 13G is an enlarged cross sectional view taken along section line 13G-13G of FIG. 13F illustrating a hermetic seal layer on the third embodiment component;

FIGS. 15A-15F are schematic cross sectional views illustrating steps in a method for fabricating a fourth embodiment semiconductor component encapsulated on a single side;

FIG. 15G is an enlarged view taken along line 15G-15G of FIG. 15E illustrating a laser marking;

DETAILED DESCRIPTION OF THE PREFERRED EMBODIMENTS

As used herein, the term "semiconductor component" refers to an electronic element that includes a semiconductor die. Exemplary semiconductor components include semiconductor packages, semiconductor dice, BGA devices, and DDC devices.

Referring to FIGS. 1A-1K, 2A-2K and 3A-3J, steps in the method for fabricating a first embodiment semiconductor component 16 (FIG. 1K) in accordance with the invention are illustrated. As will be further explained, each completed component 16 (FIG. 1K) contains a single die encapsulated by polymer layers on six surfaces. The component 16 is thus referred to as a "6X component".

Figure 1A:
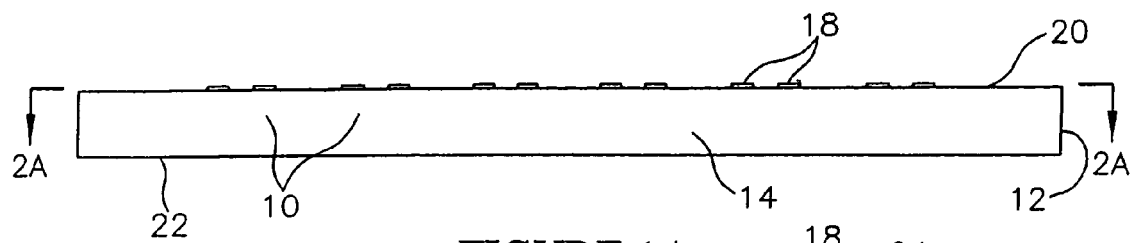
FIG. 1A is a schematic cross sectional view taken along section line 1A-1A of FIG. 2A illustrating a step in a first embodiment fabrication method.
Figure 1B:
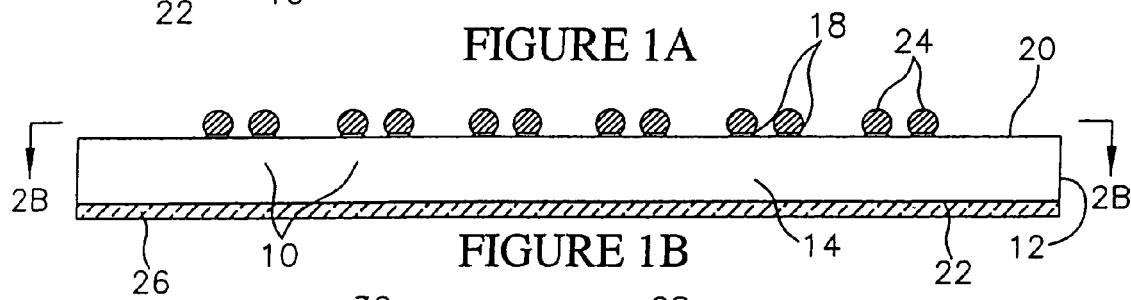
FIG. 1B is a schematic cross sectional view taken along section line 1B-1B of FIG. 2B illustrating a step in the first embodiment fabrication method.
Figure 1C:
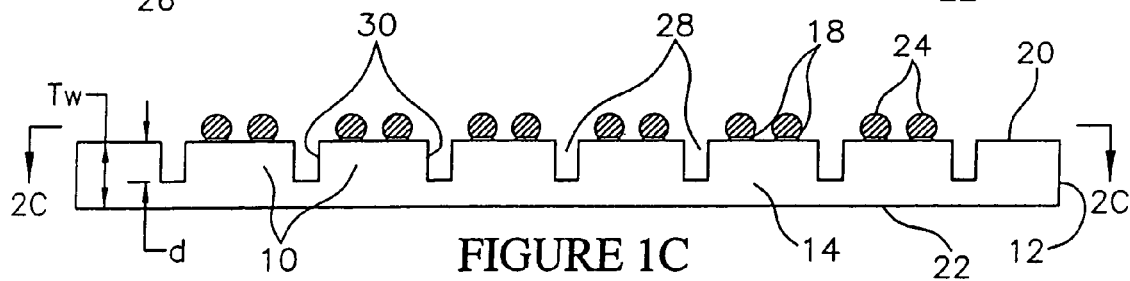
FIG. 1C is a schematic cross sectional view taken along section line 1C-1C of FIG. 2C illustrating a step in the first embodiment fabrication method.
Figure 1D:
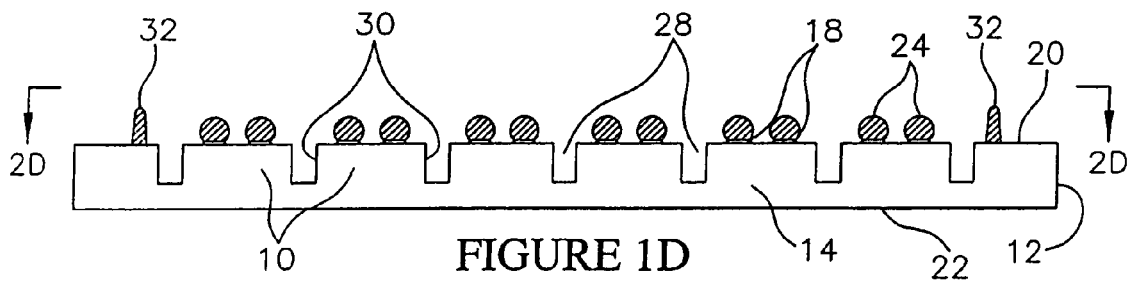
FIG. 1D is a schematic cross sectional view taken along section line 1D-1D of FIG. 2D illustrating a step in the first embodiment fabrication method.
Figure 1E:
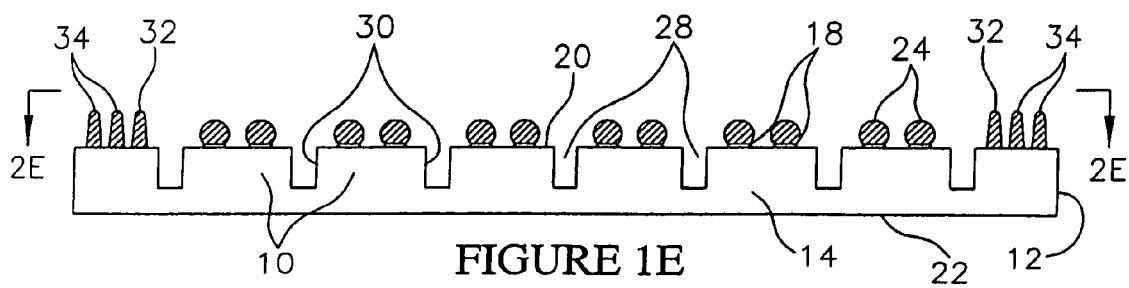
FIG. 1E is a schematic cross sectional view taken along section line 1E-1E of FIG. 2E illustrating a step in the first embodiment fabrication method.
Figure 1F:
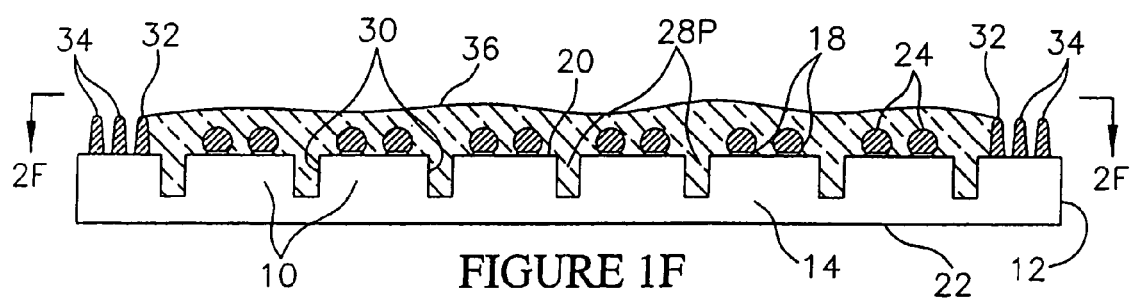
FIG. 1F is a schematic cross sectional view taken along section line 1F-1F of FIG. 2F illustrating a step in the first embodiment fabrication method.
Figure 1G:
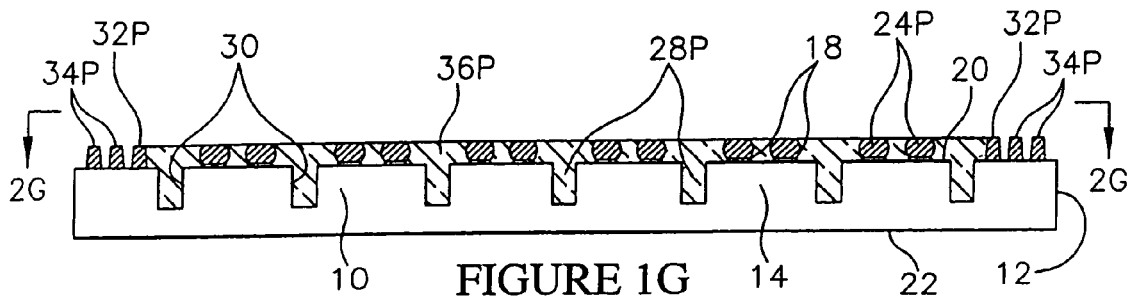
FIG. 1G is a schematic cross sectional view taken along section line 1G-1G of FIG. 2G illustrating a step in the first embodiment fabrication method.
Figure 1H:
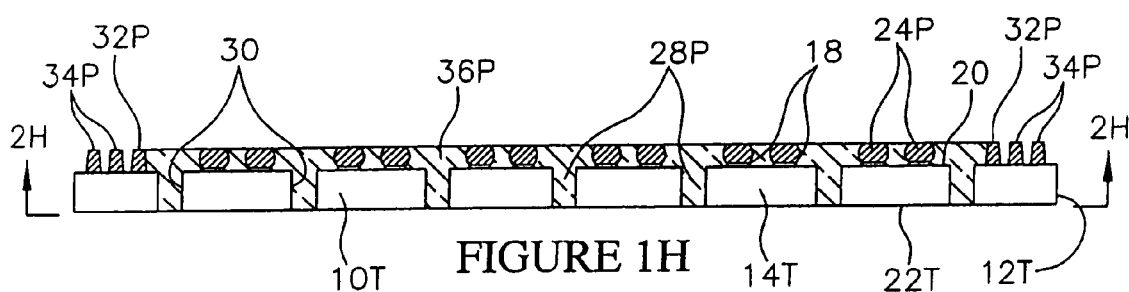
FIG. 1H is a schematic cross sectional view taken along section line 1H-1H of FIG. 2H illustrating a step in the first embodiment fabrication method.
Figure 1I:
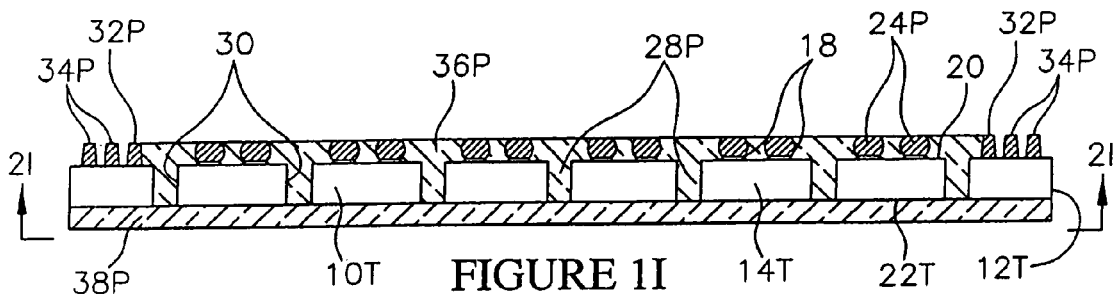
FIG. 1I is a schematic cross sectional view taken along section line 1I-1I of FIG. 2I illustrating a step in the first embodiment fabrication method.
Figure 1J:
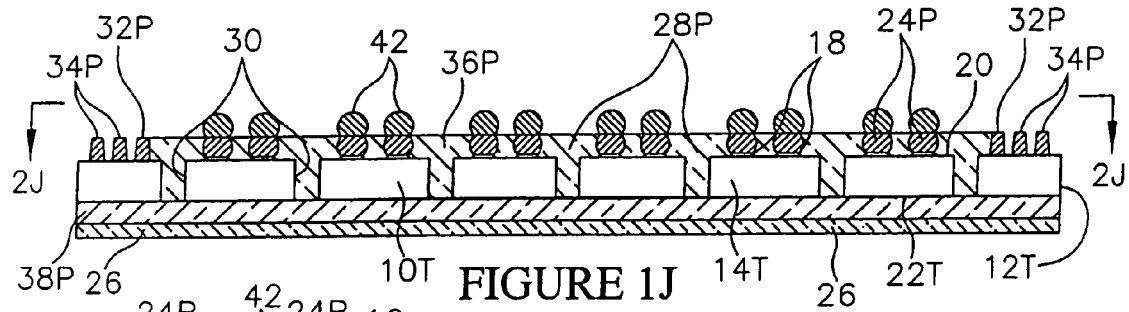
FIG. 1J is a schematic cross sectional view taken along section line 1J-1J of FIG. 2J illustrating a step in the first embodiment fabrication method.
Figure 1K:
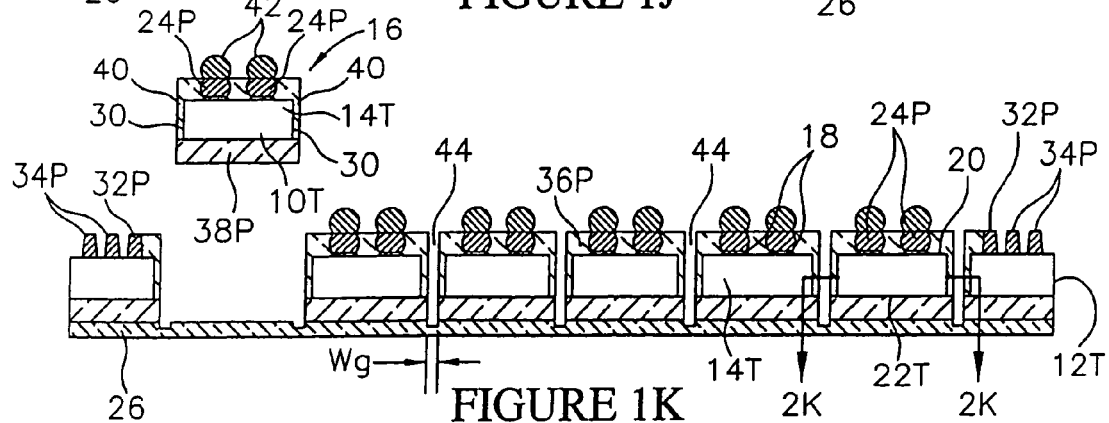
FIG. 1K is a schematic cross sectional view illustrating a step in the first embodiment fabrication method.

Initially, as shown in FIGS. 1A, 2A and 3A, a plurality of semiconductor dice 10 are provided, for fabricating a plurality of semiconductor components 16 (FIG. 1K). The dice 10 can comprise conventional semiconductor dice having a desired configuration. For example, each die 10 can comprise a dynamic random access memory (DRAM), a static random access memory (SRAM), a flash memory, a microprocessor, a digital signal processor (DSP) or an application specific integrated circuit (ASIC). The dice 10 and the components 16 can have any polygonal shape. In the illustrative embodiment, the dice 10 and the components 16 are rectangular in shape, but other polygonal shapes, such as square or hexagonal can also be utilized.

As shown in FIG. 2A, the dice 10 can be contained on a semiconductor wafer 12. Although in the illustrative embodiment, the method is performed on an entire semiconductor wafer 12, it is to be understood that the method can be performed on a portion of a wafer, on a panel, or on any other substrate that contains multiple semiconductor dice.

In the illustrative embodiment, the dice 10 are formed on the wafer 12 with integrated circuits and semiconductor devices using techniques that are well known in the art. As also shown in FIG. 2A, the dice 10 are separated by streets 13 on the wafer 12.

As shown in FIG. 1A, the wafer 12 and each die 10 includes a semiconductor substrate 14 wherein the integrated circuits are formed. In addition, the wafer 12 and each die 10 include a circuit side 20 (first side) wherein the integrated circuits are located, and a back side 22 (second side). Although the processes to follow are described as being formed on the circuit side 20 or on the back side 22, it is to be understood that any operation performed on the circuit side 20 can also be formed on the back side 22, and any operation performed on the back side 22 can be performed on the circuit side 20.

Each die 10 also includes a pattern of die contacts 18 formed on the circuit side 20, in a dense area array, in electrical communication with the integrated circuits thereon. As shown in FIG. 3A, the die contacts 18 are generally circular shaped metal pads having a desired size and spacing. In addition, the die contacts 18 can comprise a solderable metal such as nickel, copper, gold, silver, platinum, palladium, tin, zinc and alloys of these metals. In the illustrative embodiment, the die contacts 18 comprise Ni/Au pads having a diameter of about 330 µm.

The die contacts 18 can be formed on the circuit side 20 of the wafer 12 using known techniques, such as deposition and patterning of one or more redistribution layers in electrical communication with the bond pads (not shown) for the dice 10. One such technique is described in U.S. Pat. No. 5,851,911 to Farnworth, which is incorporated herein by reference. Alternately, the die contacts 18 can comprise the bond pads of the dice 10. In addition, the die contacts 18 can be electrically insulated from the semiconductor substrate 14 by insulating layers (not shown), formed of suitable materials such as BPSG, $SiO_2$ or polyimide.

Next, as shown in FIGS. 1B, 2B and 3B, a bump formation step is performed in which contact bumps 24 are formed on the die contacts 18. The contact bumps 24 can comprise metal bumps deposited on the die contacts 18 using a suitable deposition process, such as stenciling and reflow of a solder alloy onto the die contacts 18. The contact bumps 24 can comprise solder, another metal, or a conductive polymer material. As will become more apparent as the description proceeds, the contact bumps 24 function as interconnects between the die contacts 18 and terminal contacts 42 (FIG. 1K) which will be formed on the completed components 16. As shown in FIG. 1B, a dicing tape 26 can be attached to the back side 22 of the wafer 12 for performing a scribing step to follow. Suitable dicing tapes 26 are manufactured by Furikawa or Nitto Denko.

Next, as shown in FIGS. 1C, 2C and 3C, a scribing step is performed, during which trenches 28 are formed in the streets 13 of the wafer 12 between the dice 10. Although the scribing step is illustrated after the bump formation step, it is to be understood that the scribing step can be performed prior to the bump formation step. The scribing step can be performed using a dicing saw having saw blades set to penetrate only part way through the wafer 12. The scribing step can also be performed by etching the trenches 28 using a wet etching process, a dry etching process or a plasma etching process. With an etching process, the dicing tape 26 does not need to be employed. However, an etch mask (not shown) can be formed on the circuit side 20 of the wafer 12 having openings that define the pattern of the trenches 28. In addition, the depth of the trenches 28 can be controlled using suitable end pointing techniques.

As another alternative, the trenches 28 can be formed in the substrate 14 by laser machining the wafer 12 using a laser machining system. A suitable laser system for laser machining the trenches 28 is manufactured by Electro Scientific, Inc., of Portland, Oreg. and is designated a Model No. 2700.

The trenches 28 can have a criss-cross pattern as shown, similar to a tic tac toe board, such that each trench is parallel to some trenches and perpendicular to other trenches. As such, the trenches 28 substantially surround each die 10, defining the four edges 30 of each die 10, and the rectangular polygonal peripheral shape of each die 10 as well.

As shown in FIG. 1C, the trenches 28 do not extend through the full thickness Tw of the wafer 12 and the semiconductor substrate 14. Rather, the trenches 28 have a depth d measured from the surface of the circuit side 20 of the wafer 12, that is less than the thickness Tw of the wafer 12. The depth d can have any value provided it is less than the value of the full thickness Tw. By way of example, the depth d can be from about 0.1 to 0.9 of the thickness Tw. However, as will be more fully explained, the depth d must be greater than a depth Ts (FIG. 3I) of the thinned substrate 14T (FIG. 3I).

In the illustrative embodiment, the wafer 12 has a thickness Tw of about 28 mils (725 µm), and the trenches 28 have a depth d of about 10 mils (254 µm). In addition to the depth d, the trenches 28 have a width W, which in the illustrative embodiment is about 4 mils (101.6 µm). The scribing step can be performed using a dicing saw having saw blades with the width W, which are configured to penetrate the circuit side 20 of the wafer 12 to the depth d. Alternately, with an etching process for forming the trenches 28, openings in an etch mask determine the width W, and control of the etch process end points the trenches 28 with the depth d.

Next, as shown in FIGS. 1D, 2D and 3D, a good die dam 32 is formed on the circuit side 20 of the wafer 12. As shown in FIG. 2D, the good die dam 32 encircles only the complete, or "good" dice on the wafer. The incomplete or "bad" dice are not encircled by the good die dam 32. As shown in FIG. 3D, the good die dam 32 has a height H measured from the surface of the circuit side 20 of the wafer 12 that can be greater than, or alternately less than, a height Hb of the contact bumps 24. In the illustrative embodiment, the height Hb of the contact bumps 24 is about 13.78 mils (350 µm), and the height H of the good die dam 32 is slightly greater.

The good die dam 32 can comprise a polymer material deposited on the wafer 12 using a suitable deposition process such as deposition through a nozzle, screen printing, stenciling or stereographic lithography. In the illustrative embodiment, the good die dam 32 is deposited on the wafer 12 using a nozzle deposition apparatus. The nozzle deposition apparatus is under computer control, and is configured to move in x and y directions across the wafer 12, and in z directions towards and away from the wafer 12. One suitable nozzle deposition apparatus, also known as a material dispensing system, is manufactured by Asymtek of Carlsbad, Calif.

The good die dam 32 can comprise a curable polymer material having a relatively high viscosity, such that the polymer material sticks to the wafer 12, and stays in a desired location. Suitable curable polymers for the good die dam 32 include silicones, polyimides and epoxies. In addition, these polymer materials can include fillers such as silicates configured to reduce the coefficient of thermal expansion (CTE) and adjust the viscosity of the polymer material. One suitable curable polymer is manufactured by Dexter Electronic Materials of Rocky Hill, Conn. under the trademark "HYSOL" FP4451. The good die dam 32 can also comprise a polymer such as parylene, deposited using a vapor deposition process to be hereinafter described.

Next, as shown in FIGS. 1E, 2E and 3E, a support dam 34 is formed on the wafer 12. In the illustrative embodiment, the support dam 34 comprises a serpentine-shaped ribbon of polymer material formed outside of the good die dam 32 proximate to the peripheral edges of the wafer 12. The support dam 34 is configured to support peripheral areas of the wafer 12 during the planarization steps to follow. Specifically, these peripheral areas are subject to cracking without the support dam 34. The support dam 34 can comprise a curable polymer material deposited using a suitable deposition process such as deposition through a nozzle, screen printing or stenciling.

In the illustrative embodiment, the support dam 34 comprises a same material as the good die dam 32, and is deposited using the previously described nozzle deposition apparatus. Alternately, the support dam 34 can comprise one or more pre-formed polymer elements attached to the wafer 12. In this case, the support dam 32 can have a serpentine-shape, a donut shape, or can merely be a segment or ribbon of material, that supports a particular area on the wafer 12.

Following deposition, both the good die dam 32 and the support dam 34 can be cured to harden the polymer material.

For example, curing can be performed by placing the wafer 12 in an oven at a temperature of about 90° to 165° C. for about 30 to 60 minutes.

Next, as shown in FIGS. 1F, 2F and 3F, a circuit side polymer layer 36 is deposited on the circuit side 20 of the wafer 12 within the good die dam 32. The circuit side polymer layer 36 can comprise a relatively low viscosity, curable material configured to spread over a relatively large area. The circuit side polymer layer 36 can be deposited using a suitable deposition process such as deposition through a nozzle, spatuling, screen printing or stenciling. In the illustrative embodiment the circuit side polymer layer 36 is deposited in a spiral pattern 46 (FIG. 2F) to completely fill the area enclosed by the good die dam 32, using the previously described nozzle deposition apparatus.

As shown in FIG. 3F, the circuit side polymer layer 36 is contained by the good die dam 32. In addition, the circuit side polymer layer 36 encapsulates the contact bumps 24 and covers the surfaces of the dice 10. As also shown in FIG. 3F, the circuit side polymer layer 36 fills the trenches 28, forming polymer filled trenches 28P between the dice 10.

The circuit side polymer layer 36 can comprise a curable polymer such as a silicone, a polyimide or an epoxy. In addition, these materials can include fillers, such as silicates, configured to reduce the coefficient of thermal expansion (CTE) and adjust the viscosity of the polymer material. One suitable curable polymer material is manufactured by Dexter Electronic Materials of Rocky Hill, Conn. under the trademark "HYSOL" FP4450.

Following deposition, the circuit side polymer layer 36 can be cured to harden the polymer material. For example, curing can be performed by placement of the wafer 12 in an oven at a temperature of about 90° to 165° C. for about 30 to 60 minutes.

Next, as shown in FIGS. 1G, 2G and 3G, a circuit side planarization step is performed, in which the circuit side polymer layer 36 is planarized to form a planarized circuit side polymer layer 36P. This planarization step also planarizes the contact bumps 24 to form planarized contact bumps 24P. In addition, this planarization step planarizes the good die dam 32 to form a planarized good die dam 32P, and planarizes the support dam 34 to form a planarized support dam 34P.

The circuit side planarization step can be performed using a mechanical planarization apparatus (e.g., a grinder). One suitable mechanical planarization apparatus is manufactured by Okamoto, and is designated a model no. VG502. The circuit side planarization step can also be performed using a chemical mechanical planarization (CMP) apparatus. A suitable CMP apparatus is commercially available from a manufacturer such as Westech, SEZ, Plasma Polishing Systems, or TRUSI. The circuit side planarization step can also be performed using an etch back process, such as a wet etch process, a dry etch process or a plasma etching process.

In the illustrative embodiment, the circuit side planarization step can be performed such that the thickness of the circuit side polymer layer 36 is reduced by an amount sufficient to expose and planarize the surfaces of the contact bumps 24. In the illustrative embodiment, the planarized circuit side polymer layer 24P has a thickness Tcs of about 12 mils (304.8 μm). As another alternative the circuit side planarization step need not also planarize the contact bumps 24. For example, the contact bumps 24 can remain generally concave in shape, and can protrude past the surface of the planarized circuit side polymer layer 36P.

Rather than the above nozzle deposition and planarizing process, the circuit side polymer layer 36 can be formed by another suitable deposition process, such as an injection molding process, a transfer molding process, a stenciling process, a screen printing process, a spin resist process, a dry film process, or a stereographic lithographic process. As another alternative, the circuit side polymer layer 36 can comprise a polymer such as parylene, deposited using a vapor deposition process to be hereinafter described. As yet another alternative, the circuit side polymer layer 36 can comprise a wafer level underfill material to be hereinafter described.

Next, as shown in FIGS. 1H, 2H and 3H, a back side thinning step is performed using the above described mechanical planarization apparatus. The back side thinning step removes semiconductor material from the semiconductor substrate 14 to form a thinned semiconductor substrate 14T and thinned dice 10T. In addition, enough of the semiconductor material is removed to expose the polymer filled trenches 28P. As such, the back side thinning step would singulate the thinned dice 10T, but the polymer filled trenches 28P hold the thinned dice 10T and the wafer 12 together. Following the back side thinning step, all of the thinned dice 10T are electrically isolated by the polymer filled trenches 28P.

The amount of semiconductor material removed by the back side thinning step is dependent on the thickness Tw of the wafer 12, and on the depth d of the trenches 28. For example, if the thickness Tw of the wafer 12 is about 28 mils (725 μm), and the depth d of the trenches is about 10 mils (25.4 μm), then at least 18 mils (457.2 μm) of semiconductor material must be removed to expose the polymer filled trenches 28P. In the illustrative embodiment about 22 mils (558.8 μm) of semiconductor material is removed, such that the thickness Ts (FIG. 3I) of the thinned substrate 14T is about 6 mils (152.4 μm). However, the thickness Ts of the thinned substrate 14T can vary from about 10 μm to 720 μm.

The thickness Ts of the thinned substrate 14T can be related to the original thickness Tw of the wafer 12 by the formula Ts=Tw−y, where y represents the amount of material removed by the back side thinning step.

Optionally, a chemical polishing step (CMP) can be performed to remove grind damage to the thinned semiconductor substrate 14T. Polishing can be performed using a commercial CMP apparatus from a manufacturer such as Westech, SEZ, Plasma Polishing Systems or TRUSI. As another option an etching step can be performed using an etchant such as TMAH, to remove grind damage to the thinned semiconductor substrate 14T.

Next, as shown in FIGS. 1I, 2I and 3I, a planarized back side polymer layer 38P is formed on the thinned back side 22T of the thinned wafer 12T. The planarized back side polymer layer 38P can be formed by depositing a polymer material on the thinned back side 22T, curing the polymer material, and then mechanically planarizing the cured polymer material. All of these steps can be performed substantially as previously described for the planarized circuit side polymer layer 36P.

Alternately, the planarized back side polymer layer 38P can be formed by attaching or laminating a polymer film, such as a polyimide or epoxy tape, having an adhesive surface and a desired thickness to the thinned back side 22T. In this case the back side planarizing step can be eliminated. One suitable polymer film is a polymer tape manufactured by Lintec, and designated #LE 5950. As another alternative, the back side polymer layer 38P can be formed by an injection molding process, a transfer molding process, a spin resist process, a dry film process, a stereo lithographic process, or any other suitable process.

As shown in FIG. 3I, a thickness T of the component 16 is equal to a thickness Tp of the planarized back side polymer layer 38P, plus the thickness Ts of the thinned substrate 14T. In the illustrative embodiment the polymer material is initially deposited to a thickness of about 12 mils, and the thickness Tp of the planarized back side polymer layer 38P is about 10.5 mils (266.7 µm). Accordingly, the thickness T of the component 16 is about 28.5 mils (723.9 µm).

Following forming of the planarized back side polymer layer 38P, pin one indicators (not shown) can be laser printed on the back side polymer layer 38P, and also on the circuit side polymer layer 36P, as required. This printing step can be performed using a conventional laser printing apparatus. Preferably the planarized back side polymer layer 38P is opaque to the wavelength of the laser being employed during the printing step.

Figure 2J:
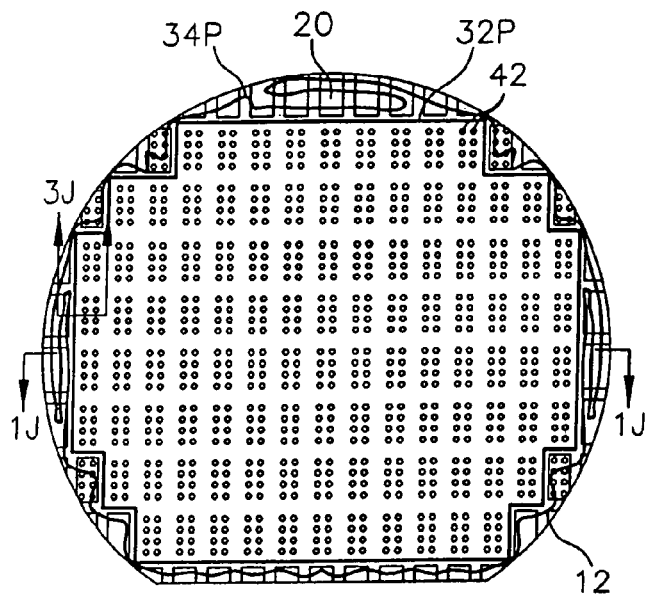
FIG. 2J is a cross sectional view taken along section line 2I-2J of FIG. 1J illustrating the terminal contacts on the circuit side polymer layer.
Figure 3J:
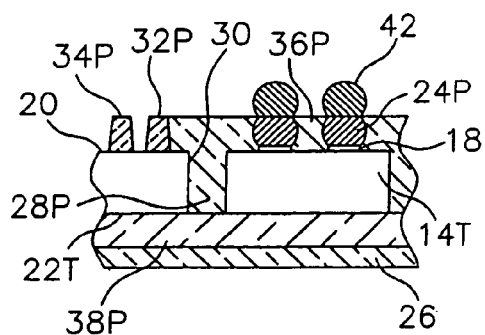
FIG. 3J is a cross sectional view taken along section line 3J-3J of FIG. 2J illustrating the terminal contacts on the bumps and the circuit side polymer layer.

Next, as shown in FIGS. 1J, 2J and 3J, a terminal contact forming step is performed for forming the terminal contacts 42. This step is performed by bonding, or depositing, the terminal contacts 42 on the planarized surface of the planarized contact bumps 24P. As with the contact bumps 24, the terminal contacts 42 can comprise metal bumps deposited on the planarized contact bumps 24P using a suitable deposition process, such as stenciling and reflow of a solder alloy. If desired, the same stencil mask that was used to form the contact bumps 24P can be used to form the terminal contacts 42. Also, rather than being formed of solder, the terminal contacts 42 can comprise another metal, or a conductive polymer material.

The terminal contacts 42 (and the contact bumps 24 as well) can also be formed by electrolytic deposition, by electroless deposition, or by bonding pre-fabricated balls to the planarized contact bumps 24P. A ball bumper can also be employed to bond pre-fabricated balls. A suitable ball bumper is manufactured by Pac Tech Packaging Technologies of Falkensee, Germany. The terminal contacts 42 can also be formed using a conventional wire bonder apparatus adapted to form a ball bond, and then to sever the attached wire.

Because the terminal contacts 42 are in effect "stacked" on the planarized contact bumps 24P, a relatively large spacing distance is provided for flip chip mounting, and the reliability of the component 16 is increased. In addition, the offset, or spacing, provided by the planarized contact bumps 24P and the terminal contacts 42, may allow the component 16 to be flip chip mounted without requiring an underfill for some applications.

Optionally, the terminal contacts 42 can be rigidified with a polymer support layer as described in U.S. Pat. No. 6,180,504 B1 to Farnworth et al., which is incorporated herein by reference. As another option, the terminal contacts 42 can be formed in a standardized grid array as described in U.S. Pat. No. 6,169,329 to Farnworth et al., which is incorporated herein by reference. As yet another option, the terminal contacts 42 can be formed as described in U.S. Pat. No. 6,281,131 B1 to Gilton et al., which is incorporated herein by reference.

In addition, the number, the diameter D (FIG. 4A) and the pitch P (FIG. 4B) of the terminal contacts 42 (and of the contact bumps 24 as well) can be selected as required. A representative diameter D can be from about 0.005-in (0.127 mm) to about 0.016-in (0.400 mm) or larger. A representative pitch P can be from about 0.004-in (0.100 mm) to about 0.039-in (1.0) mm or more.

As shown in FIG. 1J, following formation of the terminal contacts 42, the dicing tape 26 can be applied to the planarized back side polymer layer 38P.

Figure 2K:
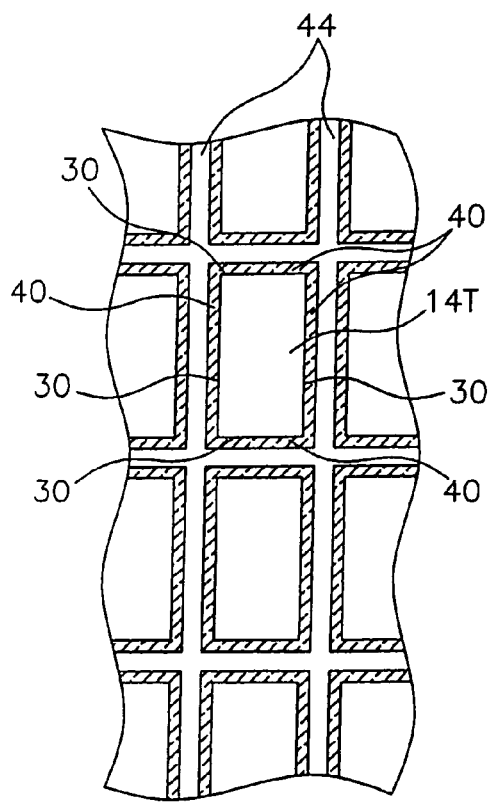
FIG. 2K is a cross sectional view taken along section line 2K-2K of FIG. 1K illustrating the singulated first embodiment components and the edge polymer layers on the components.

Next, as shown in FIGS. 1K and 2K, a singulating step is performed to singulate the components 16 from the wafer 12 and from one another. During the singulating step, grooves 44 are sawn, or otherwise formed, in the polymer filled trenches 28P. The grooves 44 extend through the planarized circuit side polymer layer 36P, through the polymer filled trenches 28P, through the planarized back side polymer layer 38P, and into the dicing tape 26. However, the grooves 44 have a width Wg that is less than the width W of the trenches 28. Accordingly, edge polymer layers 40 remain on the four edges 30 of the thinned die 10T. Specifically, the edge polymer layers 40 comprise portions of the polymer material in the polymer filled trenches 28P. Further, the edge polymer layers 40 provide rigidity for the edges of the component 16, and for the terminal contacts 42 proximate to the edges of the component 16.

The singulating step can be performed using a dicing saw having saw blades with the width Wg. Alternately the singulating step can be performed using another singulation method, such as cutting with a laser or a water jet or be etching the substrate 14T with a suitable wet or dry etchant. By way of example, if the width of the trenches 28 is about 4 mils (101.6 µm), and the width Wg of the grooves 44 is about 2 mils (50.8 µm), the edge polymer layers 40 will have a thickness of about 1 mil (25.4 µm).

Prior to the singulating step, the components 16 on the wafer 12 can be tested and burned-in using a wafer level test process. Suitable wafer level burn-in test procedures are described in U.S. Pat. No. 6,233,185 B1 to Beffa et al., which is incorporated herein by reference. In addition, a wafer level burn-in apparatus is described in U.S. Pat. No. 6,087,845 to Wood et al., which is incorporated herein by reference.

Because the components 16 on the wafer 12 are electrically isolated by the polymer filled trenches 28P and the back side planarization step, burn-in testing is improved, as defective components 16 remain electrically isolated, and do not adversely affect the burn-in test procedure. In addition, the active circuitry on the thinned semiconductor die 10T is protected from damage during test and burn-in. Further, the components 16 have a physical robustness that facilitates testing and handling of the components 16 by the manufacturer and the end user.

Figure 4A:
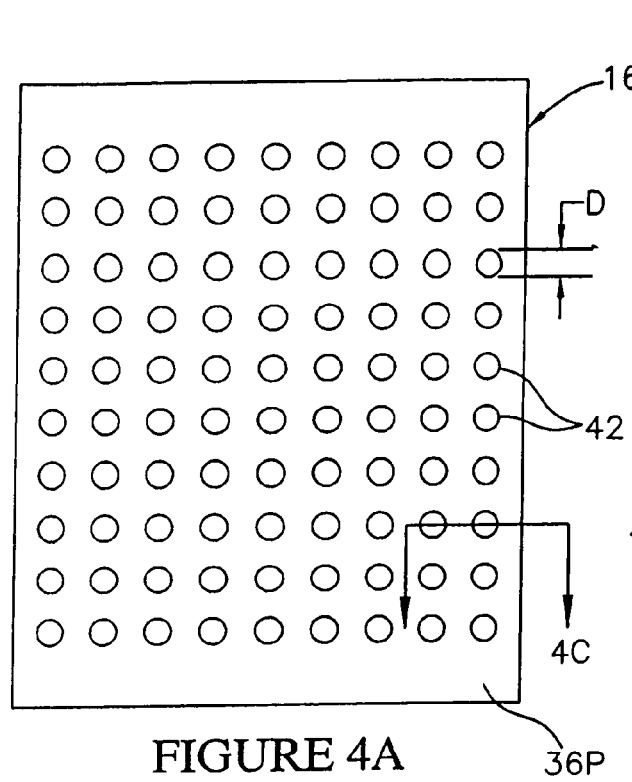
FIG. 4A is a plan view of a first embodiment semiconductor component.
Figure 4B:
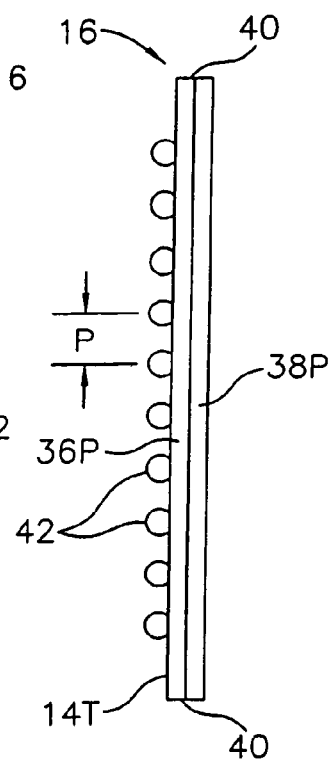
FIG. 4B is a side elevation view of FIG. 4A.
Figure 4C:
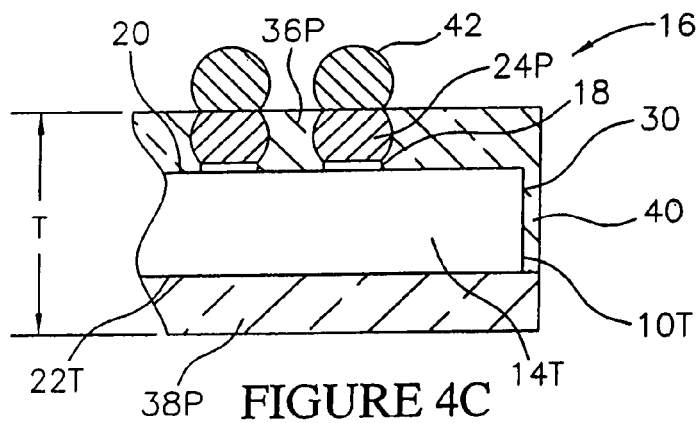
FIG. 4C is an enlarged cross sectional view of the component taken along section line 4C-4C of FIG. 4A.

Referring to FIGS. 4A-4C, a singulated component 16 is illustrated. As shown in FIG. 4C, the component 16 includes the thinned die 10T, the thinned substrate 14T and the die contacts 18 in electrical communication with the integrated circuits thereon. The component 16 also includes the planarized contact bumps 24P on the die contacts 18.

In addition, the component 16 includes the planarized circuit side polymer layer 36P which covers the circuit side 20 of the thinned die 14T, and encapsulates the planarized contact bumps 24P. The planarized contact bumps 24P are thus supported and rigidified by the planarized circuit side polymer layer 36P. In addition, the planarized contact bumps 24P function as interconnects between the die contacts 18 and the terminal contacts 42. Still further, the planarized circuit side polymer layer 36P has been mechanically planarized to a precise thickness with a planar surface.

The component 16 also includes the terminal contacts 42 bonded to the planarized contact bumps 24P. In addition, the terminal contacts 42 are arranged in a dense area array such as a ball grid array (BGA), such that a high input/output capability is provided for the component 16.

The component 16 also includes the planarized back side polymer layer 38P which covers the thinned back side 22T of the thinned die 10T. Again, the planarized back side polymer layer 38P has been mechanically planarized to a precise thickness with a planar surface.

In addition, the component 16 includes four edge polymer layers 40 which cover and rigidify the four edges 30 of the thinned die 10T. The component 16 is thus protected on six sides by polymer layers 36P, 38P and 40. In the illustrative embodiment the planarized circuit side polymer layer 36P and the edge polymer layers 40 are a continuous layer of material, and the planarized back side polymer layer 38P is a separate layer of material. In addition, the edge polymer layers 40 are formed by portions of the polymer filled trenches 28P (FIG. 3F).

Figure 5A:
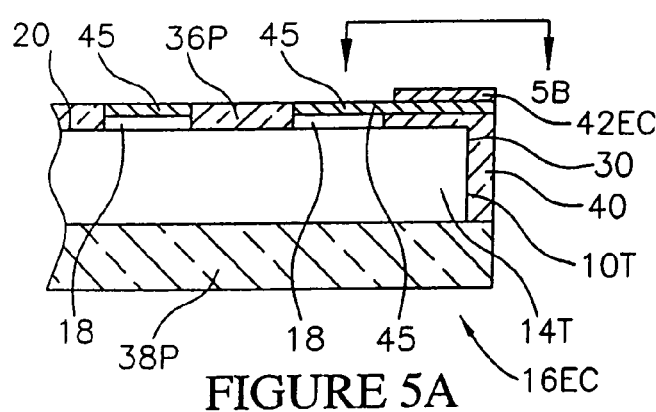
FIG. 5A is an enlarged cross sectional view equivalent to FIG. 4C of an alternate embodiment of the first embodiment component having planar terminal contacts configured as an edge connector.
Figure 5B:
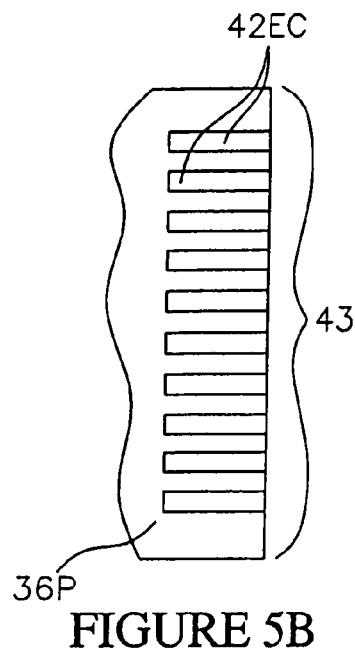
FIG. 5B is a view taken along line 5B-5B of FIG. 5A illustrating the edge connector.

Referring to FIGS. 5A and 5B, an alternate embodiment component 16EC is substantially similar to the previously described component 16 (FIGS. 4A-4C) but includes terminal contacts 42EC configured as an edge connector 43 (FIG. 5B). The edge connector 43 (FIG. 5B) can be configured as described in U.S. Pat. No. 5,138,434 to Wood et al., which is incorporated herein by reference.

The terminal contacts 42EC can comprise planar, polygonal pads formed of a relatively hard metal such as copper or nickel. In addition, conductors 45 on the circuit side 20 establish electrical paths between the terminal contacts 42EC and the die contacts 18. The component 16EC can be fabricated substantially as shown in FIG. 1A-1K, but with the conductors 45 and the terminal contacts 42EC fabricated in place of the contact bumps 24. The conductors 45 and the terminal contacts 42EC can be fabricated by deposition and patterning of one or more metal layers. Alternately electroless plating can provide robustness and lower electrical resistance.

Figure 6A:
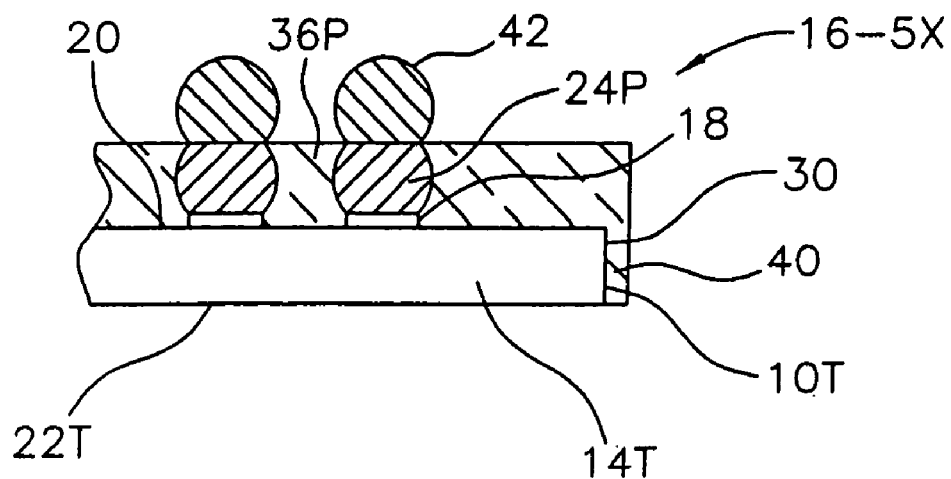
FIG. 6A is an enlarged cross sectional view equivalent to FIG. 4C of an alternate embodiment of the first embodiment component having encapsulation on five surfaces.

Referring to FIG. 6A, an alternate embodiment component 16-5X is substantially similar to the previously described component 16 (FIG. 4A-4C) but is encapsulated on five surfaces rather than on six surfaces. As such, the component 16-5X does not include a polymer layer on the thinned backside 22T of the thinned semiconductor substrate 14T. The thinned backside 22T is thus exposed, and can be used to mount a heat sink to the thinned semiconductor substrate 14T. The component 16-5X can be fabricated essentially as shown in FIGS. 1A-1K, but without forming the planarized back side polymer layer 38P of FIG. 1I.

Figure 6B:
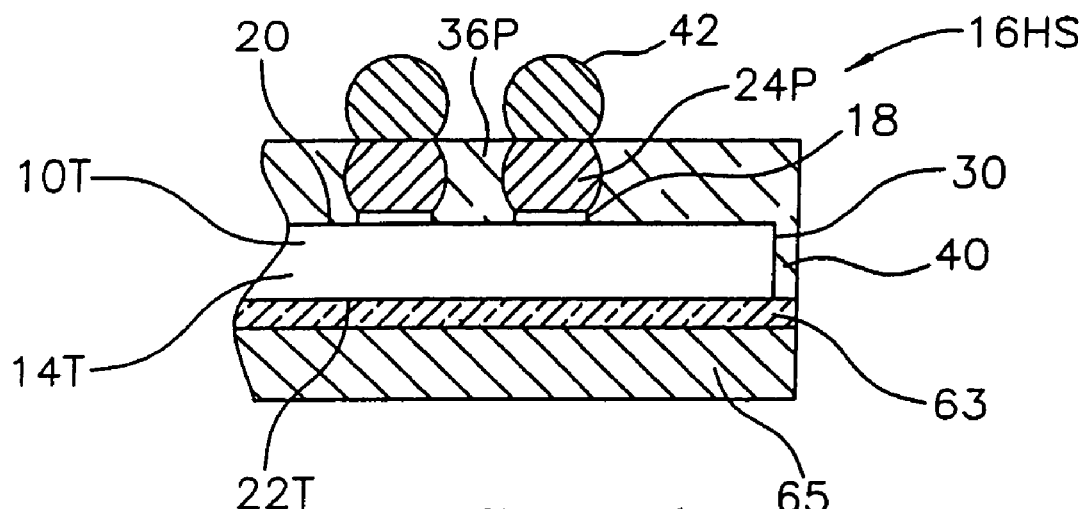
FIG. 6B is an enlarged cross sectional view equivalent to FIG. 4C of an alternate embodiment of the first embodiment component having a heat sink.

Referring to FIG. 6B, an alternate embodiment component 16HS is substantially similar to the previously described component 16-5X (FIG. 4F), but includes a heat sink 65 attached to the thinned back side 22T of the thinned semiconductor substrate 14T. In addition, a thermally conductive adhesive layer 63, such as a nitride filled epoxy, attaches the heat sink 65 to the thinned back side 22T. Heat transfer between the thinned semiconductor substrate 14T and the heat sink 65 is facilitated because the thinned back side 22T exposes the semiconductor material. The heat sink 65 can comprise a flat metal plate formed of copper or other metal having a high thermal conductivity. In addition, the heat sink 65 can include ribs or fins (not shown) configured to provide an increased surface area for heat transfer.

Figure 7:
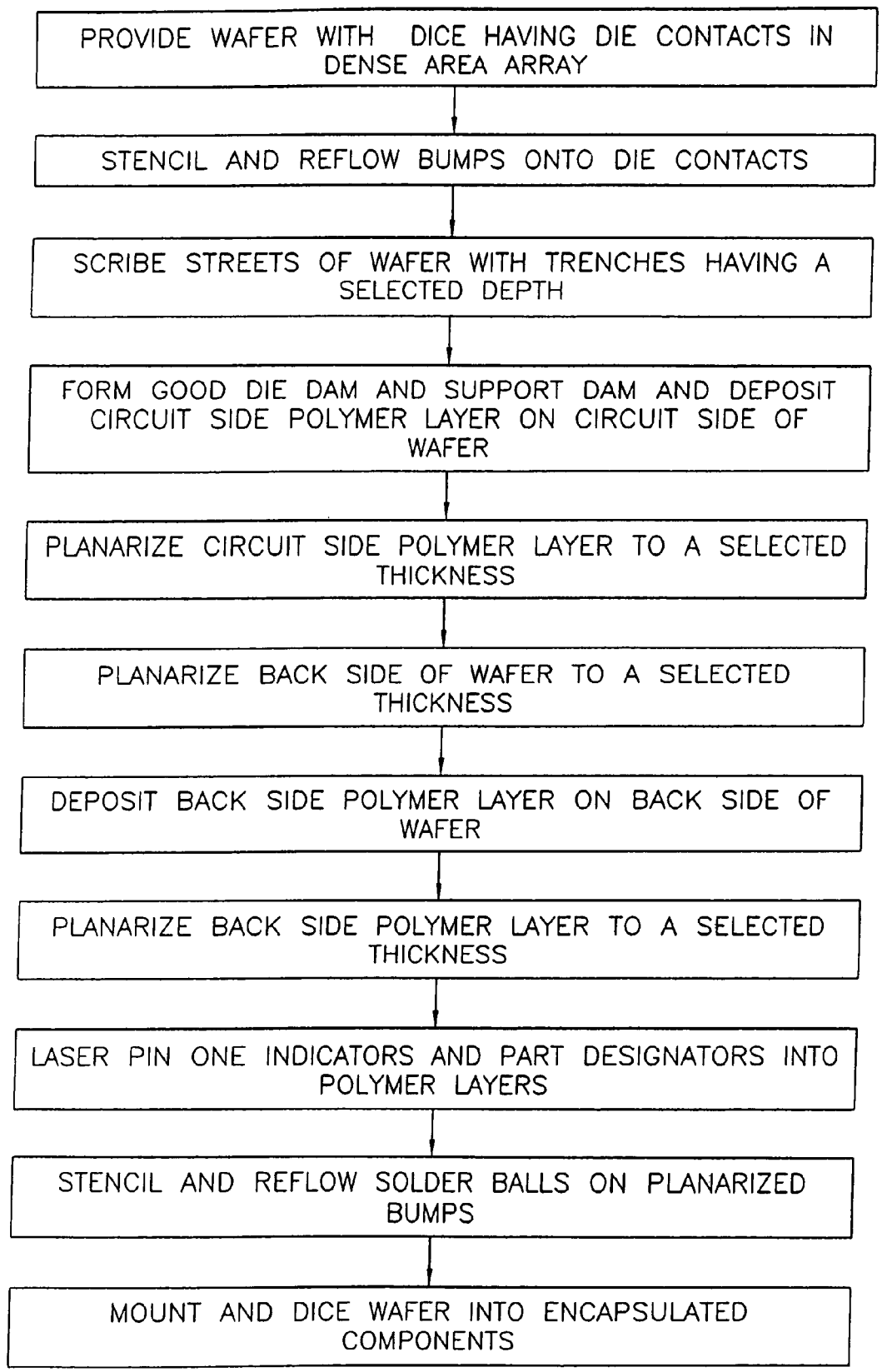
FIG. 7 is a block diagram illustrating steps in the first embodiment fabrication method.

FIG. 7 summarizes the steps illustrated in FIGS. 1A-1K for fabricating the first embodiment component 16.

Figure 1L:
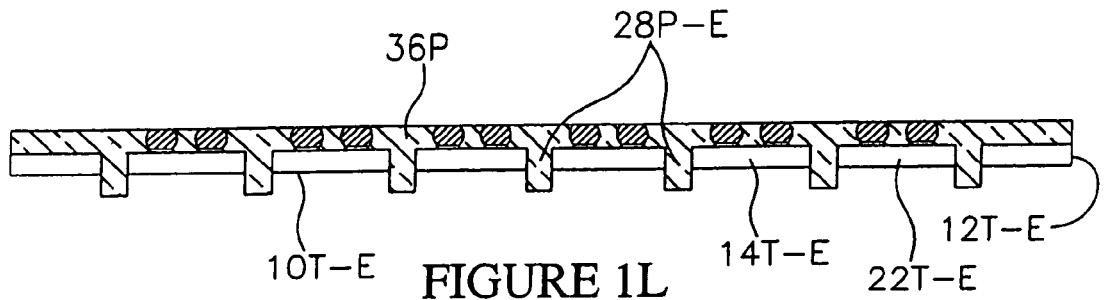
FIGS. 1L-1N are schematic cross sectional views of an alternate embodiment of the first embodiment fabrication method shown in FIGS. 1A-1K.
Figure 1M:
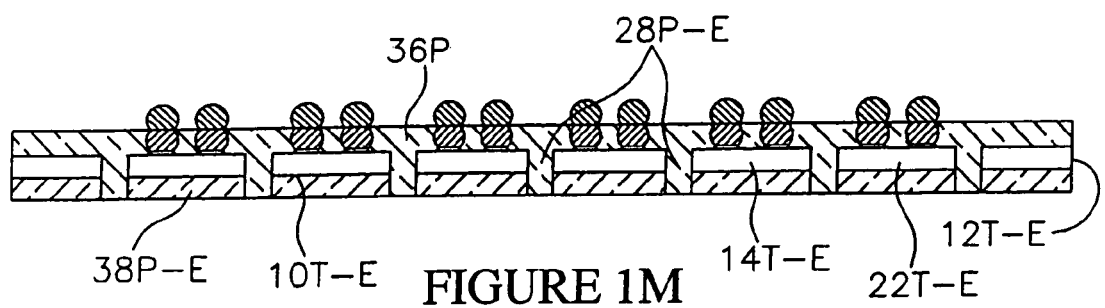
Figure 1N:
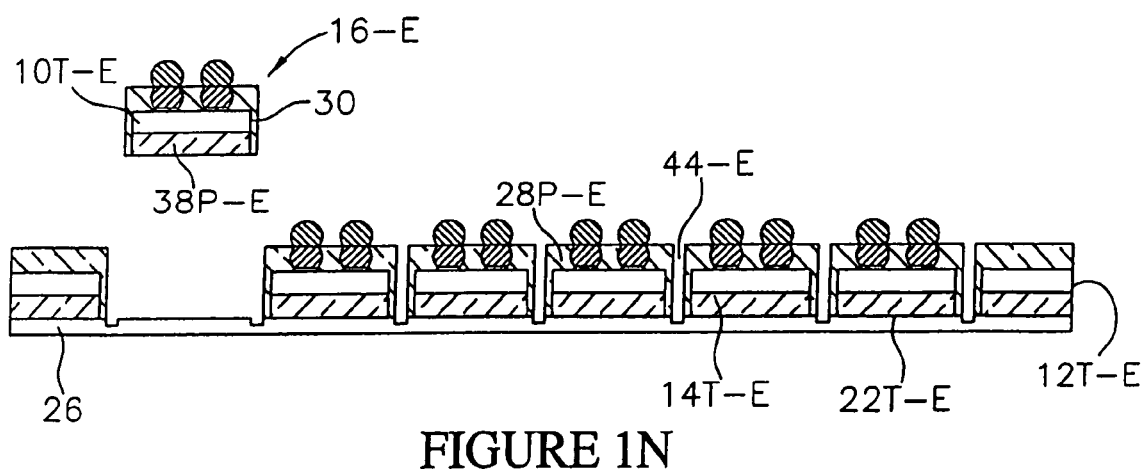

Referring to FIGS. 1L-1N, an alternate embodiment of the first embodiment fabrication method illustrated in FIGS. 1A-1K is illustrated. In this method the same steps are utilized as previously shown in FIGS. 1A-1G and described in the related portions of the specification. However, the thinning step is performed as shown in FIG. 1L, by mechanical planarization in combination with etching to remove damage caused by the mechanical planarization. This forms a thinned wafer 12T-E having thinned dice 10T-E with thinned substrates 14T-E, and a planarized circuit side polymer layer 36P-E, substantially as previously described. However, in this case the polymer filled trenches 28P-E extend past the thinned back side 22T-E because they are not affected by the etching process. Stated differently, the thinned semiconductor substrates 14T-E are recessed with respect to the back side edges of the polymer filled trenches 28P-E. The etching process can be performed using a wet etchant, such as KOH or TMAH, that selectively etches the semiconductor substrate 14. Alternately, the etching process can be performed using a dry etching process or a plasma etching process. As another alternative the polymer filled trenches 28P-E can be polished back to the level of the thinned back side 22T-E.

Next, as shown in FIG. 1M, planarized back side polymer layers 38P-E are formed on the thinned substrates 14T-E, substantially as previously described for planarized back side polymer layer 38P. The planarized back side polymer layers 38P-E fit into the recesses formed by the polymer filled trenches 28P-E.

Next, as shown in FIG. 1N, the thinned wafer 12T-E is singulated substantially as previously described, by forming grooves 44-E through the polymer filled trenches 28P-E. Each singulated component 16-E includes a thinned die 10T-E that has been etched back from the back side. In addition, each component 16-E includes the planarized back side polymer layer 38P-E, and edge polymer layers 40E which comprise portions of the polymer filled trenches 28P-E.

Figure 1O:
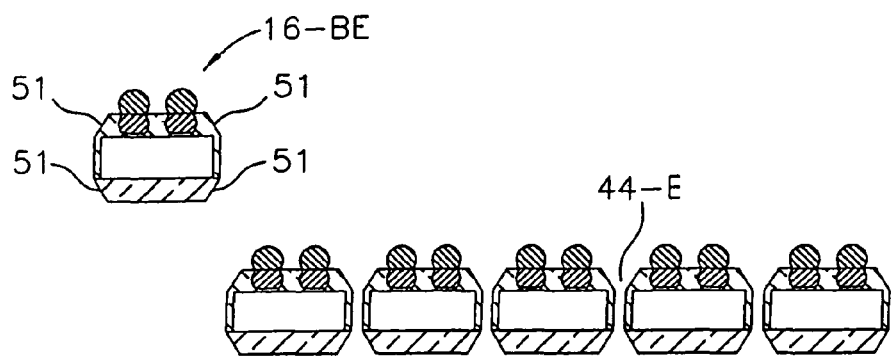
FIG. 1O is a schematic cross sectional view of an alternate embodiment of the first embodiment fabrication method shown in FIGS. 1A-1K.

Referring to FIG. 1O, another alternate embodiment of the first embodiment fabrication method is illustrated. FIG. 1O corresponds to FIG. 1N which shows the singulating step. All of the previous fabrication steps as shown in FIGS. 1A-1J are the same. However, in this embodiment the singulating step is performed as shown in FIG. 1O, such that singulated components 16-BE have beveled edges 51. The beveled edges 51 can be formed using saw blades configured to make beveled cuts.

Figure 1P:
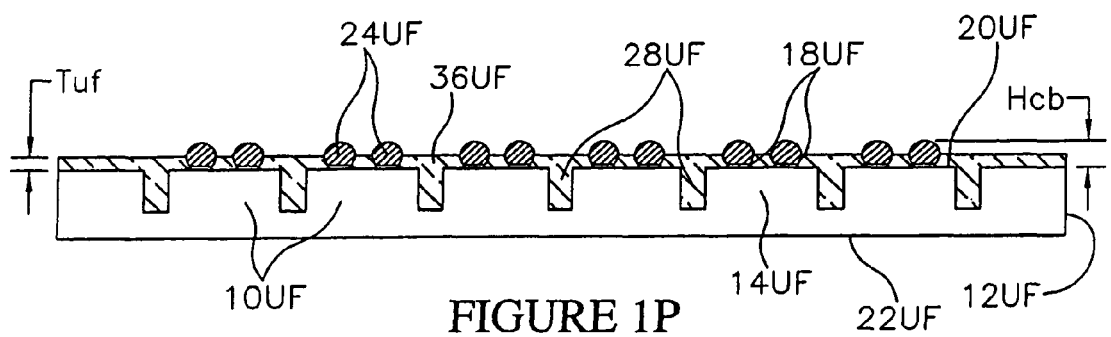
FIGS. 1P-1R are schematic cross sectional views of an alternate embodiment of the first embodiment fabrication method shown in FIGS. 1A-1K.
Figure 1Q:
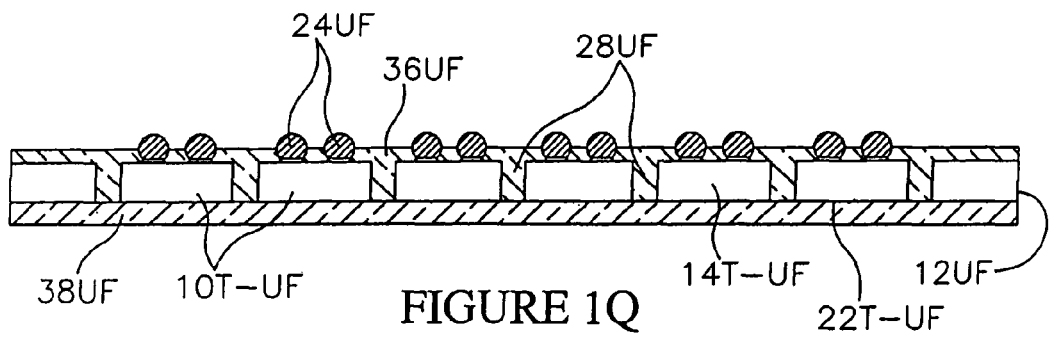
Figure 1R:
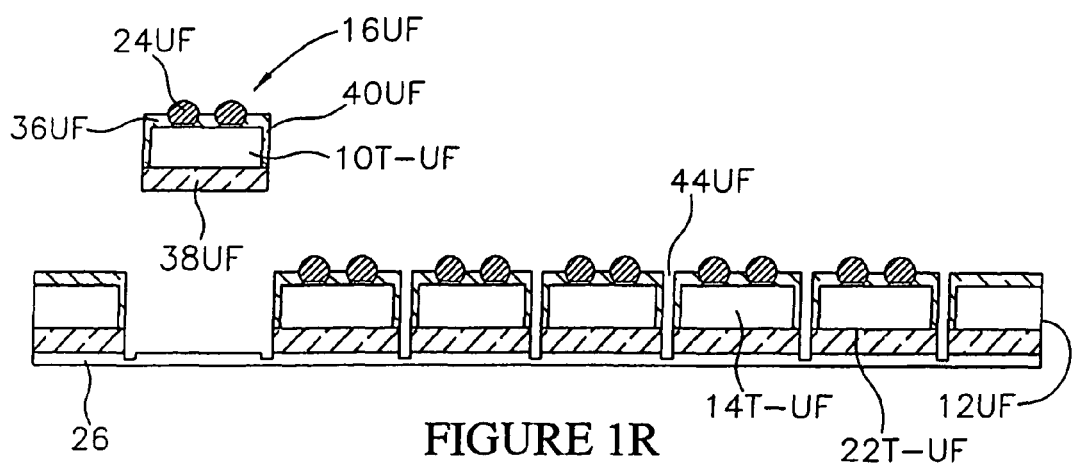

Referring to FIGS. 1P-1R, an alternate embodiment of the first embodiment fabrication method illustrated in FIGS. 1A-1K is illustrated. In this method the same steps are utilized as previously shown in FIGS. 1A-1G and described in the related portions of the specification. However, in this embodiment both a circuit side polymer layer 36UF, and a back side polymer layer 38UF comprise a polymer film having specific characteristics.

Specifically, the polymer film comprises a thermoset polymer film having a Young's modulus of about 4 G Pascal, and a coefficient of thermal expansion (CTE) of about 33 parts per million per ° C. In addition, the polymer film preferably cures and planarizes at a temperature and in a time period that are similar to the temperature and time period for a solder reflow process for bonding solder bumps to semiconductor components (e.g., about 200-250° C. for about several minutes). Further, the polymer film preferably has low alpha emission characteristics.

One suitable thermoset polymer film is a wafer level underfill film manufactured by 3M corporation. In addition, this polymer film is self planarizing, such that a mechanical planarization step as previously described is not necessary.

As shown in FIG. 1P, the wafer 12UF has a back side 22UF, and includes semiconductor dice 10UF on a semiconductor substrate 14UF. In addition, contact bumps 24UF have been formed on die contacts 18UF substantially as previously described for contact bumps 24 (FIG. 1B) and die contacts 18 (FIG. 1A).

As also shown in FIG. 1P, a circuit side polymer layer 36UF is formed by depositing and curing the above described thermoset polymer film on the circuit side 20UF of the wafer 12UF. In particular, a piece of the polymer film having a desired thickness, and about the same peripheral shape as the wafer 12UF, is placed on the circuit side 20UF and on the contact bumps 24UF. The polymer film is then heated to a temperature of about 200-250° C. for several minutes, such that softening and then curing occurs. Following the curing step, each contact bump 24UF is surrounded by a portion of the circuit side polymer layer 36UF, but with a tip portion of each contact bumps 24UF exposed. As such, the circuit side polymer layer 36UF has a thickness Tuf on the circuit side 20UF that is less than a height Hcb of the contact bumps 24UF. In the illustrative embodiment the thickness Tuf is about half the height Hcb. However, the thickness Tuf can be from about 0.1 to 0.9 of the height Hcb.

Polymer filled trenches 28UF are also formed during formation of the circuit side polymer layer 36UF, substantially as previously described for polymer filled trenches 28P (FIG. 1F). In this case, during the curing step the above described polymer film softens and flows into the trenches 28 (FIG. 1C).

Next, as shown in FIG. 1Q, a thinning step is performed substantially as previously described, to form a thinned wafer 12T-UF having thinned dice 10T-UF and a thinned substrate 14T-UF with a thinned back side 22T-UF. In addition, a back side polymer layer 38UF is formed on the thinned back side 22T-UF by depositing and curing the above described polymer film. Alternately, the back side polymer layer 38UF can be formed using the previously described deposition and planarization steps.

Next, as shown in FIG. 1R, the thinned wafer 12T-UF and the components 16UF are singulated, substantially as previously described, by forming grooves 44UF through the polymer filled trenches 28UF. Each singulated component 16UF includes a thinned die 10T-UF. In addition, each singulated component 16UF includes a portion of the circuit side polymer layer 36UF, a portion of the back side polymer layer 38UF, and edge polymer layers 40UF which comprise portions of the polymer filled trenches 28UF. In addition, each component 16UF includes exposed contact bumps 24UF, which function as the terminal contacts for the component 16UF. Further, the contact bumps 24UF are rigidified by the circuit side polymer layer 36UF. Alternately, terminal contacts can be bonded to the exposed contact bumps 24UF, as previously described for terminal contacts 42 (FIG. 1K).

Referring to FIGS. 8A-8F, steps in a method for fabricating a second embodiment component 16A (FIG. 8F) are illustrated. As with the first embodiment component 16, each completed component 16A (FIG. 8F) includes a single semiconductor die encapsulated on six surfaces (6X). In addition, each die includes conductive vias 68A formed in a semiconducting substrate thereof.

Figure 8A:
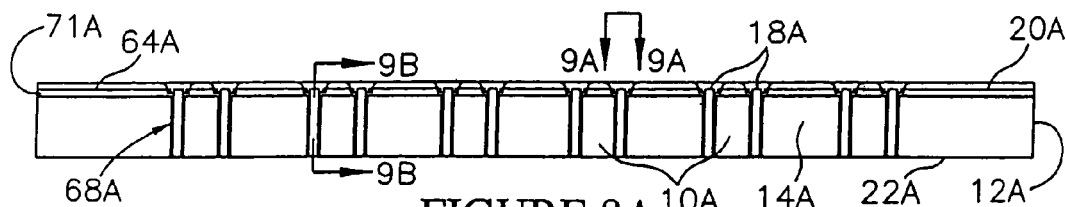
FIGS. 8A-8F are schematic cross sectional views illustrating steps in a second embodiment fabrication method.

Initially, as shown in FIG. 8A, a plurality of semiconductor dice 10A are provided on a semiconductor wafer 12A substantially as previously described. Each die 10A includes a semiconductor substrate 14A containing integrated circuits. In addition, the wafer 12A and each die 10A includes a circuit side 20A (first side) wherein the integrated circuits are located, and a back side 22A (second side). Each die 10A also includes a pattern of die contacts 18A in the form of bond pads on the circuit side 20A, in electrical communication with the integrated circuits thereon. The die contacts 18A are embedded in an insulating layer 64A having openings 80A aligned with the die contacts 18A. The insulating layer 64A can comprise a glass such as BPSG, an oxide such as silicon dioxide, or a polymer layer such as polyimide. In addition, a dielectric layer 71A electrically insulates the die contacts 18A from the bulk of the substrate 14A, and from the integrated circuits on the substrate 14A. The dielectric layer 71A can comprise an electrically insulating material such as silicon dioxide, or polyimide, formed during fabrication of the wafer 12A. In addition, the dielectric layer 71A rather than being blanket deposited, can be located or can have a shape (e.g., donut shape) that insulates only selected portions of the substrate 14A.

As shown in FIG. 8A, conductive vias 68A are formed through the die contacts 18A, and through the semiconductor substrate 14A, and extend from the circuit side 20A to the back side 22A of the dice 10A. As shown in FIGS. 9A and 9B, each conductive via 68A includes a via 74A formed in the substrate 14A, a conductive member 76A in the via 74A, and an insulating layer 78A which electrically insulates the conductive member 76A from the bulk of the substrate 14A.

One method for forming the vias 74A for the conductive vias 68A combines laser machining and etching processes. Initially, openings 82A are formed in the die contacts 18A using an etch mask (not shown) and an etching process. Depending on the material of the die contacts 18A, a wet etchant can be used to etch the die contacts 18A. For example, for die contacts 18A made of aluminum, one suitable wet etchant is $H_3PO_4$. The openings 82A in the die contacts 18A are generally circular, and are smaller in diameter than the width of the die contacts 18A. The die contacts 18A thus have metal around their peripheries, but no metal in the center. In the illustrative embodiment, the openings 82A have a diameter that is about one half the width of the die contacts 18A. In addition, the openings 82A surround a portion of the substrate 14A, such that the die contacts 18A and the openings 82A form targets, or bullseyes, for a subsequent laser drilling step in which a laser beam is directed at the openings 82A and through the substrate 14A. The laser beam initially pierces the substrate 14A on the portions of the substrate 14A surrounded by the openings 82A.

The laser drilling step forms lasered openings through the substrate 14A, which do not touch the metal of the die contacts 18A, as they are located in the middle of the openings 82A in the die contacts 18A. For example, the lasered openings can have diameters that are about one half the diameter of the openings 82A. The laser beam thus initially contacts and pierces the substrate 14A without having to contact and pierce the metal that forms the die contacts 18A. This helps to prevent shorting between the conductive via and the die contacts 18A.

Following the laser drilling step, a cleaning step can be performed in which the lasered openings are cleaned using a suitable wet or dry etchant to form the vias 74A for the conductive vias 68A. One suitable wet etchant for cleaning the lasered openings with the substrate 14A comprising silicon is tetramethylammoniumhydroxide (TMAH). By way of example, the diameters of the vias 74A can be from 10 μm to 2 mils or greater.

A suitable laser system for performing the laser drilling step is manufactured by Electro Scientific, Inc., of Portland, Oreg. and is designated a Model No. 2700. A representative laser fluence for forming the vias 74A through a silicon substrate having a thickness of about 28 mils, is from 2 to 10 watts/per opening at a pulse duration of 20-25 ns, and at a repetition rate of up to several thousand per second. The wavelength of the laser beam can be a standard UV wavelength (e.g., 355 nm).

Still referring to FIGS. 9A and 9B, following the laser drilling and cleaning steps, the insulating layers 78A can be formed on the inside surfaces of the vias 74A. The insulating layers 78A can be a grown or a deposited material. With the substrate 14A comprising silicon, the insulating layers 78A can be an oxide, such as $SiO_2$, formed by a growth process by exposure of the substrate 14A to an $O_2$ atmosphere at an elevated temperature (e.g., 950° C.). In this case the insulating layers 78A do not completely close the vias 74A, but form only on the sidewalls of the vias 74A.

Alternately, the insulating layers 78A can comprise an electrically insulating material, such as an oxide or a nitride, deposited using a deposition process such as CVD, or a polymer material deposited using a suitable deposition process such as screen printing. In this case, if the insulating material completely fills the vias 74A, a subsequent laser drilling step, substantially as previously described, may be required to re-open the vias 74A.

Following formation of the insulating layers 78A, the conductive members 76A can be formed within the vias 74A. The conductive members 76A can be plugs that completely fill the vias 74A, or alternately, can be layers that cover just the inside surfaces or sidewalls of the vias 74A. The conductive members 76A can comprise a highly conductive metal, such as aluminum, titanium, nickel, iridium, copper, gold, tungsten, silver, platinum, palladium, tantalum, molybdenum, tin, zinc and alloys of these metals. The above metals can be deposited within the openings 76A using a deposition process, such as electroless deposition, CVD, or electrolytic deposition. Alternately a solder metal can be screen printed in the vias 74A and drawn into the vias 74A with capillary action. A solder metal can also be drawn into the vias 74A using a vacuum system and a hot solder wave.

Rather than being a metal, the conductive members 76A can comprise a conductive polymer, such as a metal filled silicone, or an isotropic epoxy. Suitable conductive polymers are available from A.I. Technology, Trenton, N.J.; Sheldahl, Northfield, Minn.; and 3M, St. Paul, Minn. A conductive polymer can be deposited within the vias 74A, as a viscous material, and then cured as required. A suitable deposition process, such as screen printing, or stenciling, can be used to deposit the conductive polymer into the vias 74A.

The conductive vias 68A can also be formed using the laser machining processes disclosed in U.S. Pat. No. 6,107,109 to Akram et al, U.S. Pat. No. 6,114,240 to Akram et al., and U.S. Pat. No. 6,294,837 B1 to Akram et al., all of which are incorporated herein by reference. Rather than a laser machining processes, the conductive vias 68A can be formed by etching the vias 74A using an etch mask and a suitable etchant. As another alternative, the conductive vias 68A can be formed as described in U.S. Pat. No. 6,313,531 B1 to Geusic et al., which is incorporated herein by reference.

As shown in FIG. 9C, an alternate embodiment counter bored conductive via 68A-CB can be formed in the substrate 14A. In this case, the above described laser machining process can be controlled to form the counter bored conductive via 68A-CB from the backside 22A but only part way through the substrate 14A. As also shown in FIG. 9C, the substrate 14A can be a first conductivity type (e.g., P type silicon). In addition, the substrate 14A can include a conductivity region 114A for each counterbored via 68A-CB having a second conductivity type (e.g., N type silicon). The conductivity region 114A can comprise a portion of the substrate 14 doped to provide a conductivity type that is opposite to that of the substrate 14A. For example, the conductivity region 114A can comprise N type silicon, while the bulk of the substrate 14A can comprise P type silicon. As such, the conductivity region 114A can be doped with phosphorus or arsenic or any other suitable dopant, while the bulk of the substrate 14A can be doped with boron or gallium or any other suitable dopant. This arrangement allows some latitude in locating the counterbored via 68A-CB because a reverse bias junction is formed by the conductivity region 114A, and an additional insulating layer is not required in the area of the conductivity region 114A. The terminal contact 42A (FIG. 8F) can be formed directly on the conductivity region 114A such that a tolerance equal to the height of the conductivity region 114A is provided for locating the counterbored via 68A-CB.

Figure 8B:
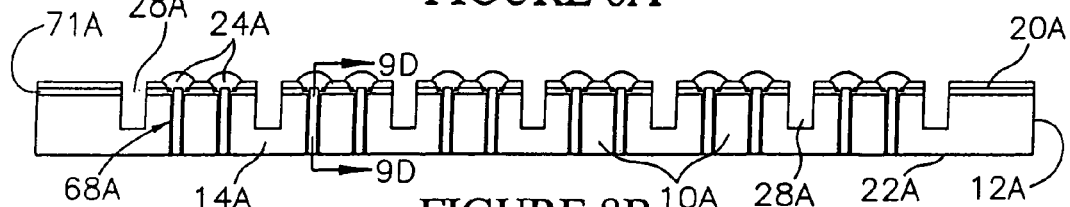

Next, as shown in FIGS. 8B and 9D, contact bumps 24A are formed on the die contacts 18A in electrical communication with the conductive vias 68A. The contact bumps 24A can comprise a solderable metal such as nickel, copper, gold, silver, platinum, palladium or alloys of these metals. These metals can be deposited using an electroless or electrolytic deposition process in a manner similar to deposition of a conventional under bump metalization layer. The contact bumps 24A fill the openings 80A in the insulating layer 64A, fill the openings 82A in the die contacts 18A, and physically contact the conductive members 76A. As will be further explained, the contact bumps 24A can be used to stack multiple components 16A and to provide contact points for testing the components 16A. As also shown in FIG. 8B, trenches 28A are formed part way through the substrate 14A using a scribing, etching or lasering process, substantially as previously described.

Figure 8C:

Next, as shown in FIGS. 8C and 9E, a circuit side polymer layer 36A can be formed on the circuit side 20A and on the contact bumps 24A. The circuit side polymer layer 36A can be formed substantially as previously described for circuit side polymer layer 36 in FIG. 1F.

Figure 8D:
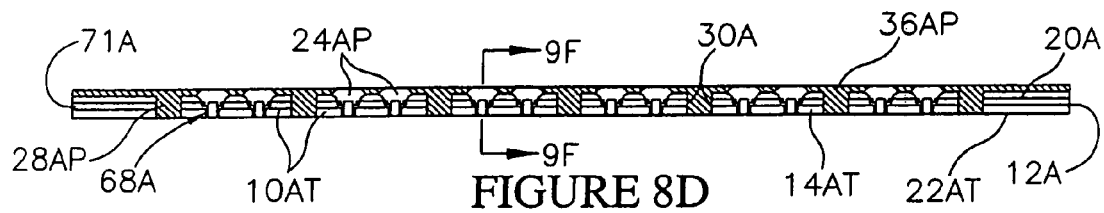
Figure 9F:
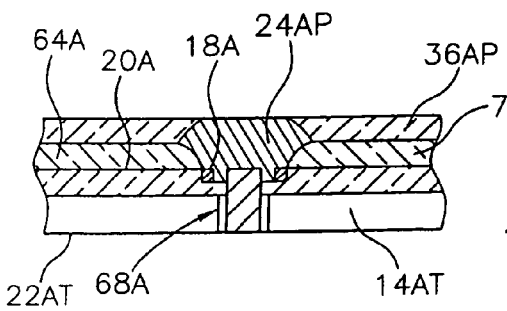
FIG. 9F is an enlarged cross sectional view taken along section line 9F-9F of FIG. 8D illustrating the conductive via, the contact bump, and the circuit side polymer layer following planarization.

Next, as shown in FIGS. 8D and 9F, the circuit side polymer layer 36A and the contact bumps 24A, can be mechanically planarized (ground) to form a planarized circuit side polymer layer 36AP and planarized contact bumps 24AP. This planarization step can be performed substantially as previously described for circuit side polymer layer 36 and planarized contact bumps 24P in FIG. 1G. During the planarization step, the metal material of the contact bumps 24A provides a contact surface for end pointing the planarization process.

As also shown in FIGS. 8D and 9F, a backside thinning step is performed, as previously described and shown in FIG. 1H to form a thinned substrate 14AT having a thinned back side 22AT.

Figure 8E:
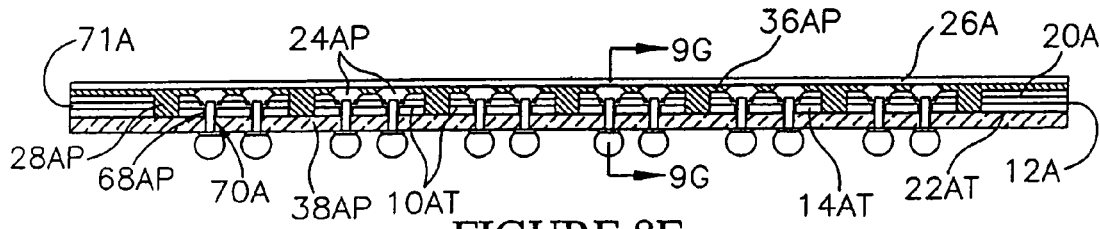
Figure 9G:
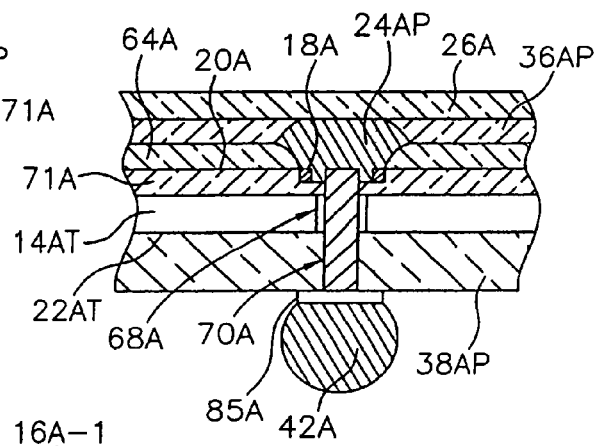
FIG. 9G is an enlarged cross sectional view taken along section line 9G-9G of FIG. 8E illustrating the conductive via, the contact bump, the circuit side polymer layer, a back side polymer layer, and a terminal contact in electrical communication with the conductive via.

Next, as shown in FIGS. 8E and 9G, a planarized back side polymer layer 38AP is formed on the thinned back side 22AT of the thinned substrate 14AT. This step can be formed by depositing a polymer material on the thinned back side 22AT, curing the polymer material, and then mechanically planarizing the cured polymer material, substantially as previously described and shown in FIG. 1I for planarized back side polymer layer 38P. Alternately, the planarized back side polymer layer 38AP can be formed by attaching or laminating a polymer film, such as a polyimide or epoxy tape, having an adhesive surface and a desired thickness to the thinned back side 22AT. In addition, the planarized back side polymer layer 38AP can comprise a polymer film that is opaque to radiation at a selected wavelength. Such an opaque material will prevent damage to the integrated circuits on the thinned substrate 14AT during subsequent processing, such as laser marking with a laser beam at the selected wavelength.

The planarized back side polymer layer 38AP can also comprise a photoimageable polymer material, such as a thick film resist. One such resist comprises a negative tone resist, which is blanket deposited to a desired thickness, exposed, developed and then cured. A suitable resist formulation is sold by Shell Chemical under the trademark "EPON RESIN SU-8". Such a resist can be deposited to a thickness of from about 0.5-20 mils and then built up using successive layers. A conventional resist coating apparatus, such as a spin coater, or a meniscus coater can be used to deposit the resist. The deposited resist can then be "prebaked" at about 95° C. for about 15 minutes and exposed in a desired pattern using a conventional UV aligner with a dose of about 165 mJ/cm². Developing can be accomplished with a solution of PGMEA (propylenglycol-monomethylether-acetate). This can be followed by a hard bake at about 200° C. for about 30 minutes.

As shown in FIG. 9G, the planarized back side polymer layer 38AP includes conductive vias 70A in electrical communication with the conductive vias 68A. The conductive vias 70A can be formed by forming openings in the planarized back side polymer layer 38AP, and then filling this openings with a conductive material substantially as previously described for conductive vias 68A. For example, the openings for the conductive vias 70A can be etched using a photopatterned etch mask and a suitable etchant. Alternately, if the planarized back side polymer layer 38AP comprises a photoimageable material, the openings for the conductive vias 70A can be formed by exposure and development of the photoimageable material. The conductive vias 70A are aligned with, and have a same longitudinal axis as the conductive vias 68A.

As also shown in FIG. 9G, pads 85A can be formed on the conductive vias 70A and the terminal contacts 42A can be bonded to the pads 85A. The pads 85A can be formed using a suitable deposition process, such as electroless plating, electrolytic plating, CVD or stenciling. In addition the pads can be aligned with the conductive vias 70A using an etch mask, such as a photopatterned resist layer.

As also shown in FIGS. 8E and 9G, terminal contacts 42A are formed on the pads 85A. The terminal contacts 42A can be formed substantially as previously described for terminal contacts 42 in FIG. 1J. For example, the terminal contacts 42A can comprise metal bumps deposited on the pads 85A using a suitable deposition process, such as stenciling and reflowing of a solder alloy. As also shown in FIGS. 8E and 9G, a dicing tape 26A can be applied to the planarized circuit side polymer layer 36AP.

Figure 8F:
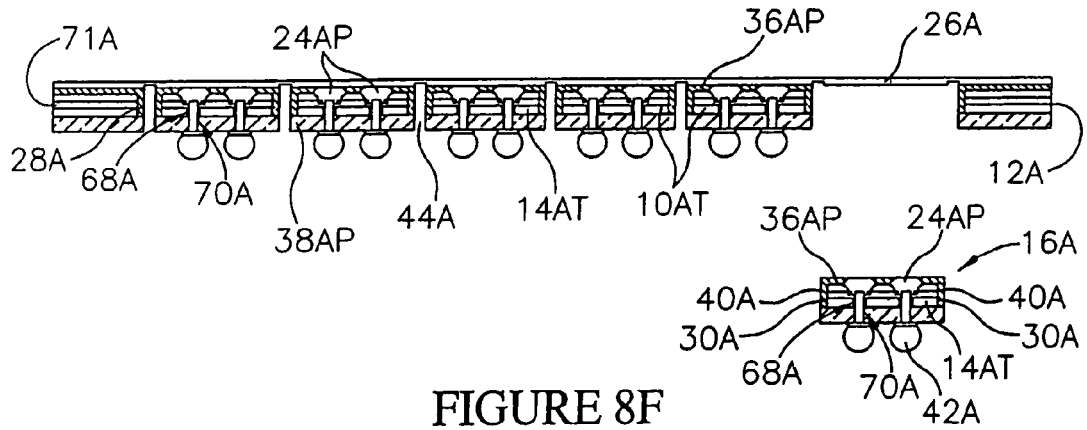

Next, as shown in FIG. 8F, a singulating step is performed to singulate the components 16A from the wafer 12A and from one another. The singulating step can be performed by forming grooves 44A in the polymer filled trenches 28AP substantially as previously described and shown in FIG. 1K. However, in this case the singulating step is performed from the back side 22AT rather than the circuit side 20A.

Figure 10B:
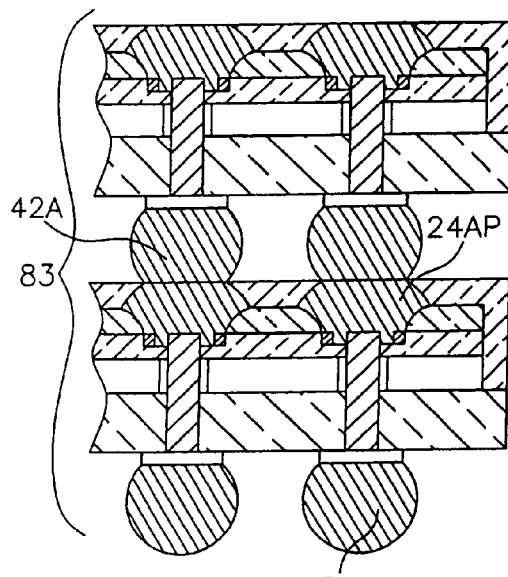
FIG. 10B is an enlarged partial cross sectional view illustrating two second embodiment components in a stacked assembly.
Figure 10A:
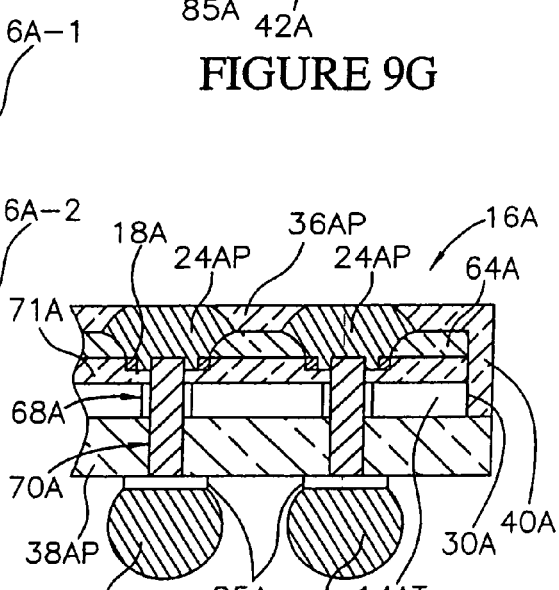
FIG. 10A is an enlarged partial cross sectional view illustrating a second embodiment component fabricated using the fabrication method of FIGS. 8A-8F.

As shown in FIG. 10A, a singulated component 16A includes the thinned die 14AT having the die contacts 18A in electrical communication with the integrated circuits thereon. The component 16A also includes the planarized contact bumps 24AP on the die contacts 18A, and the conductive vias 68A and 70A in electrical communication with the planarized contact bumps 24AP.

In addition, the component 16A includes the planarized circuit side polymer layer 36AP, which covers the circuit side 20A of the thinned die 14AT, and encapsulates the planarized contact bumps 24AP. The component 16A also includes the terminal contacts 42A bonded to the pads 85A in electrical communication with the conductive vias 68A and 70A. The component 16A also includes the planarized back side polymer layer 38AP which covers the thinned back side 22AT of the thinned die 10AT. In addition, the component 16A includes four edge polymer layers 40A which cover the four edges 30A of the thinned die 10AT. The component is thus encapsulated on all six surfaces (6X).

The component 16A can be used to construct systems such as systems in a package and module systems to be hereinafter described. The component 16A can also be used to construct the stacked system 83 shown in FIG. 10B. In this case the terminal contacts 42A on a first component 16A-1 are bonded to the planarized contact bumps 24AP on a second component 16A-2. The stacked system 83 can be mounted to a supporting substrate such as a circuit board, or the module substrate 58 of FIGS. 18B and 18C, using the terminal contacts 42A on the second component 16A-2.

Referring to FIGS. 8G-8H and 9H, an alternate embodiment of the fabrication method illustrated in FIGS. 8A-8F is illustrated. In this embodiment, the conductive vias 70A (FIG. 8E) are replaced by planarized back side contact bumps 25AP (FIG. 9H). The method is initially identical to the method shown in FIGS. 8A-8D. However, as shown in FIG. 8A, pads 87A are formed directly on the thinned back side 22AT of the thinned substrate 14AT in electrical communication with the conductive vias 68A. The pads 87A can be formed of a solderable metal using a suitable deposition process such as photopatterning and etching a deposited metal layer. Back side contact bumps 25A are then formed on the pads 87A substantially as previously described for contact bumps 24 in FIG. 1E.

Next, as shown in FIG. 8H, the planarized back side polymer layer 38AP, and planarized back side contact bumps 25AP are formed, using a mechanical planarization step, (grinding) substantially as previously described for planarized front side polymer layer 36P and planarized contact bumps 24P in FIG. 1H. In addition, terminal contacts 42A are bonded to the planarized back side contact bumps 25AP substantially as previously described for terminal contacts 42 in FIG. 1J.

Next, as shown in FIG. 8I, a singulation step is performed substantially as previously described and shown in FIG. 8F. The completed component 16A' is identical to the previously described component 16A (FIG. 8F), but includes planarized back side contact bumps 25AP rather than conductive vias 70A (FIG. 8F). The component 16A' can also be used to form a stacked system identical to the stacked system 83 of FIG. 10B.

Figure 11A:
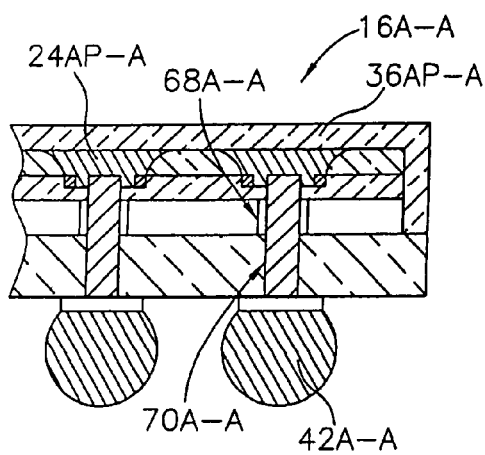
FIG. 11A is an enlarged partial cross sectional view equivalent to FIG. 10A of an alternate embodiment of the second embodiment component having terminal contacts only on the back side polymer layer.

Referring to FIG. 11A, an alternate embodiment component 16A-A is illustrated. The component 16A-A can be constructed substantially as previously described for component 16A (FIG. 10A), with conductive vias 68A-A, 70A-A, in electrical communication with planarized contact bumps 24AP-A and terminal contacts 42A-A. However, a planarized circuit side polymer layer 36AP-A covers and insulates the planarized contact bumps 24AP-A.

Figure 11B:
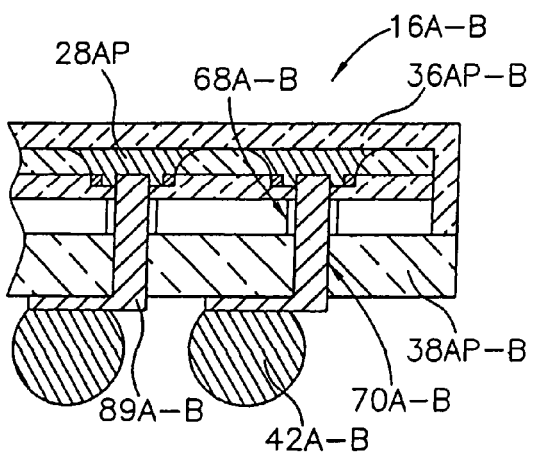
FIG. 11B is an enlarged partial cross sectional view equivalent to FIG. 10A of another alternate embodiment of the second embodiment component having offset terminal contacts.

Referring to FIG. 11B, an alternate embodiment component 16A-B is illustrated. The component 16A-B can be constructed substantially as previously described for component 16A-A (FIG. 11A), with conductive vias 68A-B, 70A-B, in electrical communication with planarized contact bumps 24AP-B and terminal contacts 42A-B. In addition, a planarized circuit side polymer layer 36AP-B covers and insulates the planarized contact bumps 24AP-B. However, the terminal contacts 42A-B are offset with respect to a longitudinal axis of the conductive vias 68A-B, 70A-B. In addition, conductors 89A-B on the planarized back side polymer layer 38AP-B electrically connect the terminal contacts 42A-B to the conductive vias 68A-B, 70A-B. The conductors 89A-B can have a fan out configuration, and the pitch of the terminal contacts 42A-B can be different than the pitch of the conductive vias 68A-B, 70A-B and the planarized contact bumps 24AP-B.

Referring to FIG. 1C, an alternate embodiment component 16A-C is illustrated. The component 16A-C can be constructed substantially as previously described for component 16A-B (FIG. 11B), with conductive vias 68A-C, 70A-C, in electrical communication with planarized contact bumps 24AP-C and conductors 89A-C. However, planar terminal contacts 42A-C are formed on the planarized back side polymer layer 38AP-C in an edge connector configuration, substantially as previously described for terminal contacts 42EC of FIG. 5A.

Figure 11C:
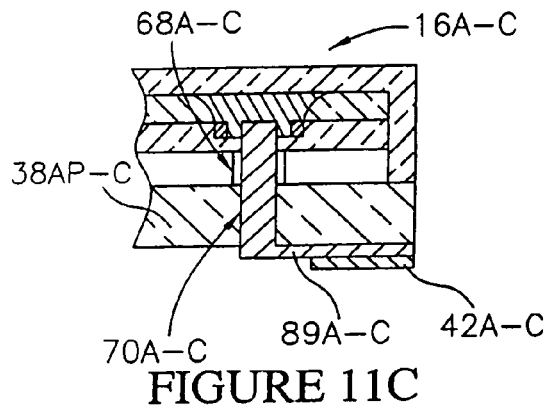
FIG. 11C is an enlarged partial cross sectional view equivalent to FIG. 10A of another alternate embodiment of the second embodiment component having edge connector terminal contacts on the back side polymer layer.
Figure 11D:
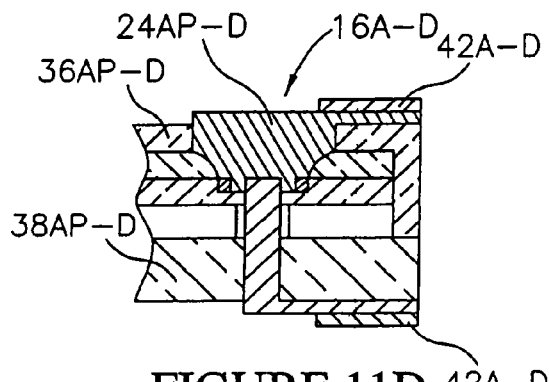
FIG. 11D is an enlarged partial cross sectional view equivalent to FIG. 10A of another alternate embodiment of the second embodiment component having edge connector terminal contacts on both the back side polymer layer and the circuit side polymer layer.

Referring to FIG. 11D, an alternate embodiment component 16A-D is illustrated. The component 16A-D can be constructed substantially as previously described for component 16A-C (FIG. 11C) with planar terminal contacts 42A-D formed on the planarized back side polymer layer 38AP-D in an edge connector configuration. In addition, the planarized contact bumps 24AP-D are in electrical communication with planar terminal contacts 42A-D on the planarized circuit side polymer layer 36AP-D in an edge connector configuration.

Figure 11E:
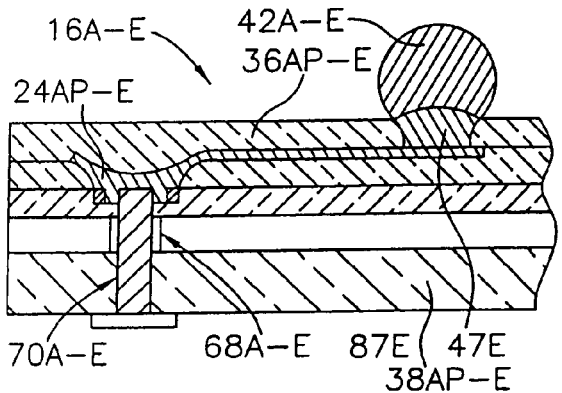
FIG. 11E is an enlarged partial cross sectional view equivalent to FIG. 10A of another alternate embodiment of the second embodiment component having terminal contacts on the circuit side polymer layer.

Referring to FIG. 11E, an alternate embodiment component 16A-E is illustrated. The component 16A-E can be constructed substantially as previously described for component 16A-A (FIG. 11A), with conductive vias 68A-E, 70A-E, in electrical communication with contact bumps 24AP-E and terminal contacts 42A-E. In addition, a planarized circuit side polymer layer 36AP-E covers and insulates the planarized contact bumps 24AP-E. However, the terminal contacts 42A-E are offset with respect to a longitudinal axis of the conductive vias 68A-E, 70A-E. In addition, conductors 87E electrically connect the terminal contacts 42A-E to the conductive vias 68A-E, 70A-E. The conductors 87E are electrically insulated by the planarized circuit side polymer layer 36AP-E. The conductors 87E can have a fan out configuration, and the pitch of the terminal contacts 42A-E can be different than the pitch of the conductive vias 68A-E, 70A-E and the planarized contact bumps 24AP-E. In addition, the terminal contacts 42A-E are bonded to under bump metallization layers 47E on the conductors 89A-E. In this case singulation can be from the circuit side as this surface is more planar than the terminal contacts 42A-E.

Figure 11F:
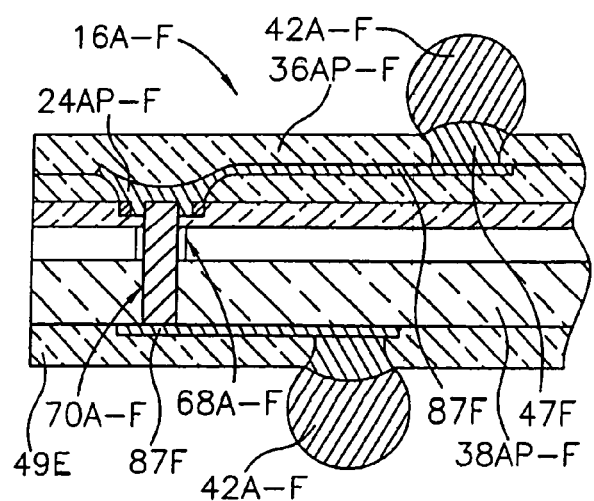
FIG. 11F is an enlarged partial cross sectional view equivalent to FIG. 10A of another alternate embodiment of the second embodiment component having terminal contacts on both the circuit side polymer layer and the back side polymer layer.

Referring to FIG. 11F, an alternate embodiment component 16A-F is illustrated. The component 16A-F can be constructed substantially as previously described for component 16A-A (FIG. 11A), with conductive vias 68A-F, 70A-F, in electrical communication with planarized contact bumps 24AP-F. In addition, a planarized circuit side polymer layer 36AP-F covers and insulates the planarized contact bumps 24AP-F. The component 16A-F also includes terminal contacts 42A-F on opposing sides thereof, including terminal contacts 42A-F on the circuit side polymer layer 36AP-F and terminal contacts 42A-F on the back side polymer layer 38AP-F. Conductors 87F on the opposing side of the component 16A-F electrically connect the terminal contacts 42A-F to the conductive vias 68A-F, 70A-F. In addition, the terminal contacts 42A-F are bonded to under bump metallization layers 47F on the conductors 89A-F. Further an additional insulating layer 49E electrically insulates the conductors 87F on the back side polymer layer 38AP-F.

Figure 12A:
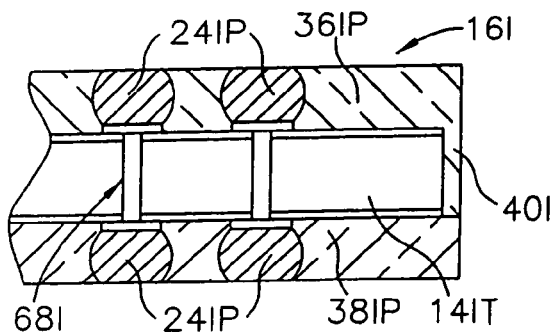
FIG. 12A is an enlarged partial cross sectional view equivalent to FIG. 10A of another alternate embodiment of the second embodiment component configured as an interconnect.

Referring to FIG. 12A, an alternate embodiment component 16I is illustrated. The component 16I is configured as an interconnect for constructing systems such as multi chip modules, and does not contain active semiconductor devices. However, the component 16I can include capacitors, inductors and other electrical devices. The component 16I includes a thinned substrate 14IT, which can comprise a semiconductor material but without active circuitry. In addition, the component 16I includes conductive vias 68I and planarized contact bumps 24IP on opposing side. The thinned substrate 14IT is encapsulated on six surfaces by a planarized circuit side polymer layer 36IP, a planarized back side polymer layer 38IP, and four edge polymer layer 40I. The component 16I can be constructed substantially as previously described for component 16A (FIG. 10A), but with the contact bumps 24IP on opposing sides embedded in the planarized circuit side polymer layer 36IP and in the planarized back side polymer layer 38IP.

Figure 12B:
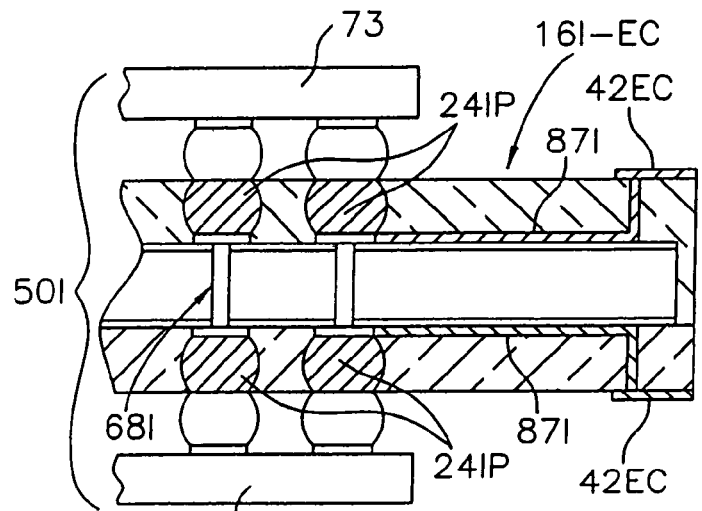
FIG. 12B is an enlarged partial cross sectional view of a stacked system constructed using the interconnect component of FIG. 12A.

Referring to FIG. 12B, a stacked system 83I includes the component 16I and BGA devices 73 flip chip bonded to the planarized contact bumps 24IP on opposing side of the component 16I.

Figure 12C:
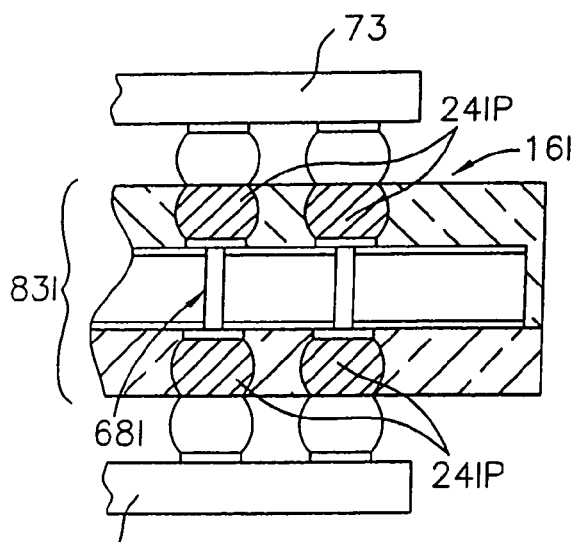
FIG. 12C is an enlarged partial cross sectional view of a module system constructed using an alternate embodiment of the interconnect component of FIG. 12A.

Referring to FIG. 12C, a module system 50I includes a component 16I-EC constructed as an interconnect substantially as previously described for component 16I. However, the component 16I-EC includes terminal contacts 42EC on opposing sides configured as edge connectors, and conductors 87I electrically connecting the terminal contacts 42EC to the planarized contact bumps 24IP. The module system 50I also includes BGA devices 73 flip chip mounted to the planarized contact bumps 24IP.

Referring to FIGS. 13A-13G, steps in a method for fabricating a third embodiment component 16E (FIG. 13F) are illustrated. In this embodiment, the components 16E (FIG. 13F) are singulated using an etching process. In addition, each component 16E (FIG. 13F) is hermetically sealed on five sides, such that a "5X component" is provided.

Initially, as shown in FIG. 13A, a plurality of semiconductor dice 10E are provided on a semiconductor wafer 12E, substantially as previously described. Each die 10E includes a semiconductor substrate 14E containing integrated circuits. In addition, the wafer 12E and each die 10E includes a circuit side 20E (first side) wherein the integrated circuits are located, and a back side 22E (second side). Each die 10E also includes a pattern of die contacts 18E on the circuit side 20E in electrical communication with the integrated circuits thereon. The die contacts 18E can be constructed like the previously described die contacts 18 in FIG. 1A, or like the previously described die contacts 18A in FIG. 8A.

Next, as shown in FIG. 13B, a bump formation step is performed in which contact bumps 24E are formed on the die contacts 18E. The contact bumps 24E can be formed substantially as previously described for contact bumps 24 in FIG. 1H.

Figure 14A:
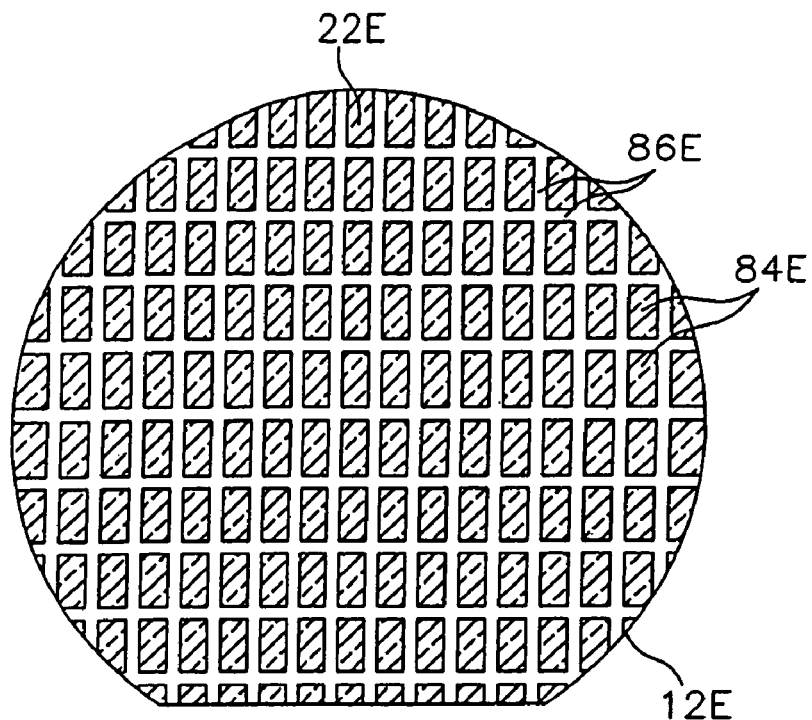
FIG. 14A is a cross sectional view taken along section line 14A-14A of FIG. 13B illustrating an etch mask.

As also shown in FIG. 13B, an etch mask 84E is formed on the back side 22E of the substrate 14E. The etch mask 84E can comprise a material, such as silicon nitride ($Si_3N_4$), formed using a suitable deposition process, such as CVD. In addition, as shown in FIG. 14A, the etch mask 84E includes a criss cross pattern of slots 86E aligned with selected portions of the back side 22E of the substrate 14E. As will be further explained, the etch mask 84E and the slots 86E will subsequently be used for etching the substrate 14E to singulate the dice 10E. The criss cross pattern of the slots 86E substantially matches the criss cross pattern of the streets 13 (FIG. 2A) on the circuit side 20E of the wafer 12E.

Figure 14B:
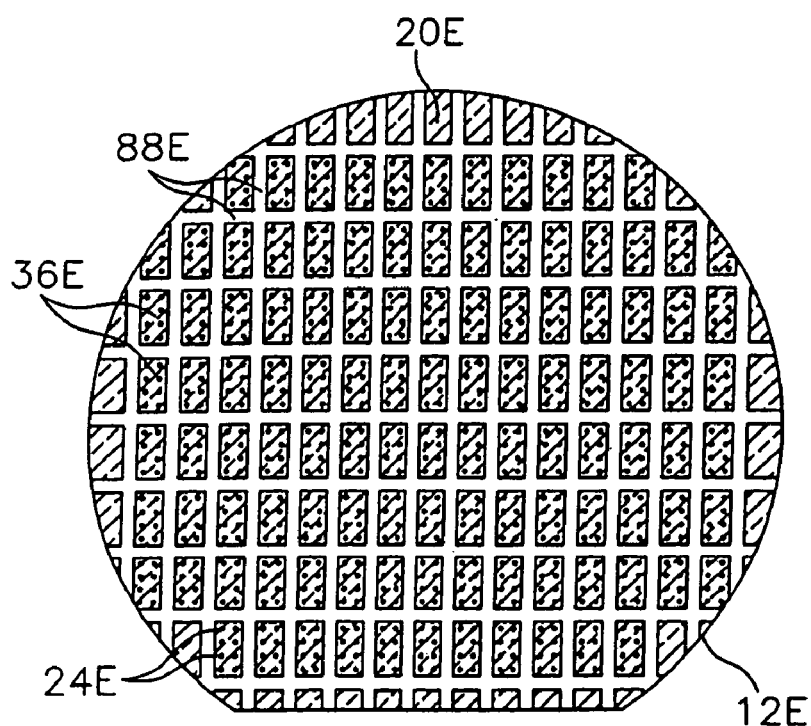
FIG. 14B is a cross sectional view taken along section line 14B-14B of FIG. 13C illustrating a circuit side polymer layer.

Next, as shown in FIG. 13C, a circuit side polymer layer 36E is formed on the circuit side 20E. As shown in FIG. 14B, the circuit side polymer layer 36E includes a criss cross pattern of slots 88E that substantially matches the criss cross pattern of the slots 86E in the etch mask 84E on the back side 22E. As such, the slots 88E substantially align with the streets 13 (FIG. 2A) of the wafer 12E such that each die 10E is surrounded on four sides by slots 88E.

The circuit side polymer layer 36E can comprise a curable polymer material, such as a silicone, a polyimide or an epoxy, as previously described for the circuit side polymer layer 36 of FIG. 1F. In addition, the circuit side polymer layer 36E can be stenciled onto the circuit side 20E in a pattern that forms the slots 88E, and then cured as previously described. Alternately, the circuit side polymer layer 36E can comprise a photoimageable material, such as the previously described thick film resist, blanket deposited on the circuit side 20E, exposed, and then developed with the pattern of slots 88E. As shown in FIG. 13C, the circuit side polymer layer 36E can have a thickness that is greater than the height of the contact bumps 24E. Alternately, the circuit side polymer layer 36E can have a thickness that is less than the height of the contact bumps 24E provided it is thick enough to be subsequently planarized.

Next, as shown in FIG. 13D, a mechanical planarization (grinding) step can be performed to form a planarized circuit side polymer layer 36EP, substantially as previously described for planarized circuit side polymer layer 36P of FIG. 1G. At the same time, the contact bumps 24E are planarized to form planarized contact bumps 24EP.

Next, as shown in FIG. 13E, a dicing tape 26E is attached to the wafer 12E to cover the planarized circuit side polymer layer 36EP, and the planarized contact bumps 24EP. One suitable dicing tape is manufactured by 3M and is designated #NPEITSD0190.

With the dicing tape 26E thereon, the wafer 12E is submerged in a wet etchant, such as a solution of KOH, configured to anisotropically etch the semiconductor substrate 14E. For performing the etch step, the etchant can be contained in a dip tank which circulates the wet etchant around a batch of wafers 12E held in a boat. Such an etch process is described in U.S. Pat. No. 5,904,546 to Wood et al., which is incorporated herein by reference.

During the etch step, the wafer 12E is etched from both the back side 22E and the circuit side 20E at the same time. In particular, grooves 92E are etched in the back side 22E of the wafer 12E in a pattern corresponding to the pattern of the slots 86E in the etch mask 84E. In addition, grooves 94E are etched in the front side 20E of the wafer 12E in a pattern corresponding to the pattern of the slots 88E in the planarized circuit side polymer layer 36EP. The grooves 92E, 94E in the wafer 12E are sloped at an angle of approximately 54° with the horizontal, due to the different etch rates of monocrystalline silicon along the different crystal orientations.

The etch step is performed for a time period sufficient to singulate the dice 10E from the wafer 12E and from one another. In addition, the etch step can be followed by a second etch step in which a less aggressive etchant, such as TMAH, is used to smooth and round the etched surfaces. Following the etch step, the etch mask 84E can be stripped using a suitable stripper. For example, if desired, a solution of $H_3PO_4$ can be used to strip a silicon nitride etch mask 84E.

Also following the etch step, a sealing step is performed. During the sealing step, the dicing tape 26E remains on the circuit side 20E, holding the separated dice 10E and covering the planarized contact bumps 24EP. The sealing step can be performed by coating the wafer 12E in with a sealing chemical that coats the exposed surfaces of the dice 10E, and then hardens to form a sealing layer 90E (FIG. 13G). Because the planarized contact bumps 24EP, and the planarized circuit side polymer layer 36EP are protected by the dicing tape 26E, they are not coated by the sealing chemical.

One suitable chemical for forming the sealing layer 90E comprises parylene. Parylene polymers can be deposited from the vapor phase by a process similar to vacuum metallization at pressures of about 0.1 torr. Suitable polymers include parylene C, parylene N, and parylene D. Parylene is available from Advanced Coating of Tempe, Ariz.

One suitable deposition apparatus for depositing the parylene comprises a portable parylene deposition system, designated a model PDS 2010 LABCOATER 2, manufactured by Specialty Coating Systems, of Indianapolis, Ind.

The parylene uniformly coats all exposed surfaces of the wafer 12E to form the sealing layer 90E. A thickness range for the sealing layer 90E can be from 0.10 to 76 µm or greater. Although the edges of the singulated dice 10E are faceted by the etching step, the sealing layer 90E essentially seals the five major surfaces of the dice 10E (back side and four edges). The completed components 16E are thus hermetically sealed on five surfaces (5X).

Following the sealing step, the dicing tape 26E is removed, and the terminal contacts 42E are formed on the planarized contact bumps 24EP, substantially as previously described for terminal contacts 42 in FIG. 1J.

As shown in FIG. 13F, each component 16E includes a die 10E sealed on five major surfaces by the sealing layer 90E. In addition, each die 10E includes a planarized circuit side polymer layer 36EP, contact bumps 24EP embedded in the planarized circuit side polymer layer 36EP, and terminal contacts 42E on the planarized circuit side polymer layer 36EP.

Although the component 16E is illustrated as having terminal contacts 42E on only the circuit side 20E, it is to be understood that the component 16E can be fabricated with conductive vias substantially as previously described for conductive vias 68A. Accordingly, the component 16E can be configured substantially similar to the component 16A of FIG. 10A, the component 16A-A of FIG. 11A, the component 16A-B of FIG. 11B, the component 16A-C of FIG. 12A, or the component 16A-D of FIG. 12B. In addition, the component 16E rather than having terminal contacts 42E can be formed with an edge connector 43 substantially as shown in FIG. 5B.

Referring to FIGS. 15A-15F, steps in a method for fabricating a fourth embodiment semiconductor component 16-1X (FIG. 15F) are illustrated. The semiconductor component 16-1X (FIG. 15F) contains a single semiconductor die 10-1X encapsulated on only the circuit side thereof, and is thus referred to as a 1X component.

Initially, as shown in FIG. 15A, a plurality of semiconductor dice 10-1X are provided on a semiconductor wafer 12-1X substantially as previously described. Each die 10-1X includes a semiconductor substrate 14-1X containing integrated circuits. In addition, the wafer 12-1X and each die 10-1X includes a circuit side 20-1X (first side) wherein the integrated circuits are located, and a back side 22-1X (second side). Each die 10-1X also includes a pattern of die contacts 18-1X such as redistribution pads or bond pads, on the circuit side 20-1X in electrical communication with the integrated circuits thereon.

Next, as shown in FIG. 15B, contact bumps 24-1X are formed on the die contacts 18-1X substantially as previously described and shown in FIG. 1B for contact bumps 24.

Next, as shown in FIG. 15C, a planarized support dam 34P-1X, a planarized good die dam 32P-1X and a planarized circuit side polymer layer 36P-1X are formed substantially as previously described, and shown in FIGS. 1D, 1E, 1F and 1G. However, there are no recesses (28-FIG. 1C) as the scribing step is not performed.

Next, as shown in FIG. 15D, a thinning step is performed using a mechanical planarization process (grinding) substantially as previously described and shown in FIG. 1H. The thinning step forms thinned dice 10-1X, a thinned substrate 14T-1X and a thinned back side 22-1X.

Next, as shown in FIG. 15E, a backside coat tape 100-1X is attached to the thinned back side 22-1X. The back side coat tape 100-1X provides a surface for laser marking the thinned back side 22-1X. One suitable back side coat tape 100-1X is blue "LINTEC" tape manufactured by Advanced Coating of Tempe, Ariz. This tape is about 3-5 mils thick and provides a blue background for the laser markings. The backside coat tape 100-1X is originally mounted to a backing tape, which is removed. The backside coat tape 100-1X is then cured at a temperature of about 170° C. for about 4 hours. Additionally, the backside coat tape 100-1X can be opaque to the wavelength of the radiation being employed for laser marking such that the integrated circuits on the thinned substrate 14T-1X are protected from radiation damage.

As also shown in FIG. 15E, terminal contacts 42-1X are formed on the planarized contact bumps 24P-1X substantially as described and shown in FIG. 1J for terminal contacts 42. Following forming of the terminal contacts 42-1X, the thinned dice 10T-1X can be burn-in tested while they remain on the thinned wafer 12T-1X.

As shown in FIG. 15G, the back side coat tape 100-1X is then marked with a laser mark 102-1X using a suitable laser marking apparatus.

Next, as shown in FIG. 15F, a singulating step is performed by attaching a dicing tape 26-1X to the back side coat tape 100-1X, and sawing grooves 44-1X through the planarized circuit side polymer layer 36P-1X, the thinned substrate 14T-1X and the back side coat tape 100-1X. The singulating step can be performed using a dicing saw, a laser beam or a water jet substantially as previously described and shown in FIG. 1K.

As shown in FIG. 15F, each component 16-1X includes a thinned die 10T-1X having a thinned semiconductor substrate 14T-1X. In addition, each component 16-1X includes a backside coat tape 100-1X marked with a laser mark 102-1X (FIG. 15G). Each component 16-1X also includes planarized contact bumps 24P-1X, a planarized circuit side polymer layer 36P-1X covering the circuit side 20-1X, and terminal contacts 42-1X on the planarized contact bumps 24P-1X.

Because the components 16-1X have been tested and burned-in they can be used without further testing to construct packages in a system, module systems and other systems as well.

Figure 16:
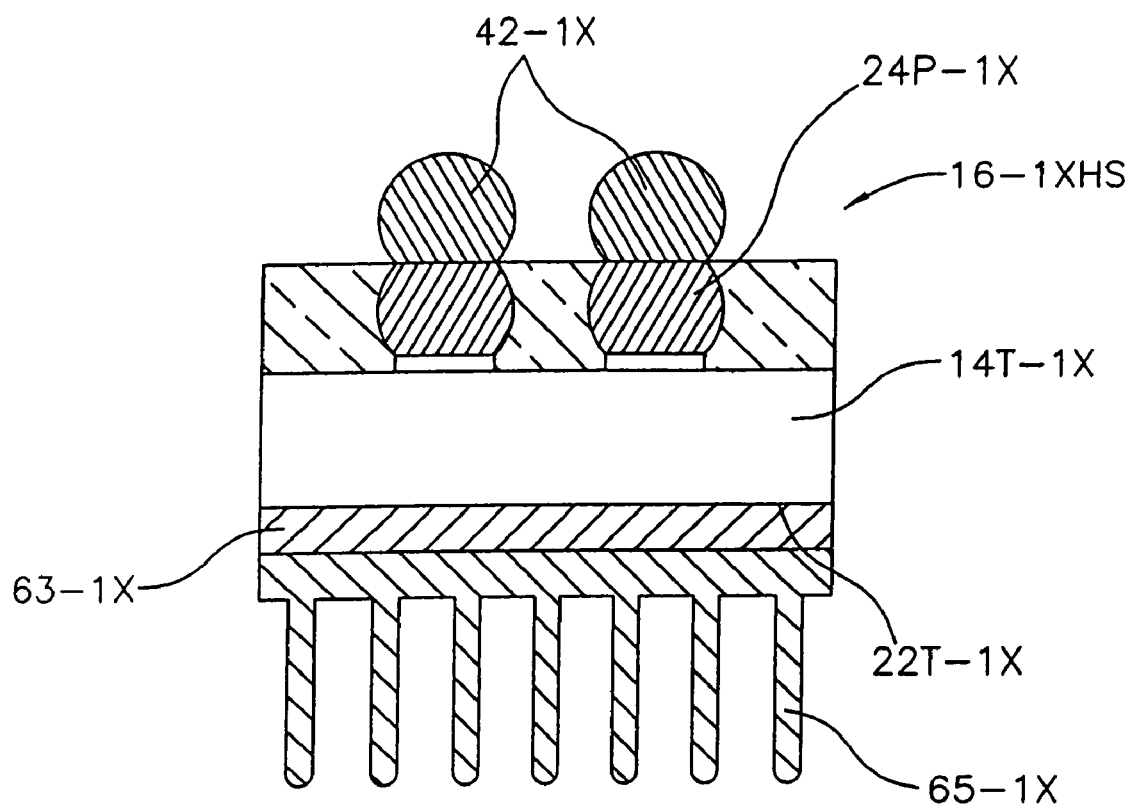
FIG. 16 is a schematic cross sectional view of an alternate embodiment of the fourth embodiment semiconductor component having a heat sink.

The components 16-1X can also be fabricated without the back side coat tape 100-1X but with a heat sink attached directly to the thinned back side 22T-1X. As shown in FIG. 16, a component 16-1XHS includes a heat sink 65-1X attached directly to the thinned back side 22T-1X of the thinned substrate 14T-1X using a thermally conductive polymer 63-1X. Improved heat transfer is provided because the thermally conductive polymer 63-1X are in direct contact with the thinned substrate 14T-1X.

Figure 17A:
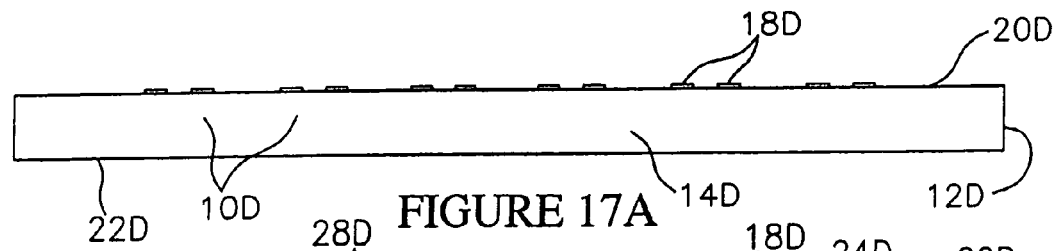
FIGS. 17A-17I are schematic cross sectional views illustrating steps in a method for fabricating a fifth embodiment semiconductor component.

Referring to FIGS. 17A-17J, steps in a method for fabricating a fifth embodiment component 16D (FIG. 17J) are illustrated. Initially, as shown in FIG. 17A, a plurality of semiconductor dice 10D are provided on a semiconductor wafer 12D substantially as previously described. Each die 10D includes a semiconductor substrate 14D containing integrated circuits. In addition, the wafer 12D and each die 10D includes a circuit side 20D (first side) wherein the integrated circuits are located, and a back side 22D (second side). Each die 10D also includes a pattern of die contacts 18D such as redistribution pads or bond pads, on the circuit side 20D in electrical communication with the integrated circuits thereon.

Figure 17B:
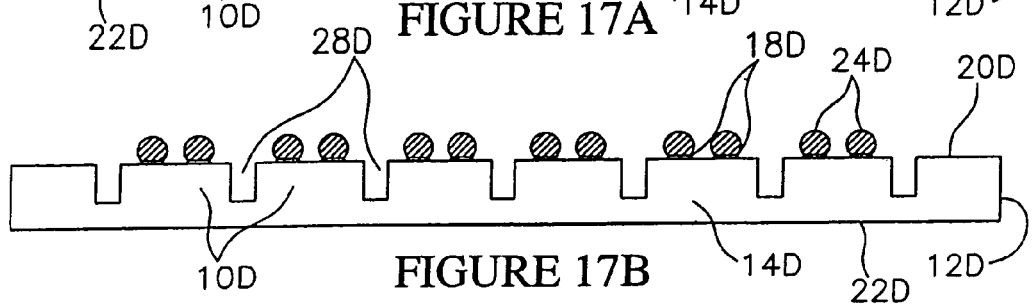

Next, as shown in FIG. 17B, contact bumps 24D are formed on the die contacts 18D, substantially as previously described and shown in FIG. 1B for the contacts bumps 24. As also shown in FIG. 17B, trenches 28D are formed in the substrate 14D using a scribing process, substantially as previously described and shown in FIG. 1C for trenches 28.

Figure 17C:
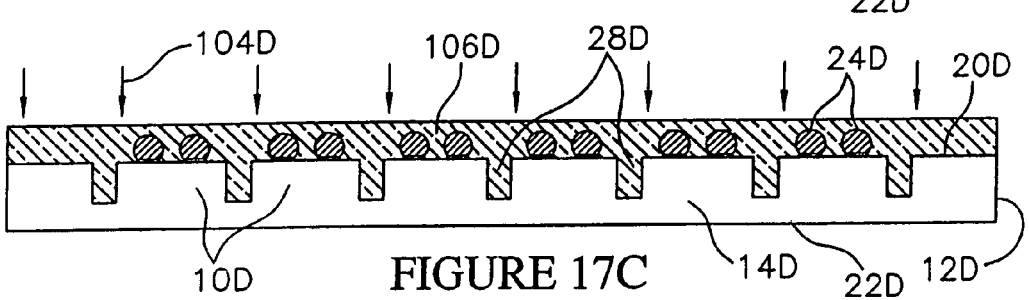

Next, as shown in FIG. 17C an imageable polymer material 106D is deposited on the circuit side 20D, on the contact bumps 24D, and in the trenches 28D. The imageable polymer material 106D can comprise a thick film resist such as the previously described "EPON RESIN SU-8". In this case the polymer material 106D can be patterned using an exposure energy 104D such as UV light, and then developed such that it remains on only selected portions of the substrate 14D.

Alternately the imageable polymer material 106D can comprise a laser imageable material, such as a Cibatool SL 5530 resin manufactured by Ciba Specialty Chemicals Corporation. In this case, the imageable polymer material 106D can be patterned and developed using a laser beam to provide the exposure energy 104D. A stereo lithography system for performing the process is available from 3D Systems, Inc. of Valencia, Calif. In addition, a stereographic lithographic process (3-D) is described in U.S. application Ser. No. 09/259,142, to Farnworth et al. filed on Feb. 26, 1999, and in U.S. application Ser. No. 09/652,340, to Farnworth et al. filed on Aug. 31, 2000, both of which are incorporated herein by reference.

Figure 17D:
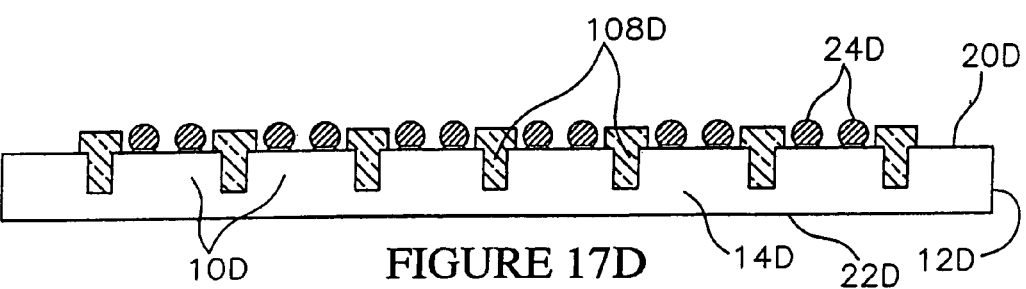

As shown in FIG. 17D, development of the imageable material 106D forms polymer dams 108D on the circuit side 20D and in the trenches 28D. The polymer dams 108D are located essentially on the streets 13 (FIG. 2A) of the wafer 12D in a criss cross pattern similar to the pattern of the polymer filled recesses 28P in FIG. 2H.

Figure 17E:
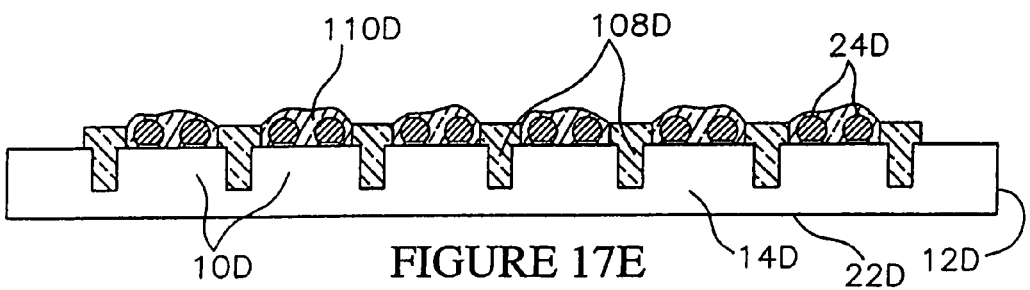

Next, as shown in FIG. 17E, a polymer material 110D having characteristics tailored for a particular application, is deposited on the circuit side 20D. For example, the polymer material 110D can be configured with certain electrical characteristics such as a desired dielectric constant, volume resistivity or surface resistivity. Similarly, the polymer material 110D can be configured with certain physical characteristics such as appearance, color, viscosity, filler content and curing properties.

The polymer material 110D can comprise a curable polymer such as a silicone, polyimide or epoxy. In addition, these materials can include fillers such as silicates configured to adjust the coefficient of thermal expansion (CTE) and the viscosity of the polymer material. One suitable curable polymer material is manufactured by Dexter Electronic Materials of Rocky Hill, Conn. under the trademark "HYSOL" FP4450.

Figure 17F:
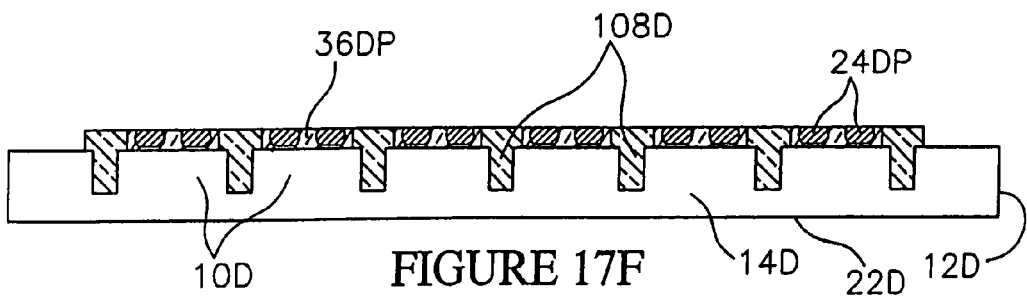

Next, as shown in FIG. 17F, the polymer material 110D and the contact bumps 24 are mechanically planarized to form a planarized circuit side polymer material 36DP and planarized contact bumps 24DP. This step can be performed using a mechanical planarization process (grinding) substantially as previously described and shown in FIG. 1G for layer 36P.

Figure 17G:
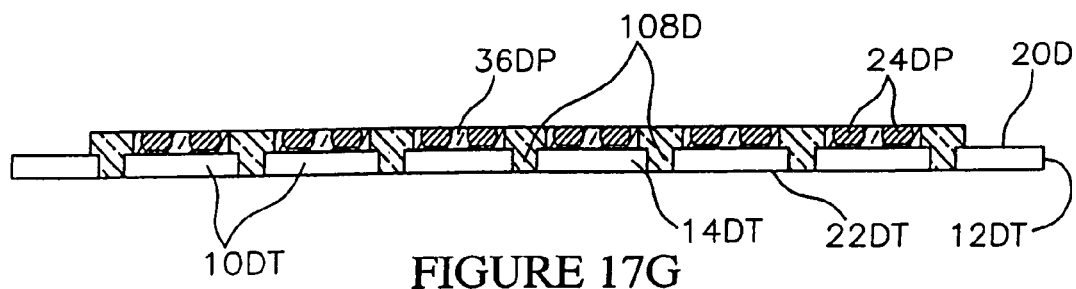

Next, as shown in FIG. 17G, the substrate 14D can be thinned to form a thinned substrate 14DT. The thinning step can be performed using a back side mechanical planarization step substantially as previously described and shown in FIG. 1H for thinned substrate 14T.

Figure 17H:
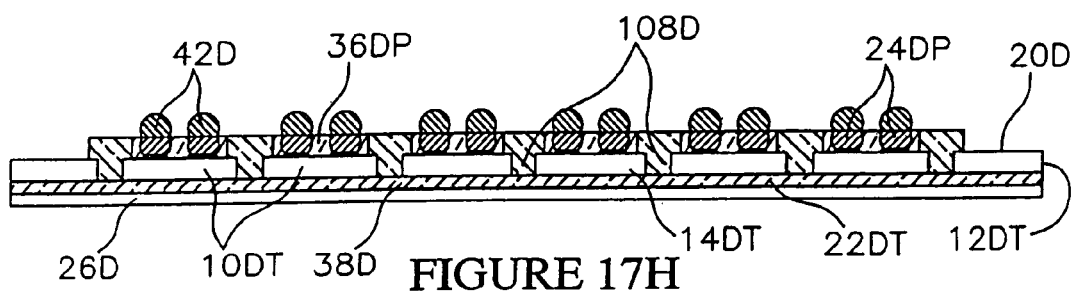

Next, as shown in FIG. 17H, terminal contacts 42D are formed on the planarized contact bumps 24DP substantially as previously described and shown in FIG. 1J for terminal contacts 42. In addition, a back side polymer layer 38D is formed on the thinned back side 22DT. The back side polymer layer 38D can comprise a planarized tape such as the previously identified polymer tape manufactured by Lintec designated #LE 5950. As another alternative, the back side polymer layer 38D can be formed by an injection molding, or a transfer molding process. As yet another alternative, the back side polymer layer 38D can comprise a cured and planarized polymer substantially as previously described for back side polymer layer 38P in FIG. 1I.

Figure 17I:
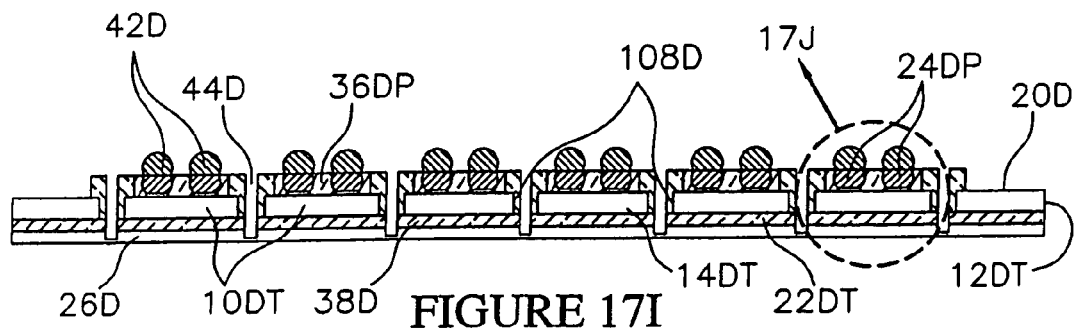
Figure 17J:
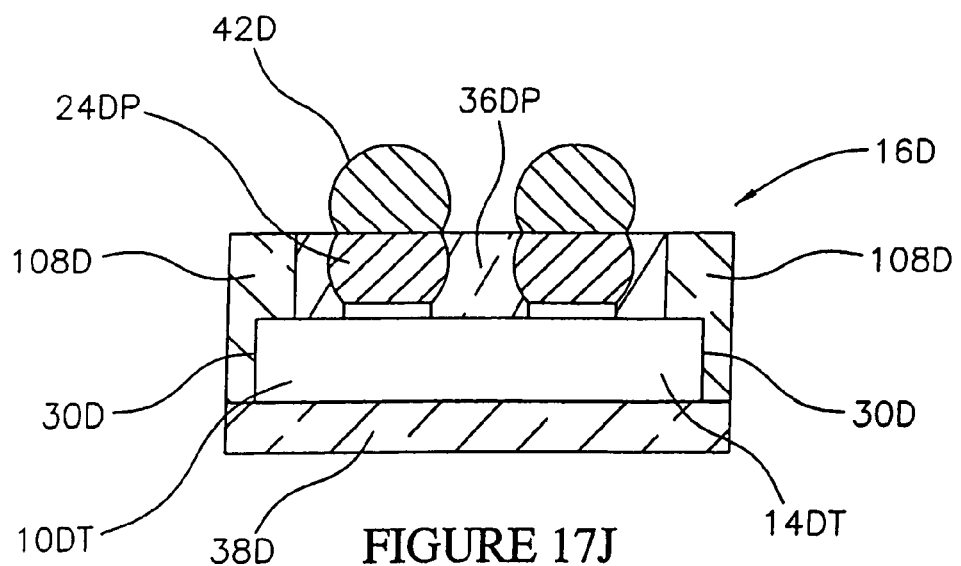
FIG. 17J is an enlarged portion of FIG. 17I, taken along section line 17J, illustrating the fifth embodiment component.

Next, as shown in FIG. 17I, a singulating step is performed by attaching the thinned wafer 12DT to a dicing tape 26D and sawing grooves 44D through the polymer dams 108D, substantially as previously described and shown in FIG. 1K for grooves 44. AS shown in FIG. 17J, the completed component 16D includes a thinned die 10DT encapsulated on six surfaces. In particular a back side polymer layer 38D encapsulates the thinned back side 22DT, a planarized circuit side polymer layer 36DP encapsulates the planarized contact bumps 24DP and the circuit side 20D. In addition, portions of the polymer dams 108D encapsulate the edges 30D of the thinned die 10DT.

Figure 18A:
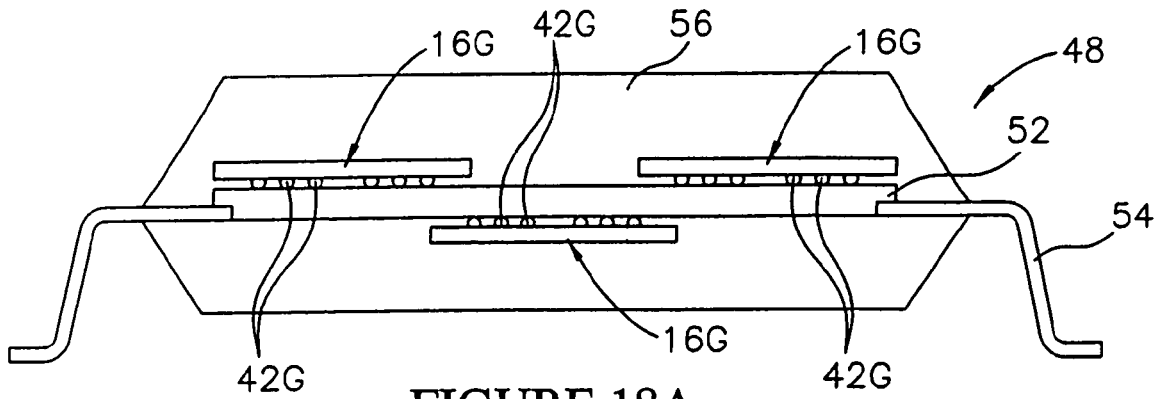
FIG. 18A is a schematic cross sectional view of a system in a package (SIP) fabricated using components constructed in accordance with the invention.
Figure 18B:
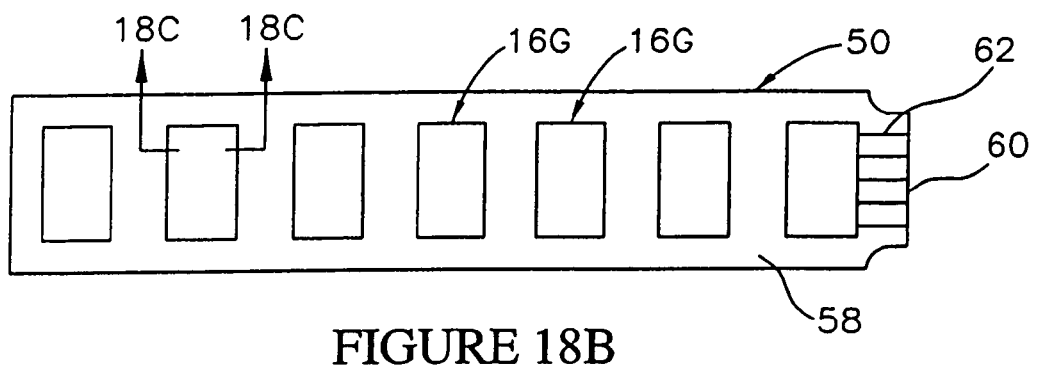
FIG. 18B is a plan view of a multi chip module system fabricated using components constructed in accordance with the invention.
Figure 18C:
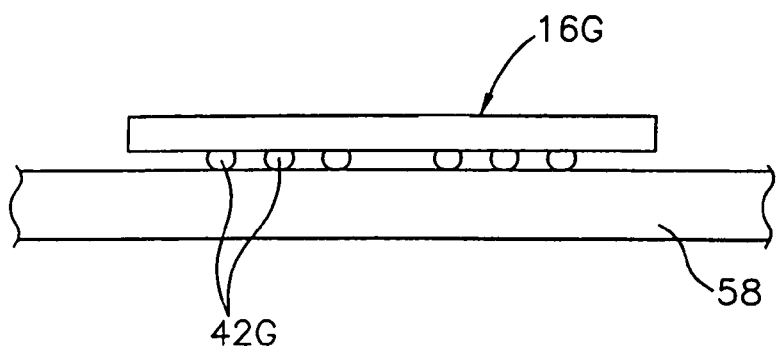
FIG. 18C is a cross sectional view taken along section line 18C-18C of FIG. 18B.

Referring to FIGS. 18A-18C, electronic systems constructed using components fabricated in accordance with the invention are illustrated. In FIGS. 18A-18C a generic component 16G can comprise any one of the previously described components 16, 16EC, 16-5X, 16HS, 16A, 16A', 16A-A, 16A-B, 16A-C, 16A-D, 16I, 16E, 16I-S, 16-1XHS or 16D. In addition, the generic component 16G can comprise the stacked system 83 of FIG. 10B.

In FIG. 18A, a system in a package (SIP) 48 is constructed with one or more components 16G. This type of package is also referred to as a multi chip module MCM package. The system in a package (SIP) 48 can be configured to perform a desired function such as micro processing. The system in a package (SIP) 48 includes a substrate 52 having terminal leads 54. The components 16G can be flip chip mounted, or alternately edge connect mounted, to the substrate 52, with the terminal contacts 42G thereon in electrical communication with the terminal leads 54. The system in a package (SIP) 48 also includes a package body 56 encapsulating the components 16G and the substrate 52.

Referring to FIGS. 18B and 18C, a multi chip module system 50 constructed with one or more components 16G is illustrated. The multi chip module system 50 includes a module substrate 58 having an edge connector 60, and a plurality of conductors 62 in electrical communication with the edge connector 60. The components 16G can be flip chip mounted, or alternately edge connect mounted, to the module substrate 58, with the terminal contacts 42 thereon in electrical communication with the conductors 62.

One advantage of the system in a package (SIP) 48, and the multi chip module system 50, is that the components 16G have optionally been tested and burned-in at the wafer level. If wafer level burn-in has been performed, the components have been certified as known good components (KGC).

Referring to FIGS. 19A-19G and 20A-20F, steps in a method for fabricating a sixth embodiment semiconductor component 16PGA (FIG. 19G) are illustrated. The component 16PGA includes terminal contacts 42PGA (FIG. 19G) which comprise pins in a micro pin grid array (PGA), and is thus referred to as a pin grid array component.

Figure 19A:
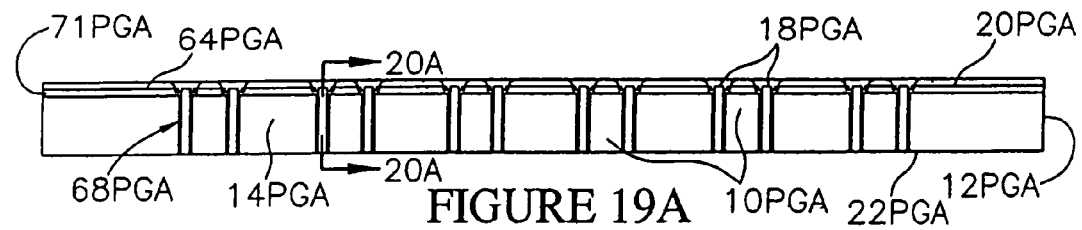
FIGS. 19A-19F are schematic cross sectional views illustrating steps in a method for fabricating a sixth embodiment semiconductor component.

Initially, as shown in FIG. 19A, a plurality of semiconductor dice 10PGA are provided on a semiconductor wafer 12PGA substantially as previously described. Each die 10PGA includes a semiconductor substrate 14PGA containing integrated circuits. In addition, the wafer 12PGA and each die 10PGA includes a circuit side 20PGA (first side) wherein the integrated circuits are located, and a back side 22PGA (second side).

Figure 20A:
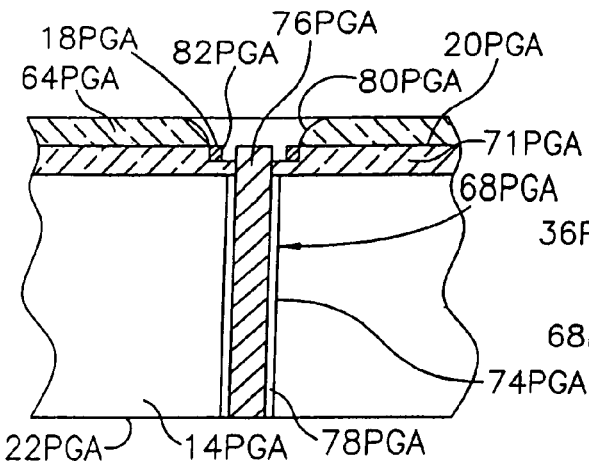
FIG. 20A is a cross sectional view taken along section line 20A-20A of FIG. 19A.

Each die 10PGA also includes a pattern of die contacts 18PGA in the form of bond pads on the circuit side 20PGA, in electrical communication with the integrated circuits thereon. As shown in FIG. 20A, the die contacts 18PGA are embedded in an insulating layer 64PGA having openings 80PGA aligned with the die contacts 18PGA. The insulating layer 64PGA can comprise a glass such as BPSG, an oxide such as silicon dioxide, or a polymer layer such as polyimide. In addition, a dielectric layer 71PGA electrically insulates the die contacts 18PGA from the bulk of the substrate 14PGA, and from the integrated circuits on the substrate 14PGA. The dielectric layer 71PGA can comprise an electrically insulating material such as silicon dioxide, or polyimide, formed during fabrication of the wafer 12PGA. In addition, the dielectric layer 71PGA rather than being blanket deposited, can be located or can have a shape (e.g., donut shape) that insulates only selected portions of the substrate 14PGA.

As shown in FIG. 20A, conductive vias 68PGA are formed through the die contacts 18PGA, and through the semiconductor substrate 14PGA, and extend from the circuit side 20PGA to the back side 22PGA of the dice 10PGA. As also shown in FIG. 20A, each conductive via 68PGA includes a via 74PGA formed in the substrate 14PGA, a conductive member 76PGA in the via 74PGA, and an insulating layer 78PGA which electrically insulates the conductive member 76PGA from the bulk of the substrate 14PGA. The conductive vias 68PGA can be formed substantially as previously described for conductive vias 68A of FIG. 9B, by forming an opening 82PGA in the die contacts 18PGA, laser machining the vias 74PGA, forming the insulating layers 78PGA, and then filling the vias 74PGA with the conductive members 76PGA.

Figure 19B:
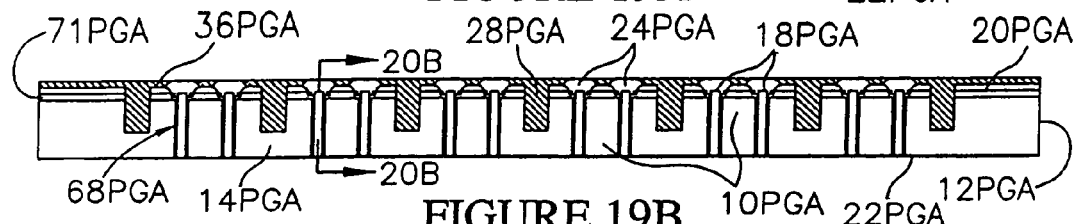
Figure 20B:
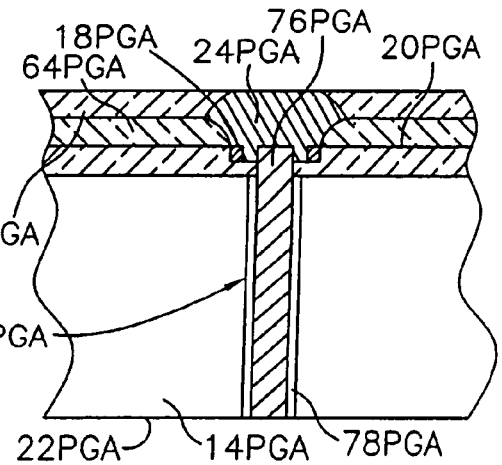
FIG. 20B is a cross sectional view taken along section line 20B-20B of FIG. 19B.

Next, as shown in FIGS. 19B and 20B, planarized contact bumps 24A are formed on the die contacts 18PGA in electrical communication with the conductive vias 68PGA. The contact bumps 24PGA can be formed substantially as previously described for the contact bumps 24PGA in FIG. 8A. As also shown in FIG. 19B, polymer filled trenches 28PGA are formed part way through the substrate 14PGA using a scribing, etching or lasering process, followed by filling with a polymer substantially as previously described for polymer filled trenches 28AP in FIG. 8C. In addition, a circuit side polymer layer 36PGA can be formed on the circuit side 20PGA and on the contact bumps 24PGA. The circuit side polymer layer 36PGA can be formed substantially as previously described for circuit side polymer layer 36AP in FIG. 9F.

Figure 19C:
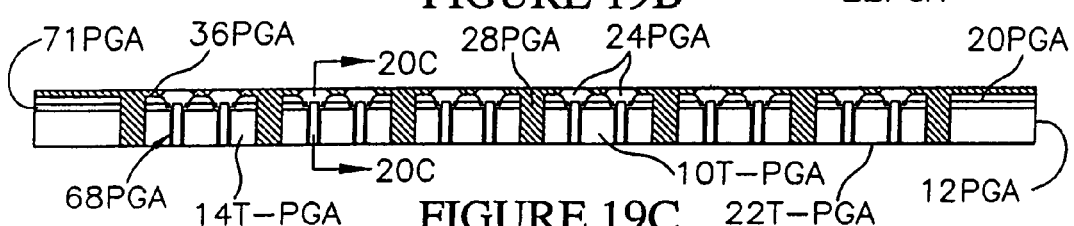
Figure 20C:
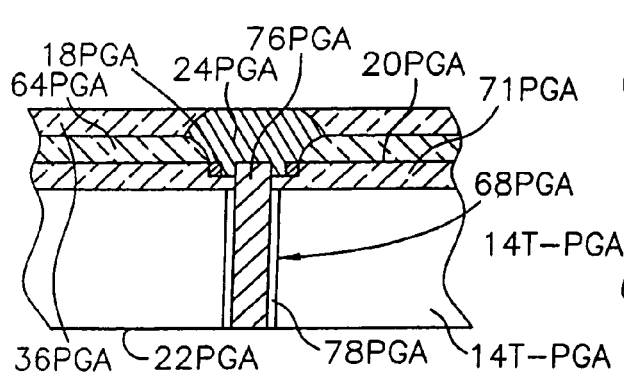
FIG. 20C is a cross sectional view taken along section line 20C-20C of FIG. 19C.

Next, as shown in FIGS. 19C and 20C, a backside thinning step is performed, as previously described and shown in FIG. 1H to form a thinned back side 22T-PGA, a thinned substrate 14T-PGA and thinned dice 10T-PGA.

Figure 19D:
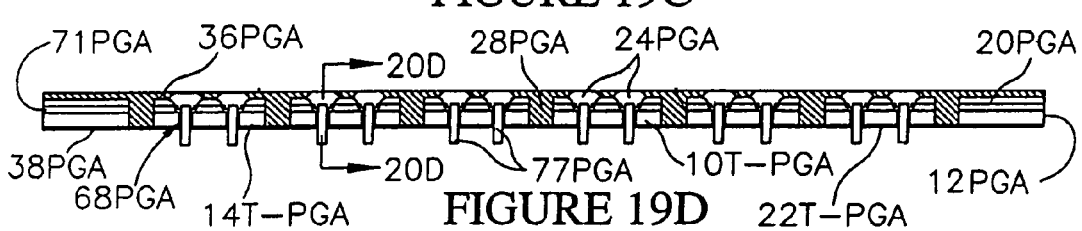
Figure 20D:
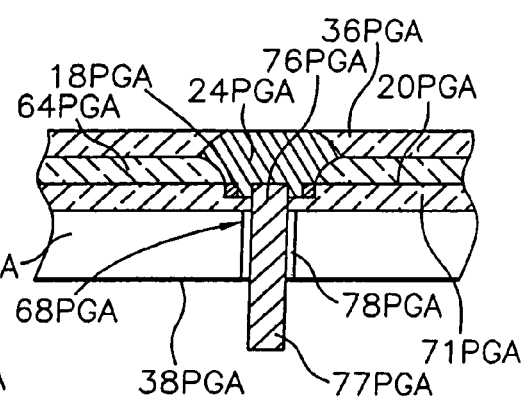
FIG. 20D is a cross sectional view taken along section line 20D-20D of FIG. 19D.

Next, as shown in FIGS. 19D and 20D, an etch back step is performed to further thin the thinned substrate 14T-PGA and to expose portions of the conductive members 76PGA. The exposed portions of the conductive members 76PGA form conductive pins 77PGA having a pitch that exactly matches the pitch of the die contacts 18PGA. This pitch can be made as small as about 2 μm using the above described laser machining processes. In addition, the conductive pins 77PGA can be arranged in a dense grid array to form a micro pin grid array (MPGA). The etch back step can be performed using a wet etching process, a dry etching process or a plasma etching process such as reactive ion etching. In addition to removing portions of the thinned substrate 14T-PGA and exposing portions of the conductive members 76PGA, the etch back step can also remove corresponding portions of the insulating layers 78PGA of the conductive vias 68PGA.

As also shown in FIGS. 19D and 20D, a back side polymer layer 38PGA is formed on the thinned substrate 14T-PGA. The back side polymer layer 38PGA can comprise a layer of parylene, which is vapor deposited substantially as previously described for seal layer 90E in FIG. 13G. During vapor deposition of the parylene, the conductive pins 77PGA can be protected using tape as previously described. Alternately, the conductive pins 77PGA can be coated with parylene which is can be subsequently stripped using a suitable stripper.

Figure 19E:
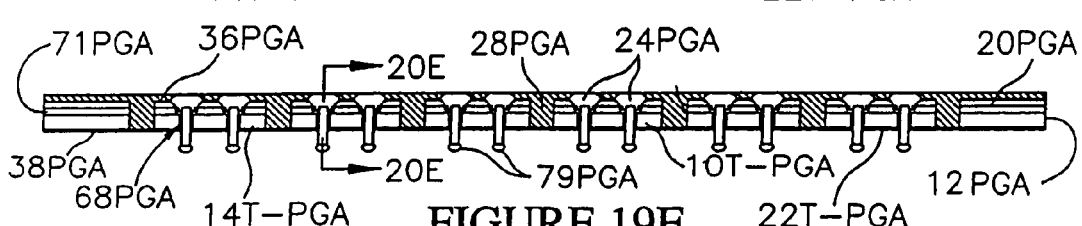
Figure 20E:
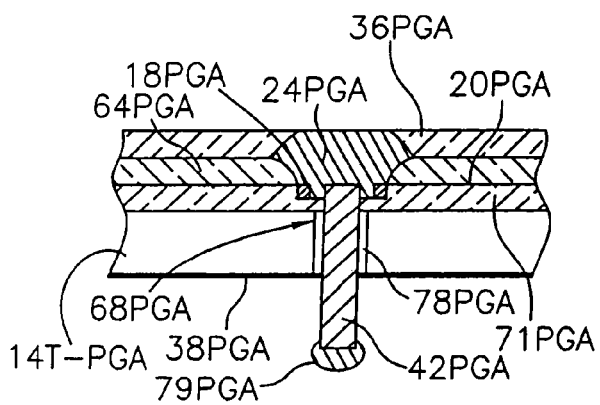
FIG. 20E is a cross sectional view taken along section line 20E-20E of FIG. 19E.

Next, as shown in FIGS. 19E and 20E, non-oxidizing layers 79PGA can be formed on the tips of the conductive pins 77PGA. The non-oxidizing layer 79PGA can comprise a non-oxidizing metal or metal alloy such as gold, a gold/nickel alloy or platinum. In addition, the non-oxidizing layers 79PGA can comprise bulbs that just coat the tips of the conductive pins 77PGA, or alternately can cover all exposed surfaces thereof (not shown). The non-oxidizing layers 79PGA can be formed using a deposition or plating process, such as electroless deposition, electrolytic deposition or CVD. The plated pins 77PGA form the terminal contacts 42PGA for the components 16PGA.

Figure 19F:
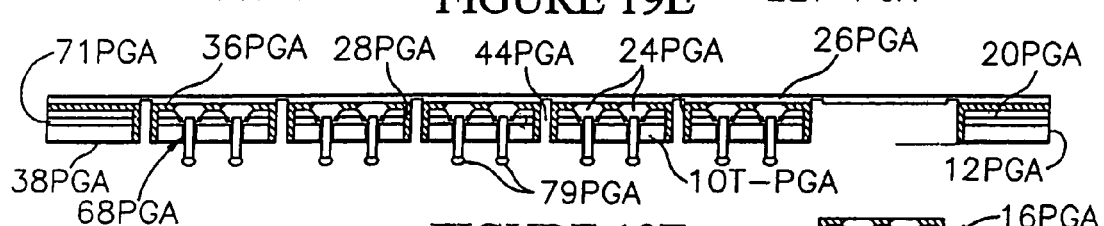
Figure 19G:
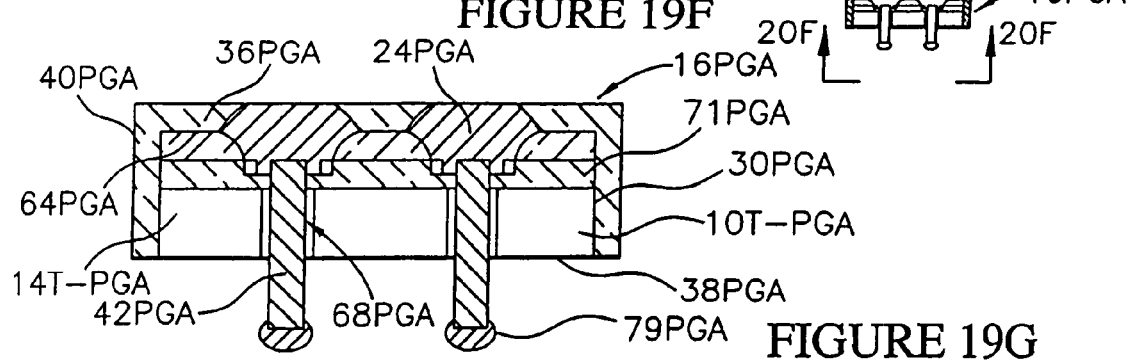
FIG. 19G is an enlarged portion of FIG. 19F illustrating the completed sixth embodiment semiconductor component.
Figure 20F:
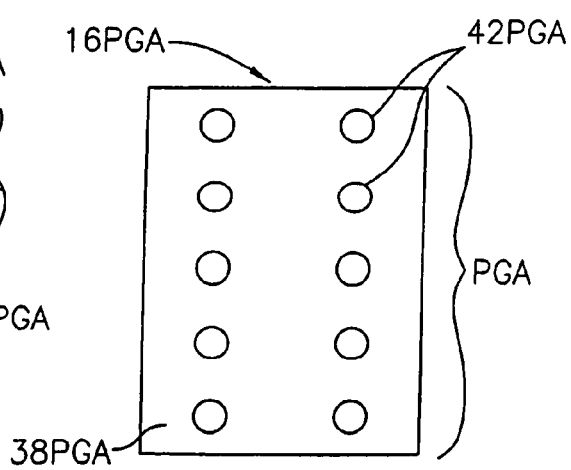
FIG. 20F is a view taken along line 20F-20F of FIG. 19F.

Next, as shown in FIGS. 19F and 20F, a singulating step is performed using dicing tape 26PGA substantially as previously described to singulate the components 16PGA from the wafer 12PGA and from one another. The singulating step can be performed by forming grooves 44PGA in the polymer filled trenches 28PGA substantially as previously described and shown in FIG. 1K. As shown in FIG. 19G, a singulated component 16PGA includes the thinned die 14T-PGA having the die contacts 18PGA in electrical communication with the integrated circuits thereon. The component 16PGA also includes the planarized contact bumps 24PGA on the die contacts 18PGA, and the conductive vias 68PGA in electrical communication with the planarized contact bumps 24PGA.

In addition, the component 16PGA includes the circuit side polymer layer 36PGA, which covers the circuit side 20PGA of the thinned die 14T-PGA, and encapsulates the planarized contact bumps 24PGA. The component 16PGA also includes the terminal contacts 42PGA in electrical communication with the conductive vias 68PGA, and configured as pins in a micro pin grid array (MPGA). The component 16PGA also includes the back side polymer layer 38PGA which covers the thinned back side 22T-PGA of the thinned die 10T-PGA. In addition, the component 16PGA includes four edge polymer layers 40PGA which cover the four edges 30PGA of the thinned die 10T-PGA. The component 16PGA is thus encapsulated on all six surfaces (6X). In addition, the component 16PGA is particularly suited to systems that employ pin type sockets.

Figure 21A:
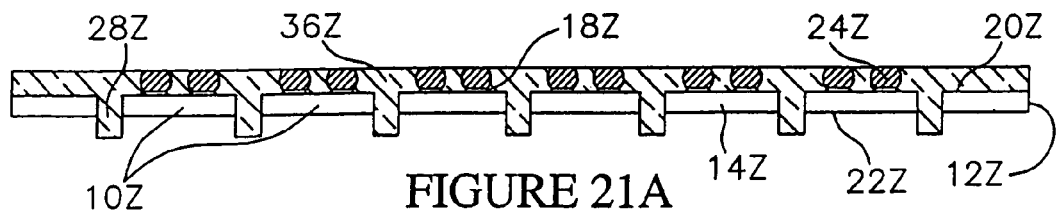
FIGS. 21A-21E are schematic cross sectional views illustrating steps in a method for fabricating a seventh embodiment semiconductor component.
Figure 21B:
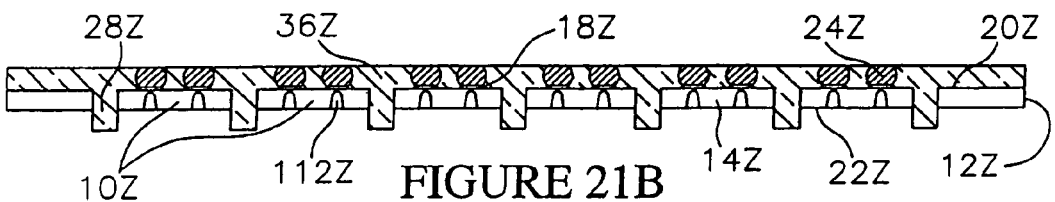
Figure 21C:
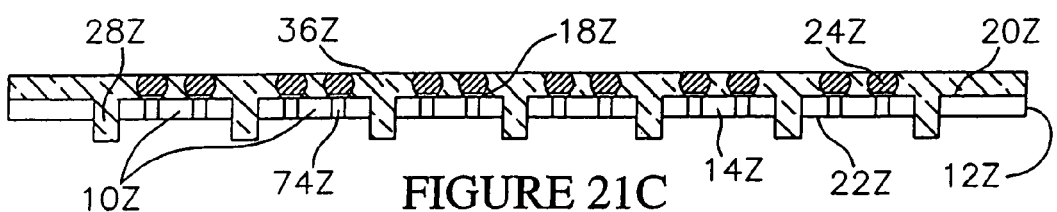
Figure 21D:
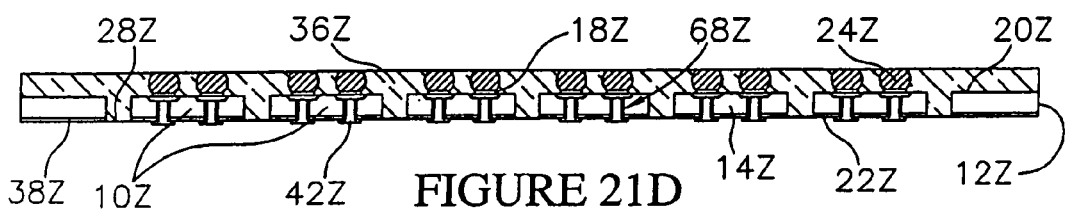
Figure 21E:
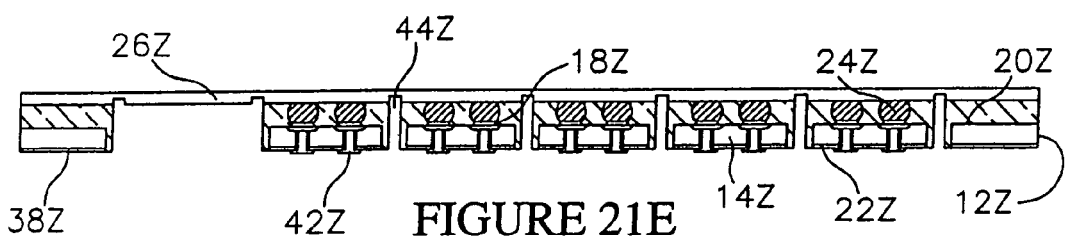
Figure 21F:
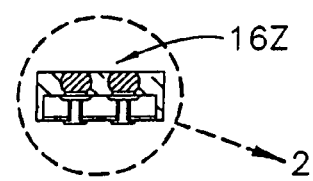
FIG. 21F is an enlarged portion of FIG. 21E illustrating the completed seventh embodiment semiconductor component.

Referring to FIGS. 21A-21F, steps in a method for fabricating a seventh embodiment semiconductor component 16Z (FIG. 21F) are illustrated. Initially, as shown in FIG. 21F, a plurality of semiconductor dice 10Z are provided on a semiconductor wafer 12Z substantially as previously described. Each die 10Z includes a semiconductor substrate 14Z containing integrated circuits. In addition, the wafer 12Z and each die 10Z includes a circuit side 20Z (first side) wherein the integrated circuits are located, and a back side 22Z (second side). Each die 10Z also includes a pattern of die contacts 18Z in the form of bond pads on the circuit side 20Z, in electrical communication with the integrated circuits thereon. The die contacts 18Z can be electrically insulated from the substrate 14Z by insulating layers, substantially as previously described for die contacts 18PGA. However, for simplicity these insulating layers are not shown.

As also shown in FIG. 21A, planarized contact bumps 24Z have been formed on the die contacts 18Z, and a planarized circuit side polymer layer 36Z has been formed on the contact bumps 24Z. The contact bumps 24Z and the circuit side polymer layer 36Z can be formed substantially as previously described and shown in FIG. 1I, for contact bumps 24P and circuit side polymer layer 36P.

As also shown in FIG. 21A, the substrate 14Z includes conductivity regions 114Z subjacent to the die contacts 18Z. The conductivity regions 114Z can comprise portions of the substrate 14Z that are doped to provide a conductivity type that is opposite to that of the substrate 14Z. For example, the conductivity regions 114Z can comprise N− type silicon, while the bulk of the substrate 14Z comprises P+ type silicon. As such, the conductivity regions 114Z can be doped with phosphorus or arsenic, while the bulk of the substrate 14Z can be doped with boron or gallium.

As also shown in FIG. 21A, the dice 10Z and the substrate 14Z have been thinned using an etch back process, substantially as previously described for thinned substrate 14T-E of FIG. 1L, using a wet etch process, a dry etch process or a plasma etch process. In addition, the etch process can be selective to the substrate 14Z, such that the polymer filled trenches 36Z remain unaffected.

Next, as shown in FIG. 21B, pockets 112Z are formed in the substrate 14Z from the back side 22Z to the conductivity regions 114Z. The pockets 112 can be formed using a laser machining process substantially as previously described. However, the laser machining process is controlled such that the pockets do not completely penetrate the full thickness of the substrate 14Z.

Next, as shown in FIG. 21C, vias 74Z are formed in the substrate 14Z by etching the pockets 112 with a suitable etchant such as TMAH.

Next, as shown in FIG. 21D, conductive vias 68Z are formed in the vias 74Z substantially as previously described, by forming insulating layers 78Z in the vias 74Z, and then forming the conductive members 76Z in the vias 74Z. However, in this case the conductive vias 68Z include contact pads 42Z, which form the terminal contacts for the components 16Z. As also shown in FIG. 21D, the polymer filled trenches 28Z can be planarized to the back side 22Z of the wafer 12Z using a suitable process such as grinding. In addition, a back side polymer layer 38Z such as vapor deposited parylene can be formed on the back side 22Z, substantially as previously described.

Next, as shown in FIG. 21E, a singulating step is performed to singulate the components 16Z from the wafer 12Z and from one another. The singulating step can be performed by forming grooves 44Z in the polymer filled trenches 28Z substantially as previously described and shown in FIG. 1K.

As shown in FIG. 21F, a singulated component 16Z includes the thinned die 14Z having the die contacts 18Z in electrical communication with the integrated circuits thereon. The component 16Z also includes the planarized contact bumps 24Z on the die contacts 18Z, and the conductive vias 68Z in electrical communication with the planarized contact bumps 24Z.

In addition, the component 16Z includes the circuit side polymer layer 36Z, which covers the circuit side 20Z of the thinned die 14Z, and encapsulates the planarized contact bumps 24Z. The component 16Z also includes the terminal contacts 42Z in electrical communication with the conductive vias 68Z, and the back side polymer layer 38Z which covers the thinned back side 22Z of the thinned die 10Z. In addition, the component 16Z includes four edge polymer layers 40Z which cover the four edges 30Z of the thinned die 10Z. The component 16Z is thus encapsulated on all six surfaces (6X).

Figure 21G:
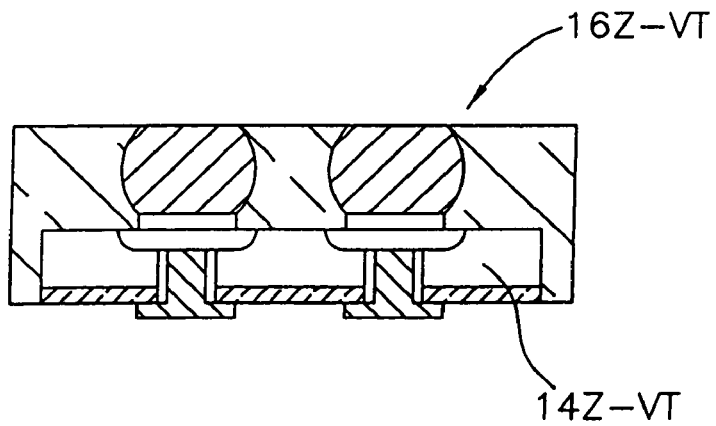
FIG. 21G is an enlarged schematic cross section equivalent to FIG. 21F of an alternate embodiment of the seventh embodiment semiconductor component.

Referring to FIG. 21G, an alternate embodiment component 16Z-VT is constructed substantially as previously described for component 16Z (FIG. 21F). However, the substrate 14Z-VT is etched very thin, on the order of several μm or less to 250 μm (e.g., 3 μm to 250 μm), and the back side polymer layer can be made or etched very thin, such that a very thin component is provided.

Figure 21H:
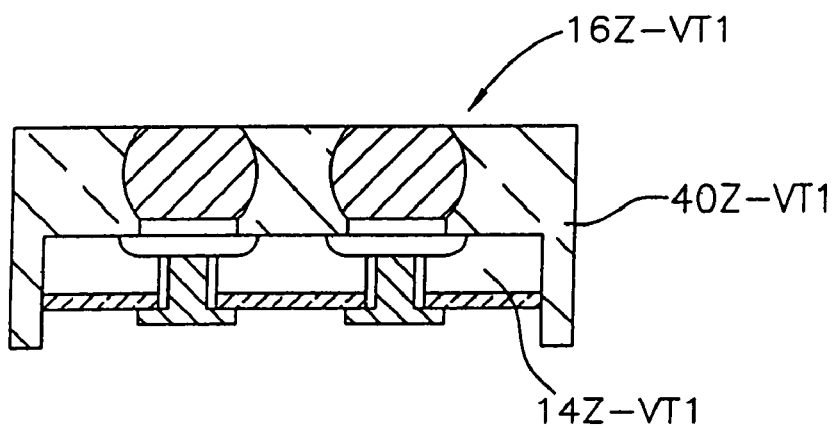
FIG. 21H is an enlarged schematic cross section equivalent to FIG. 21F of an alternate embodiment of the seventh embodiment semiconductor component.

Referring to FIG. 21H, an alternate embodiment component 16Z-VT1 is constructed substantially as previously described for component 16Z-VT (FIG. 21G). However, edge polymer layers 40Z-VT1 extend past the substrate 14Z-VT1, such that the substrate 14Z-VT1 is recessed.

Figure 21I:
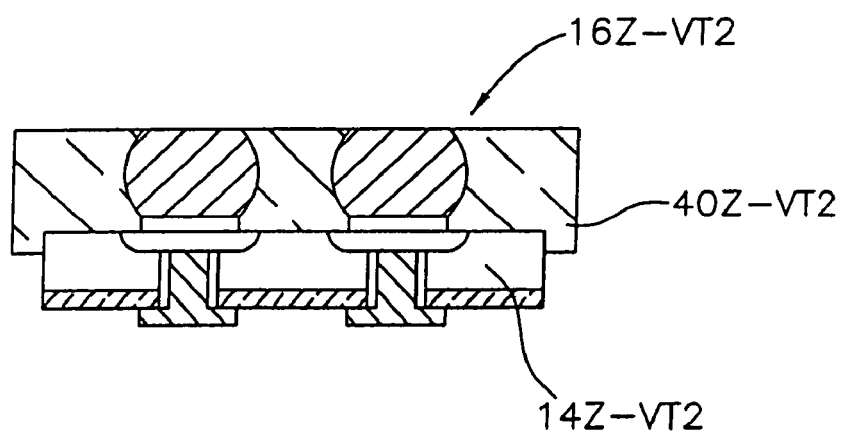
FIG. 21I is an enlarged schematic cross section equivalent to FIG. 21F of an alternate embodiment of the seventh embodiment semiconductor component.

Referring to FIG. 21I, an alternate embodiment component 16Z-VT2 is constructed substantially as previously described for component 16Z-VT (FIG. 21G). However, edge polymer layers 40Z-VT2 are recessed with respect to the substrate 14Z-VT2, such that edges of the substrate 14Z-VT2 are exposed.

Referring to FIGS. 22A-22F, steps in a method for fabricating an eighth embodiment semiconductor component 16BGA (FIG. 22E) are illustrated. The component 16BGA includes terminal contacts 42BGA (FIG. 22E) which comprise balls in a ball grid array (BGA), and is thus referred to as a ball grid array component.

Figure 22A:
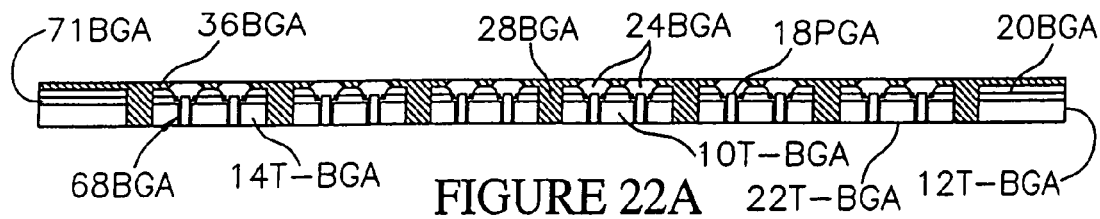
FIGS. 22A-22E are schematic cross sectional views illustrating steps in a method for fabricating an eighth embodiment semiconductor component.

Initially, as shown in FIG. 22A, planarized contact bumps 24BGA have been formed on die contacts 18BGA, and a planarized circuit side polymer layer 36BGA has been formed on the contact bumps 24BGA. The contact bumps 24BGA and the circuit side polymer layer 36BGA can be formed substantially as previously described and shown in FIG. 1I, for contact bumps 24P and circuit side polymer layer 36P. In addition, conductive vias 68BGA are formed substantially as previously described for conductive vias 68A in FIG. 8A.

As also shown in FIG. 22A, polymer filled trenches 28BGA are formed part way through the substrate 14BGA using a scribing, etching or lasering process, followed by filling with a polymer substantially as previously described for polymer filled trenches 28AP in FIG. 8C. As also shown in FIG. 22A, a backside thinning step is performed, as previously described and shown in FIG. 1H, to form a thinned back side 22T-BGA, a thinned substrate 14T-BGA and thinned dice 10T-BGA.

Figure 22B:
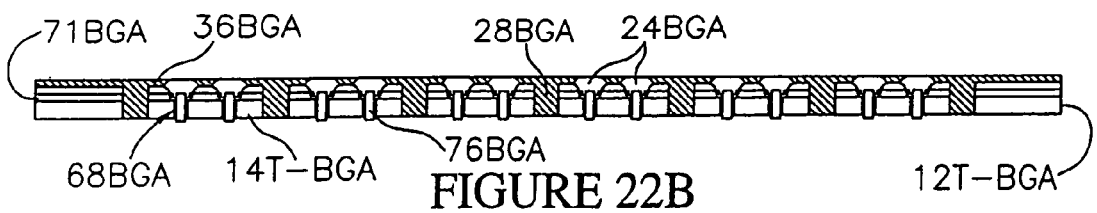

Next, as shown in FIG. 22B, an etch back step is performed to further thin the thinned substrate 14T-BGA and to expose tip portions of the conductive members 76BGA. This etching step can be performed to remove only a small amount of the thinned substrate 14TBGA.

Figure 22C:
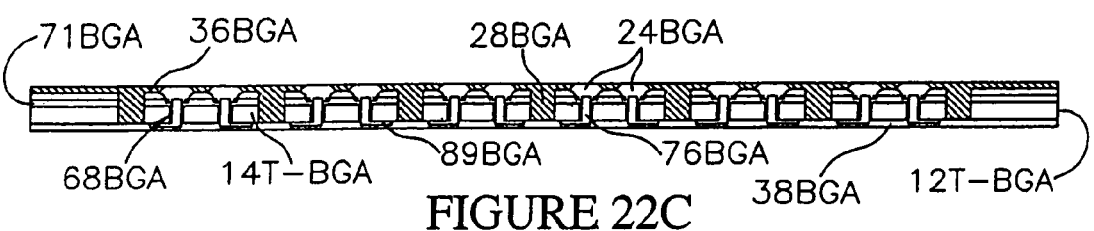

Next, as shown in FIG. 22C, a pattern of conductors 89BGA is formed on the thinned backside 22T-BGA using the tip portions of the conductive members 76BGA as a starting point. However the conductors 89BGA can be in a fan out configuration and have a desired pattern such as a ball grid array (BGA) or fine ball grid array (FBGA). The conductors 89BGA can be formed by depositing and etching a redistribution layer or by direct deposition such as a plating, an electrolytic or an electroless process.

In addition, a back side insulating layer 38BGA can be formed substantially as previously described for any of the previous embodiment. For example, the insulating layer 38BGA can comprise a very thin layer of parylene deposited using the previously described vapor deposition method.

Figure 22D:
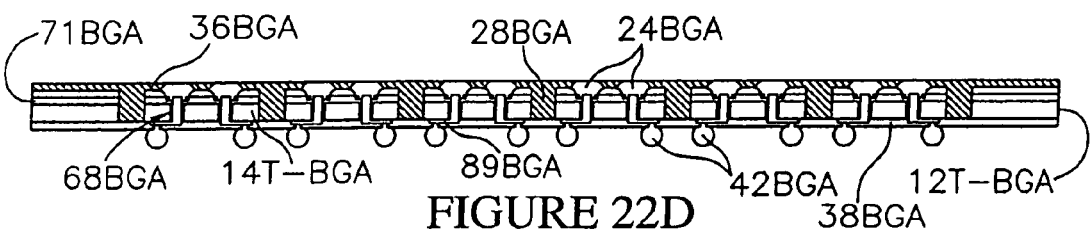

Next, as shown in FIG. 22D, terminal contacts 42BGA are formed in electrical communication with the conductors 89BGA. The terminal contacts 42BGA can comprise conductive bumps or balls, such as metal balls formed using a suitable bonding or deposition process.

Figure 22E:
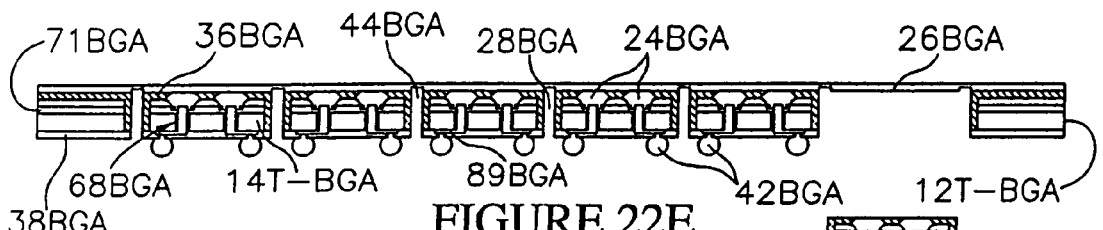
Figure 22F:
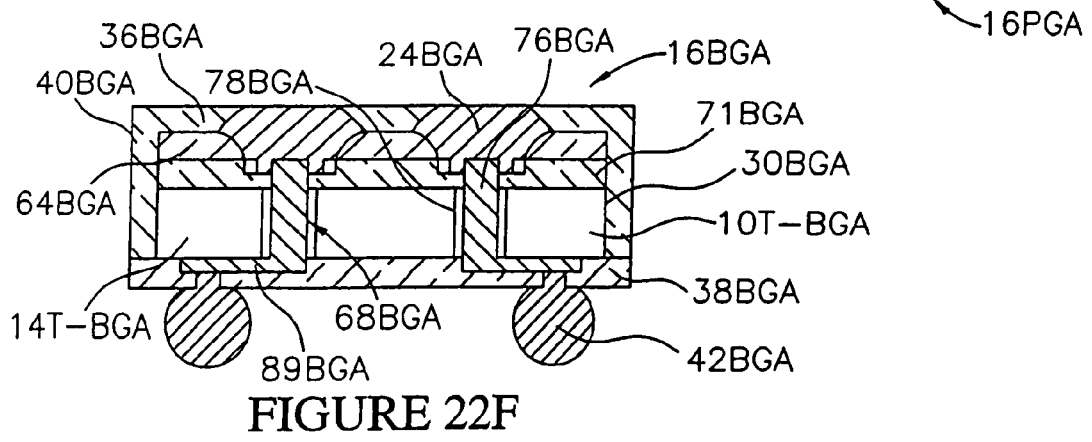
FIG. 22F is an enlarged portion of FIG. 22E illustrating the completed eighth embodiment semiconductor component.

Next, as shown in FIG. 22E, a singulating step can be performed to form grooves 28BGA and singulated the components 16BGA, substantially as previously described. As shown in FIG. 22F, a singulated component 16BGA includes the thinned die 14T-BGA having the die contacts 18BGA in electrical communication with the integrated circuits thereon. The component 16BGA also includes the planarized contact bumps 24BGA on the die contacts 18BGA, and the conductive vias 68BGA in electrical communication with the planarized contact bumps 24BGA.

In addition, the component 16BGA includes the circuit side polymer layer 36BGA, which covers the circuit side 20BGA of the thinned die 14T-BGA, and encapsulates the planarized contact bumps 24BGA. The component 16BGA also includes the terminal contacts 42BGA in electrical communication with the conductive vias 68BGA, and configured as a ball grid array (BGA) or a micro pin grid array (MP-BGA). The component 16BGA also includes the back side polymer layer 38BGA which covers the thinned back side 22T-BGA of the thinned die 10T-BGA. In addition, the component 16BGA includes four edge polymer layers 40BGA which cover the four edges 30BGA of the thinned die 10T-BGA. The component 16BGA is thus encapsulated on all six surfaces (6X).

Thus the invention provides improved encapsulated semiconductor components, methods for fabricating the component, and systems incorporating the component. While the invention has been described with reference to certain preferred embodiments, as will be apparent to those skilled in the art, certain changes and modifications can be made without departing from the scope of the invention as defined by the following claims.

We claim:

1. A method for fabricating a semiconductor component comprising:
   providing a semiconductor wafer comprising a plurality of semiconductor dice separated by streets, each semiconductor die comprising a substrate having a circuit side with integrated circuits, a back side and a plurality of contacts on the circuit side in electrical communication with the integrated circuits having a first pattern;
   forming a circuit side polymer layer on the dice and a plurality of polymer filled trenches in the streets;
   forming a plurality of conductive vias from the backside through the substrate and the contacts in electrical contact with the contacts;
   forming a plurality of conductors on the backside in electrical communication with the conductive vias configured to redistribute and fan out the first pattern to a second pattern;
   forming a back side polymer layer on the dice;
   forming a plurality of terminal contacts on the back side having the second pattern in electrical communication with the conductors; and
   singulating the wafer through the polymer filled trenches such that each die is encapsulated on six surfaces by polymer layers.

2. The method of claim 1 further comprising thinning the substrate from the backside prior to the forming the conductors step.

3. The method of claim 1 wherein the forming the conductors step comprises depositing and etching a redistribution layer on the back side.

4. The method of claim 1 wherein the second pattern comprises a grid array.

5. The method of claim 1 wherein the forming the conductive vias step comprises laser machining.

6. The method of claim 1 wherein the forming the conductive vias step comprises etching.

7. The method of claim 1 wherein the forming the conductive vias step forms a plurality of conductive vias having a first pitch, and the forming the conductor step forms a plurality of conductors having a second pitch greater than the first pitch.

8. The method of claim 1 wherein the terminal contacts comprise balls and the second pattern comprises a ball grid array (BGA) or a fine ball grid array (FBGA).

9. The method of claim 1 wherein the forming the conductors step comprises a process selected from the group consisting of a plating process, an electrolytic process and an electroless process.

10. A method for fabricating a semiconductor component comprising:
- providing a semiconductor wafer comprising a plurality of semiconductor dice separated by streets, each semiconductor die comprising a substrate having a circuit side with integrated circuits, a back side and a plurality of contacts on the circuit side in a pattern in electrical communication with the integrated circuits;
- forming a circuit side polymer layer on the dice and a plurality of polymer filled trenches in the streets;
- forming a plurality of conductive vias through the substrate from the backside to the circuit side in electrical contact with the contacts;
- thinning the substrate from the backside;
- forming a plurality of back side conductors on the backside in electrical communication with the conductive vias configured to redistribute and fan out the pattern of the contacts to a grid array;
- forming a back side polymer layer on the dice;
- forming a plurality of terminal contacts on the back side in the grid array in electrical communication with the conductors; and
- singulating the wafer through the polymer filled trenches such that each die is encapsulated on six surfaces by polymer layers.

11. The method of claim 10 wherein the terminal contacts comprise balls and the grid array comprises a ball grid array (BGA) or a fine ball grid array (FBGA).

12. The method of claim 10 wherein the forming the back side conductors step comprises depositing and etching a redistribution layer on the backside.

13. The method of claim 10 wherein the forming the conductive vias step comprises counterboring from the back side to a selected depth.

14. The method of claim 10 wherein the forming the conductive vias step comprises providing conductivity regions in electrical contact with the electrical conductors and counterboring from the back side to the conductivity regions.

* * * * *